(12) United States Patent
Sakakibara et al.

(10) Patent No.: US 7,560,811 B2
(45) Date of Patent: Jul. 14, 2009

(54) SEMICONDUCTOR DEVICE

(75) Inventors: Shingo Sakakibara, Hamamatsu (JP);
Hiroshi Saitoh, Iwata (JP); Toshihisa Suzuki, Hamamatsu (JP)

(73) Assignee: Yamaha Corporation, Shizuoka-Ken (JP)

( * ) Notice: Subject to any disclaimer, the term of this patent is extended or adjusted under 35 U.S.C. 154(b) by 0 days.

(21) Appl. No.: 11/634,384

(22) Filed: Dec. 6, 2006

(65) Prior Publication Data

US 2007/0210392 A1    Sep. 13, 2007

(30) Foreign Application Priority Data

| Dec. 8, 2005 | (JP) | ............................ 2005-354458 |
| Dec. 8, 2005 | (JP) | ............................ 2005-354459 |
| Dec. 27, 2005 | (JP) | ............................ 2005-376396 |
| Jan. 30, 2006 | (JP) | ............................ 2006-021164 |
| Feb. 24, 2006 | (JP) | ............................ 2006-048351 |
| Nov. 9, 2006 | (JP) | ............................ 2006-303717 |
| Nov. 9, 2006 | (JP) | ............................ 2006-303837 |

(51) Int. Cl.
*H01L 29/82* (2006.01)

(52) U.S. Cl. ..................... 257/704; 257/414; 257/E21.5

(58) Field of Classification Search ................. 257/414, 257/415, 416, 417, E33.066, E33.058, 704, 257/668, 709, E21.5; 381/347, 348
See application file for complete search history.

(56) References Cited

U.S. PATENT DOCUMENTS

| 3,628,105 | A | * | 12/1971 | Sakai et al. ................. 257/664 |
| 5,523,621 | A | * | 6/1996 | Kikuchi ...................... 257/692 |
| 5,796,165 | A | | 8/1998 | Yoshikawa et al. |
| 5,859,759 | A | * | 1/1999 | Moriyama et al. ....... 361/283.4 |
| 6,313,525 | B1 | * | 11/2001 | Sasano ........................ 257/704 |
| 6,518,501 | B1 | * | 2/2003 | Kawahara et al. ........... 174/538 |
| 6,774,481 | B2 | * | 8/2004 | Ono ............................ 257/704 |
| 6,781,231 | B2 | * | 8/2004 | Minervini ................... 257/704 |
| 6,844,621 | B2 | * | 1/2005 | Morozumi et al. .......... 257/700 |
| 6,921,971 | B2 | * | 7/2005 | Basho et al. ................. 257/706 |
| 7,202,552 | B2 | * | 4/2007 | Zhe et al. .................... 257/659 |
| 2003/0067057 | A1 | * | 4/2003 | Wu ............................. 257/666 |
| 2003/0137046 | A1 | | 7/2003 | Kageyama |

FOREIGN PATENT DOCUMENTS

| JP | 05-166965 | 7/1993 |
| JP | 08-148597 | 6/1996 |

(Continued)

*Primary Examiner*—Minh-Loan T Tran
*Assistant Examiner*—William Harriston
(74) *Attorney, Agent, or Firm*—Dickstein Shapiro LLP

(57) ABSTRACT

A semiconductor device is designed such that a semiconductor sensor chip having a diaphragm for detecting pressure variations based on the displacement thereof is fixed onto the upper surface of a substrate having a rectangular shape, which is covered with a cover member so as to form a hollow space embracing the semiconductor sensor chip between the substrate and the cover member. Herein, the substrate is sealed with a molded resin such that chip connection leads packaging leads are partially exposed externally of the molded resin; the chip connection leads are electrically connected to the semiconductor sensor chip and are disposed in line along one side of the semiconductor sensor chip; and the packaging leads are positioned opposite the chip connection leads by way of the semiconductor sensor chip. Thus, it is possible to downsize the semiconductor device without substantially changing the size of the semiconductor sensor chip.

35 Claims, 53 Drawing Sheets

FOREIGN PATENT DOCUMENTS

| | | |
|---|---|---|
| JP | 2000-349305 | 12/2000 |
| JP | 3419915 | 4/2003 |
| JP | 2003-218289 A | 7/2003 |
| JP | 2004-537182 | 12/2004 |
| KR | 1997-67892 A | 10/1997 |

* cited by examiner

SEMICONDUCTOR DEVICE

BACKGROUND OF THE INVENTION

1. Field of the Invention

The present invention relates to semiconductor devices including semiconductor sensor chips for detecting variations of pressure such as variations of sound pressure applied thereto.

This application claims priority on seven Japanese Patent Applications whose numbers are 2005-376396, 2005-354458, 2006-48351, 2006-21164, 2005-354459, 2006-303717, and 2006-303837, the contents of which are incorporated herein by reference.

2. Description of the Related Art

Conventionally, semiconductor devices such as silicon-capacitor microphones and pressure sensors, in which semiconductor chips having thin-film diaphragms for detecting variations of sound pressure are mounted on the surfaces of the printed boards, have been developed. For example, Japanese Patent Application Publication No. 2004-537182 teaches an example of a silicon-capacitor microphone. This kind of semiconductor senor chip detects variations of pressure such as variations of sound pressure due to vibration of a diaphragm, wherein detection sensitivity can be increased by increasing the size of the diaphragm. Hence, it is preferable that the semiconductor sensor chip be increased in size in order to increase the detection sensitivity.

The aforementioned semiconductor devices have been installed in handy-type electronic devices such as portable telephones (or cellular phones); hence, it is strongly demanded to downsize them. Japanese Unexamined Patent Application Publication No. 2000-349305 teaches another example of a semiconductor device realizing downsizing, in which outer leads establishing electric connection with a semiconductor sensor chip are arranged only in one long side of a package.

When the aforementioned semiconductor device is mounted on a printed-circuit board of an electronic device, outer leads arranged only in one long side of a package are fixed to the connection terminals of the printed-circuit board by way of soldering. This makes the installation of the semiconductor device mounted on the printed-circuit board unstable.

It may be possible to combine the technical features of the aforementioned semiconductor devices; however, when the semiconductor device mounted on the printed-circuit board vibrates, the diaphragm may not accurately detect pressure variations due to vibration.

In addition, the conventionally-known semiconductor devices such as the pressure sensors and silicon-capacitor microphones are designed such that semiconductor sensor chips having rectangular shapes and recesses are mounted on printed boards, wherein the thinned portions of the recesses are used as diaphragms (or moving electrodes) having bridge-resistance circuits, wherein the bridge-resistance circuits detect the displacement (or deformation) of the diaphragms caused by sound pressure as variations of electric resistance, based on which variations of sound pressure are detected.

In the aforementioned semiconductor devices, cover members are arranged above the surfaces of the printed boards so as to form internal spaces embracing semiconductor sensor chips therein. The cover members have opening holes establishing communications between the internal spaces and the external space, whereby it is possible to transmit variations of sound pressure, which occur in the external space, toward the semiconductor sensor chips in the internal spaces via the opening holes. Conductive layers are formed on the interior surfaces of the cover members so as to block electromagnetic noise, which is transmitted into the internal spaces via the opening holes, from being transmitted toward the semiconductor sensor chips by way of electromagnetic shields. This reliably avoids the occurrence of error vibrations on the diaphragms due to electromagnetic noise reaching the semiconductor sensor chips; thus, it is possible to accurately detect variations of sound pressure. This technology is disclosed in Japanese Patent Application Publication No. 2004-537182 and U.S. Pat. No. 6,781,231, for example.

In the above, it is necessary to provide a special means establishing electrical connection between the conductive layer of the cover member and the printed-circuit board when the aforementioned semiconductor device is mounted on the printed-circuit board of a portable telephone and the like.

In order to form an electromagnetic shield in the aforementioned semiconductor device, the cover member should be arranged such that the conductive layer of the cover member substantially matches in position with the connection terminals formed on the upper surface of the printed board. In other words, fine precision is required to prevent electrical discontinuity between the conductive layer of the cover member and the connection terminals of the printed board; hence, it is troublesome for the human operator (or worker) to precisely arrange the cover member in connection with the printed board.

SUMMARY OF THE INVENTION

It is an object of the present invention to provide a semiconductor device, which can be downsized without changing the size of a semiconductor sensor chip and which can be mounted on a printed-circuit board in a stable manner.

It is another object of the present invention to provide a semiconductor device, in which a cover member can be fixedly attached onto a substrate in connection with a printed board so as to form an electromagnetic shield with ease.

In a first aspect of the present invention, a semiconductor device is designed such that a semiconductor sensor chip having a diaphragm for detecting pressure variations based on the displacement thereof is fixed onto the upper surface of a substrate having a rectangular shape, which is covered with a cover member so as to form a hollow space embracing the semiconductor sensor chip between the substrate and the cover member. Herein, the substrate is sealed with a molded resin such that a plurality of chip connection leads and a plurality of packaging leads are partially exposed externally of the molded resin; the chip connection leads are electrically connected to the semiconductor sensor chip and are disposed in line along one side of the semiconductor sensor chip; and the packaging leads are positioned opposite to the chip connection leads by way of the semiconductor sensor chip.

The aforementioned semiconductor device can be easily mounted on the printed-circuit board such that the chip connection leads and the packaging leads. simply join the connection terminal of the printed-circuit board via solder. Herein, the chip connection leads and the packaging leads are positioned oppositely by way of the semiconductor sensor chip; in other words, they are respectively arranged at both sides of the substrate. This makes it possible for the semiconductor device to be mounted on the printed-circuit board in a stable manner. In addition, the chip connection leads are adjacently disposed in line along one side of the semiconductor sensor chip; hence, it is possible to easily downsize the semiconductor device without substantially changing the size of the semiconductor sensor chip.

The aforementioned semiconductor device further includes a stage, which is sealed with the molded resin and is positioned below the semiconductor sensor chip. The stage is integrally formed with the chip connection leads and packaging leads so as to form a lead frame having conductivity. Herein, the chip connection leads are subjected to bending so that the first ends of the chip connection leads and the stage are partially exposed externally of the lower surface of the substrate, and the second ends of the chip connection leads are exposed externally of the upper surface of the substrate.

In the above, the stage having conductivity is positioned below the semiconductor sensor chip and is thus capable of blocking electromagnetic noise from being transmitted into the hollow space from the lower surface of the substrate. In addition, the chip connection leads are subjected to bending so that the second ends thereof are shifted in position relative to the stage (which is formed integrally with the lead frame) in the thickness direction of the substrate, wherein the gaps between the second ends of the chip connection leads and the stage depend upon the amount of bending. However, the semiconductor device is designed such that the chip connection leads are adjacently disposed in line along one side of the semiconductor sensor chip and the stage; and this allows the aforementioned gaps to be formed only in one side of the semiconductor sensor chip and the stage. Thus, it is possible to entirely cover the lower portion of the semiconductor sensor chip with the stage having a sufficiently large size. Furthermore, since the packaging leads are positioned close to the stage, it is possible to further downsize the semiconductor device.

The semiconductor device further includes a plurality of interconnection leads for integrally interconnecting together the packaging leads and the stage, wherein the interconnection leads are embedded inside of the molded resin. Herein, the prescribed parts of the packaging leads and the stage integrally formed together are exposed externally of the lower surface of the molded resin and are mutually separated from each other. That is, when the first ends of the chip connection leads and the packaging leads, which are exposed externally of the lower surface of the molded resin, are soldered to the connection terminals of the printed-circuit board, it is possible to easily prevent the packaging leads from moving toward the stage by means of solder. In addition, since the interconnection leads formed integrally between the packaging leads and the stage are embedded inside of the molded resin, it is possible to easily prevent the stage and the packaging leads from falling off the molded resin.

The semiconductor device can be modified in such a way that a plurality of internal terminals are exposed in the hollow space and are adjacently disposed in line with the semiconductor sensor chip; a plurality of external terminals are exposed on the backside of the substrate and are disposed along both sides of the substrate; and a conductive wiring is formed inside of the substrate so as to establish electrical connection between the internal terminals and at least one of the external terminals. Herein, a lower shield layer having conductivity is further formed below the semiconductor sensor chip and is electrically connected to at least one of the external terminals. This reliably blocks electromagnetic noise from being transmitted into the hollow space from the backside of the substrate by means of the lower shield layer.

In a second aspect of the present invention, a semiconductor device is designed such that a semiconductor sensor chip is attached onto the upper surface of a substrate sealed with a resin layer and is covered with a cover member having conductivity, wherein the semiconductor sensor chip is connected with and is placed substantially at the same potential with a plurality of external terminals whose first ends are embedded inside of the resin layer and whose second ends are extended to project externally of the resin layer. Herein, the first end of the external terminal is shaped to be partially exposed above the upper surface of the substrate and is fixed to the lower surface of the cover member via the conductive adhesive. In addition, the cover member includes a top portion, which is supported by the substrate so as to form a space embracing the semiconductor sensor chip, and at least one electromagnetic shield terminal which is connected with the side end of the top portion and is elongated downwardly and externally along the prescribed side of the resin layer sealing the substrate and which is connected to the second end of the external terminal extended externally of the resin layer. The cover member also includes a side wall, which is extended downwardly from the side end of the top portion so as to cover the resin layer sealing the substrate.

Specifically, the semiconductor device, which is equipped with the semiconductor sensor chip having a diaphragm for detecting pressure applied thereto due to the displacement thereof, includes a resin layer having an internal recess for arranging the semiconductor sensor chip having the diaphragm thereon, a stage having a rectangular shape, which is positioned below the semiconductor sensor chip and is sealed with the resin layer, a plurality of external terminals whose first ends are connected to the stage and whose second ends are exposed and extended externally of the resin layer, and a cover member, having conductivity, for covering the resin layer so as to form a space embracing the semiconductor sensor chip, wherein the cover member is electrically connected to the external terminals and is placed substantially at the same potential with the stage.

In the above, the resin layer has a projection, which is elongated so as to form an internal recess arranging the semiconductor sensor chip thereon, wherein the first end of the external terminal is shaped to be partially exposed above the top portion of the projection, onto which the lower surface of the cover member is attached via the conductive adhesive and is thus connected to the external terminal. In addition, the cover member includes a top portion, which is supported by the top portion of the projection so as to form the space arranging the semiconductor sensor chip, and at least one electromagnetic shield terminal which is connected with the side end of the top portion of the cover member and is elongated downwardly and externally along the prescribed side of the resin layer and which is connected to the second end of the external terminal extended externally of the resin layer. The cover member also includes a side wall that is extended downwardly from the side end of the top portion so as to cover the resin layer.

Furthermore, the electromagnetic shield terminal is divided into two pieces via a cutout portion, which is vertically elongated and in which the second end of the external terminal is tightly held, thus establishing electrical connection between the electromagnetic shield terminal and the external terminal. The electromagnetic shield terminal has an engagement recess, which is engaged with an engagement recess formed in the second end of the external terminal so as to establish electrical connection between the electromagnetic shield terminal and external terminal when the resin layer is covered with the cover member, wherein the electromagnetic shield terminal crosses and overlaps with the external terminal in view of the exterior of the electromagnetic shield terminal. The cover member also has at least one engagement portion which is extended downwardly from the side end of the top portion and is engaged with the prescribed side of the resin layer so as to establish connection between the cover member and the resin layer. Incidentally, the stage is enlarged in size compared with the semiconductor sensor chip.

In a third aspect of the present invention, a semiconductor device includes a semiconductor sensor chip having a diaphragm for detecting sound pressure applied thereto in response to deformation thereof, wherein the semiconductor device further includes a substrate for fixing the semiconductor sensor chip on the upper surface thereof, a cover member having conductivity for covering the substrate so as to form a hollow space embracing the semiconductor sensor chip, and a lower shield member having conductivity, which is positioned below the semiconductor sensor chip, and wherein at least one of the cover member and the lower shield member is connected to a shield terminal that is exposed externally of the substrate. Herein, the cover member is constituted by a top portion, which is positioned opposite to the upper surface of the substrate, and a plurality of side walls, which are elongated downwardly from the periphery of the top portion in the thickness direction of the substrate and which are positioned adjacent to a plurality of sides of the substrate. This makes it possible to easily establish positioning of the cover member relative to the substrate. Since the cover member is electrically connected to the lower shield member, it is possible to easily form an electromagnetic shield.

In the above, the side walls of the cover member are brought into contact with the upper ends of the lower shield member along the sides of the substrate. This makes it possible to form the electromagnetic shield with ease. In addition, the side walls of the cover member are adhered to the sides of the substrate by use of the adhesive, which does not leak into the hollow space. Hence, it is possible to prevent the volume and shape of the hollow space from being unexpectedly changed, and it is possible to prevent unexpected change of the volume and shape of the hollow space from badly affecting the sound characteristic of the diaphragm of the semiconductor sensor chip.

The lower shield member is designed to form the lower surface of the substrate, whereby it is possible to form the electromagnetic shield covering the lower side of the semiconductor sensor chip with ease, and it is possible to increase the volume of a cavity, which is formed below the semiconductor sensor chip. In addition, the lower shield member includes a stage having a rectangular shape, which is incorporated into the substrate sealed with a resin layer and which has a plurality of extended portions extended outwardly of the plurality of sides of the substrate, wherein the extended portions are brought into contact with the side walls of the cover member, and wherein a prescribed part of the stage forms the upper surface of the substrate. Thus, it is possible to form the electromagnetic shield three-dimensionally covering the semiconductor sensor chip, and it is possible to easily attach the semiconductor sensor chip onto the upper surface of the substrate, which is formed using the planar stage.

Furthermore, the shield terminal is integrally formed together with either the cover member or the lower shield member. A plurality of chip connection leads, which are electrically connected to the semiconductor sensor chip, are linearly disposed on both sides of the semiconductor sensor chip and are partially exposed externally of the plurality of sides of the substrate. Incidentally, the lower shield member can be formed to entirely cover the substrate.

In a fourth aspect of the present invention, a semiconductor device includes a substrate, from which a plurality of external terminals project outwardly and which is sealed with a resin layer, a semiconductor sensor chip, which is fixed onto the upper surface of the substrate, a cover member, which has a plurality of electromagnetic shield terminals and which covers the substrate so as to form a hollow space embracing the semiconductor sensor chip, and a fixing means for fixing the substrate and the cover member together such that the electromagnetic shield terminals are brought into contact with the external terminals. That is, with a simple operation in which the electromagnetic shield terminals of the cover member are fixedly attached to the cover connection leads of the substrate, it is possible to form an electromagnetic shield for protecting the semiconductor sensor chip and to reliably fix the cover member and the substrate together. This simplifies the constitution of the semiconductor device and reduces the manufacturing cost. In addition, when the semiconductor device is mounted on the printed-circuit board or during the transportation of the semiconductor device, it is possible to reliably prevent the cover member from being unexpectedly separated from the substrate; hence, it is possible for the human operator (or worker) to handle the semiconductor device with ease.

In the above, the substrate includes a stage, which is sealed with the resin layer and is positioned below the semiconductor sensor chip and which is electrically connected to the external terminals. This allows an electromagnetic shield embracing the semiconductor sensor chip to be easily formed by means of the semiconductor sensor chip and the stage; hence, it is possible to reliably protect the semiconductor sensor chip from electromagnetic noise.

In addition, the fixing means is a caulking tool for tightly joining the external terminals and the electromagnetic shield terminals together. Alternatively, the fixing means is realized by riveting, welding, or soldering the external terminals and the electromagnetic shield terminals together. Hence, it is possible to reliably prevent the cover member from being unexpectedly separated from the substrate.

In a fifth aspect of the present invention, a semiconductor device is basically constituted by a substrate and a cover member. The substrate sealed with a resin layer further includes a plurality of external terminals projecting externally thereof, and a semiconductor sensor chip is attached onto the upper surface of the substrate. The cover member having conductivity covers the substrate so as to form an electromagnetic shield embracing the semiconductor sensor chip. The cover member includes a plurality of electromagnetic shield terminals slightly projecting externally of the substrate so that the lower surfaces of the electromagnetic shield terminals are positioned substantially in the same plane with the lower surfaces of the external terminals.

In the above, the semiconductor sensor chip has a diaphragm for detecting sound pressure applied thereto. Specifically, the resin layer has a recess, which is opened at the upper surface thereof, so that the diaphragm of the semiconductor sensor chip is positioned just above the opening of the recess. The semiconductor device also includes a stage having a rectangular shape, which is sealed with the resin layer and which is positioned below the semiconductor sensor chip. The first ends of the external terminals are connected to the stage, and the second ends are extended externally of the resin layer. When the cover member is combined with the resin layer, a space embracing the semiconductor sensor chip is formed. The electromagnetic shield terminals are elongated downwardly so that the lower surfaces thereof are positioned adjacent to and substantially in the same plane with the lower surfaces of the second ends of the external terminals.

In addition, a ring-shaped projection is formed in the resin layer so as to form an internal recess for embracing the semiconductor sensor chip. The cover member includes a top portion whose lower surface is attached onto the top portion of the ring-shaped projection of the resin layer so as to form the space embracing the semiconductor sensor chip. The electromagnetic shield terminals are elongated downwardly from the side ends of the top portion along the prescribed sides of the resin layer, so that the lower surfaces of the lower ends of the electromagnetic shield terminals are positioned adjacent to and substantially in the same plane with the lower surfaces of the second ends of the external terminals. Alternatively, the cover member includes a plurality of side walls, which are elongated downwardly from the side ends of the top portion so as to cover the prescribed sides of the resin layer, wherein the electromagnetic shield terminals are elongated downwardly from the lower ends of the side walls along the prescribed sides of the resin layer, so that the lower surfaces of the lower ends of the electromagnetic shield terminals are positioned adjacent to and substantially in the same plane with the lower surfaces of the second ends of the external terminals.

In the above, the cover member further includes a plurality of engagement portions, which are elongated downwardly from the side ends of the top portion and are engaged with the prescribed sides of the resin layer, so that the cover member is fixedly attached to the resin layer. Alternatively, the engagement portions are elongated downwardly from the lower ends of the side walls and are engaged with the prescribed sides of the resin layer, so that the cover member is fixedly attached to the resin layer.

Incidentally, the stage is increased in size in a plan view of the upper surface of the resin layer in comparison with the semiconductor sensor chip.

BRIEF DESCRIPTION OF THE DRAWINGS

These and other objects, aspects, and embodiments of the present invention will be described in more detail with reference to the following drawings, in which.

DESCRIPTION OF THE PREFERRED EMBODIMENTS

The present invention will be described in further detail by way of examples with reference to the accompanying drawings.

1. First Embodiment

With reference to FIGS. 1 to 7, a semiconductor device 1 will be described in detail in accordance with a first embodiment of the present invention. The semiconductor device 1 of the first embodiment is designed to detect sound pressure such as sound pressure generated externally thereof and in particular directed to a surface-mount-type semiconductor device, which is manufactured using a lead frame. Specifically, the semiconductor device 1 is of the SON (i.e., Small Outline Non-leaded package) type corresponding to the surface mount type.

Figure 1:
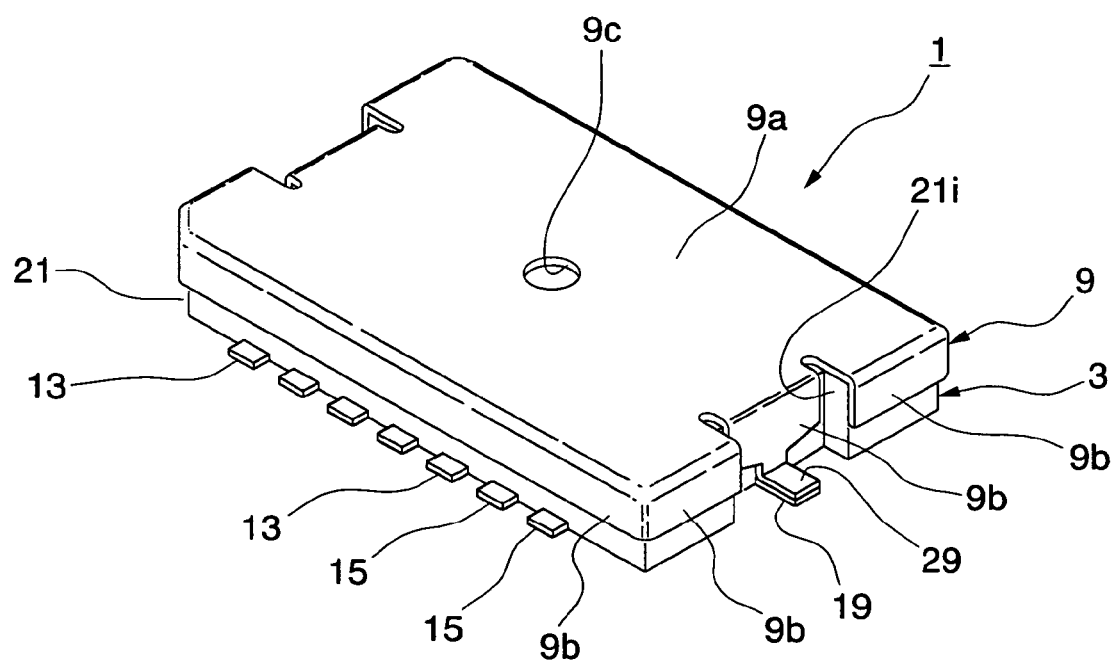
FIG. 1 is a perspective view showing a semiconductor device in accordance with a first embodiment of the present invention.
Figure 2:
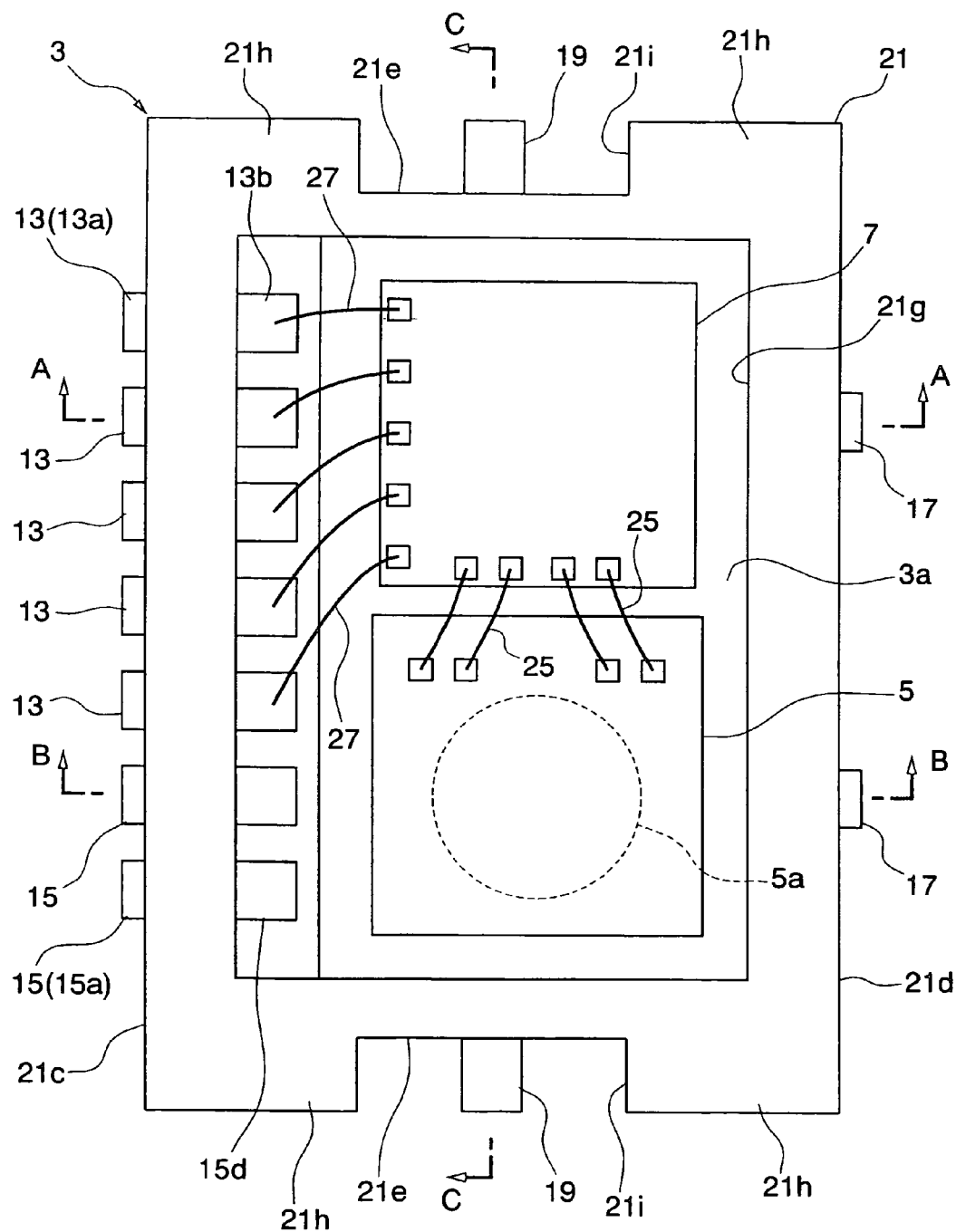
FIG. 2 is a plan view showing internal parts of the semiconductor device, which is viewed from an upper side.
Figure 6:
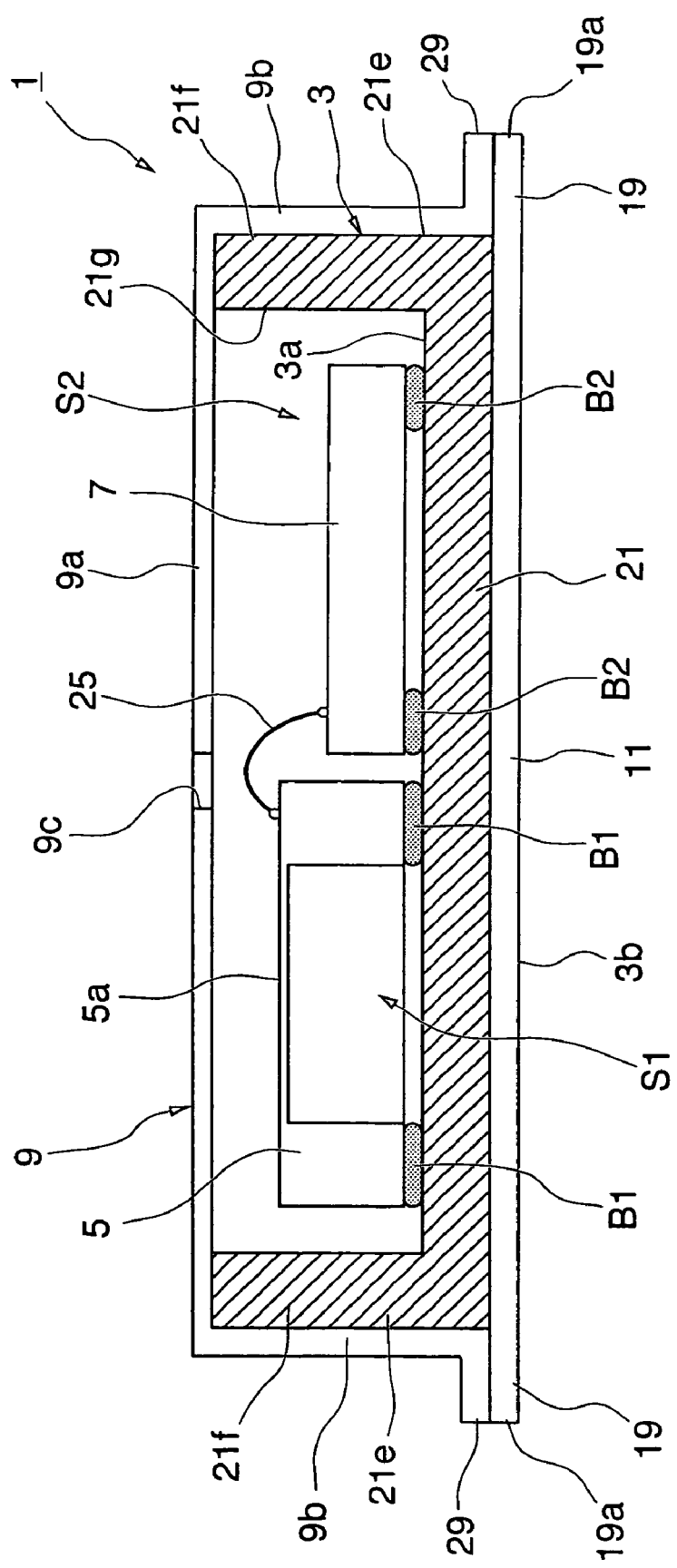
FIG. 6 is a cross-sectional view taken along line C-C in FIGS. 2 and 3.

As shown in FIGS. 1, 2, and 6, the semiconductor device 1 includes a substrate 3 having a rectangular shape in plan view, and a semiconductor sensor chip 5 and an amplifier 7, both of which are arranged on an upper surface 3a of the substrate 3, and a cover member 9, which covers the semiconductor sensor chip 3 and the amplifier 7 on the substrate 3.

As shown in FIGS. 2 to 6, the substrate 3 has a stage 11 having a rectangular shape in plan view, a plurality of leads 13, 15, 17, and 19, which are formed in the periphery of the stage 11, and a molded resin (or a resin layer) 21 for sealing and integrally fixing the stage 11 and the leads 13, 15, 17, and 19, all of which are realized using a lead frame (not shown) having conductivity.

The stage 11 forms a lower surface 3b of the planar substrate 3 together with the molded resin 21 and is exposed externally of the molded resin 21. The stage 11 is formed in a predetermined size allowing the semiconductor sensor chip 5 and the amplifier 7, which are arranged on the upper surface 3a of the substrate 3, to be positioned thereabove in plan view.

Similar to the stage 11, at least a prescribed part of the leads 13, 15, 17, and 19 forms the lower surface 3b of the planar substrate 3 together with the molded resin 21 and is exposed externally of the molded resin 21. The leads 13, 15, 17, and 19 are formed in band-like shapes. Specifically, the semiconductor device 1 includes chip connection leads 13, which are separated from the stage 11, first grounded leads 15, which are integrally formed together with the stage 11, second grounded leads (or packaging leads) 17, and cover connection leads 19.

Figure 3:
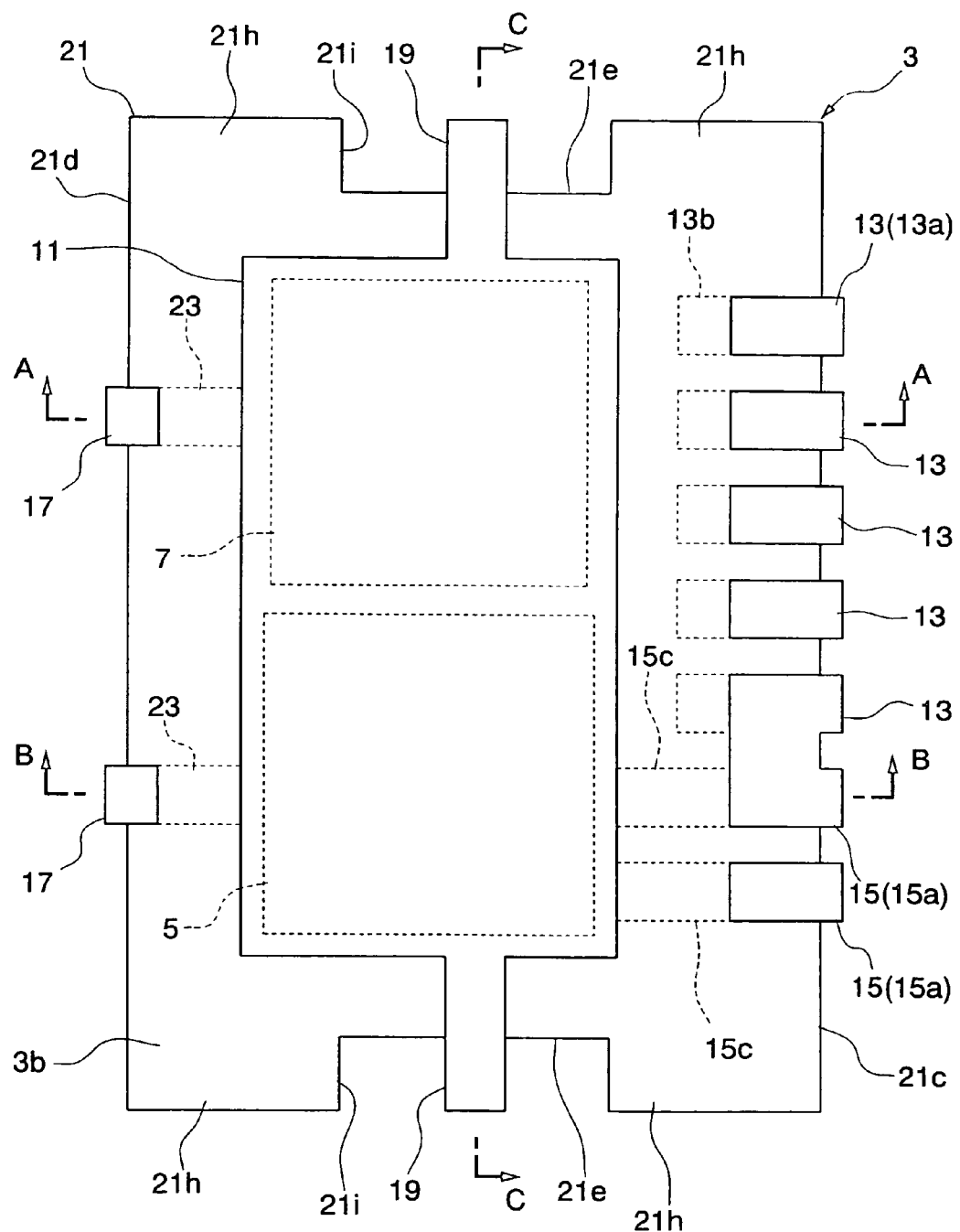
FIG. 3 is a bottom view showing internal parts of the semiconductor device, which is viewed from a lower side.
Figure 4:
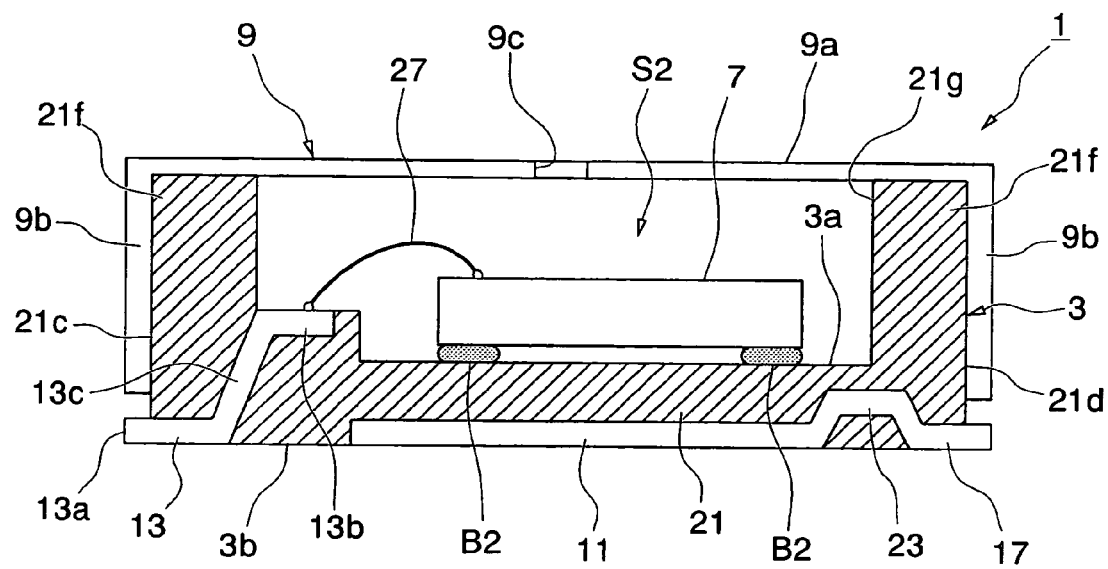
FIG. 4 is a cross-sectional view taken along line A-A in FIGS. 2 and 3.

As shown in FIGS. 2 to 4, five chip connection leads 13 are used for establishing electric connection with the semiconductor sensor chip 5 and are disposed in line along one side 21c of the molded resin 21, which lies in parallel with the semiconductor chip 5 and the amplifier 7, with an equal spacing therebetween.

The chip connection leads 13 are respectively extended from the side 21c of the molded resin 21 towards the stage 11, wherein first ends 13a thereof slightly project outwardly of the molded resin 21 and are thus exposed externally of the lower surface 3b of the substrate 3. The chip connection leads 13 are subjected to bending so as to form bent portions 13c, which lie between the first ends 13a and second ends 13b thereof. Due to the formation of the bent portions 13c, the second ends 13b are positioned upwardly of the first ends 13a. The second ends 13b of the chip connection leads 13 are positioned in the same plane, substantially matching the upper surface 3a of the substrate 3, and are thus partially exposed from the molded resin 21. That is, the second ends 13b of the five chip connection leads 13 are disposed in line adjacent to an area for arranging the semiconductor sensor chip 5 and the amplifier 7.

Figure 5:
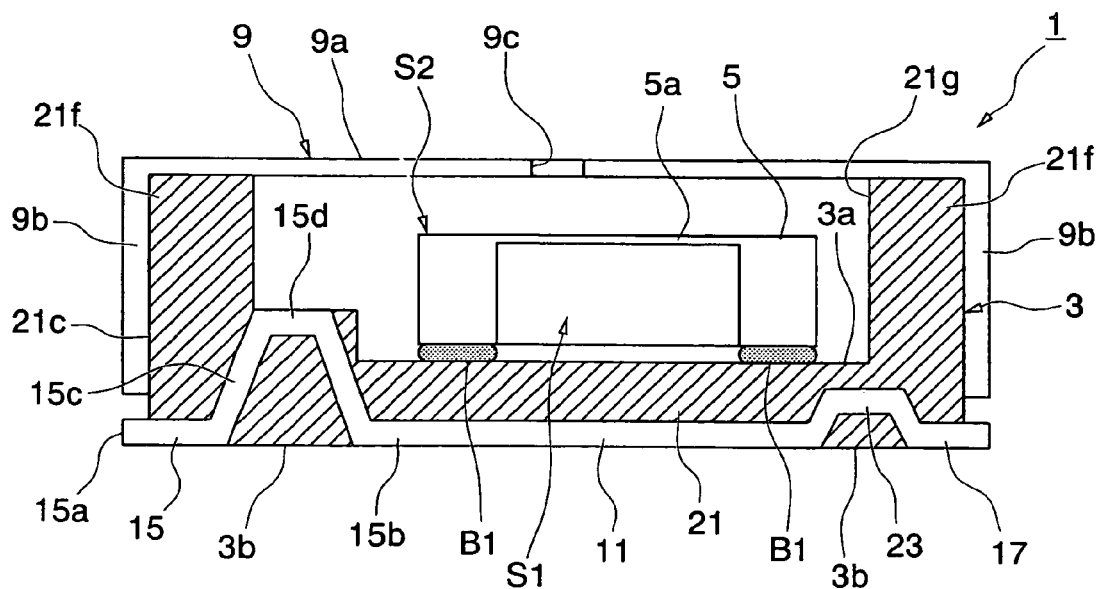
FIG. 5 is a cross-sectional view taken along line B-B in FIGS. 2 and 3.

As shown in FIGS. 2, 3, and 5, a pair of first grounded leads 15 are positioned adjacent to the chip connection leads 13 along the side 21c of the molded resin 21 and are disposed in line together with the chip connection leads 13 with an equal spacing therebetween. Similar to the chip connection leads 13, first ends 15a of the first grounded leads 15 slightly project outwardly of the side 21c of the molded resin 21, and second ends 15b are connected to the side end of the stage 11. The first ends 15a and the second ends 15b of the first grounded leads 15 are exposed externally of the lower surface 3b of the substrate 3.

In addition, the first grounded leads 15 have bent portions 15c, which project upwardly, between the first ends 15a and the second ends 15b. The bent portions 15c of the first grounded leads 15 are embedded in the molded resin 21. Similar to the second ends 13b of the chip connection leads 13, top portions 15d of the first grounded leads 15 are positioned in the same plane, substantially matching the upper surface 3a of the substrate 3, and are thus partially exposed from the molded resin 21.

The top portions 15d of the first grounded leads 15 are disposed in line together with the second ends 13b of the chip connection leads 13 along the area for arranging the semiconductor sensor chip 3 and the amplifier 7. The total length in which the top portions 15d of the first grounded leads 15 and the second ends 13b of the chip connection leads 13 are disposed in line is shorter than the length of a long side of the area for arranging the semiconductor chip 5 and the amplifier 7.

The first end 15a of one first grounded lead 15 positioned adjacent to one chip connection lead 13 is integrally formed together with one chip connection lead 13, so that electrical connection is established therebetween. That is, one chip connection lead 13 is electrically connected to the stage 11 and the first grounded lead 15 with the same potential.

As shown in FIGS. 2 to 5, the second grounded leads 17 are positioned opposite the chip connection leads 13 and the first grounded leads 15 with respect to the semiconductor sensor chip 5, the amplifier 7, and the stage 11. That is, a pair of the second grounded leads 17 is formed in line along a side 21d, which is opposite the side 21c of the molded resin 21 for arranging the chip connection leads 13 and the first grounded leads 15. The length in which the second grounded leads 17 are disposed in line along the side 21d of the molded resin 21 is shorter than and is included in the length in which the chip connection leads 13 and the first grounded leads 15 are disposed in line along the side 21c of the molded resin 21.

The second grounded leads 17 are integrally formed with the stage 11 via interconnection leads 23. The interconnection leads 23 are subjected to bending so as to project upwardly above the second grounded leads 17 and the stage 11, wherein they are embedded in the molded resin 21. That is, the second grounded leads 17 and the stage 11 are integrally formed together via the interconnection leads 23 and are partially exposed in the lower surface 3b of the substrate 3 matching the lower surface of the molded resin 21 in such a way that they are mutually separated from each other.

As shown in FIGS. 2, 3, and 6, the cover connection leads 19 are each positioned in a pair of sides 21e, which are perpendicular to a pair of the sides 21c and 21d of the molded resin 21 in a plan view of the substrate 3, wherein ends 19a thereof project externally of the molded resin 21. In addition, the cover connection leads 19 are respectively connected to both ends of the stage 11 along its longitudinal direction, wherein they are entirely exposed externally of the lower surface 3b of the substrate 3.

As shown in FIGS. 2 to 6, the molded resin 21 is formed in a rectangular shape in plan view so that the upper surface and lower surface thereof form the upper surface 3a and the lower surface 3b of the substrate 3. In addition, the molded resin 21 has a ring-shaped projection 21f, which projects upwardly from the periphery of the upper surface 3a of the substrate 3. Thus, the molded resin 21 has a hollow 21g, which is defined inside of the ring-shaped projection 21f in connection with the upper surface 3a of the substrate 3.

The molded resin 21 has paired projections 21h, which project from the paired sides 21e thereof respectively and which form recesses 21i for holding the cover connection leads 19.

The semiconductor sensor chip 5 serves as a sound pressure sensor chip, which converts sound into electric signals. Therefore, the semiconductor sensor chip 5 has a diaphragm 5a that vibrates in response to variations of sound pressure with regard to the sound propagating thereto via the external space of the semiconductor device 1. The diaphragm 5a is formed so as to vibrate in the thickness direction of the semiconductor sensor chip 5. A resistance bridge circuit (not shown) is formed on the upper surface of the diaphragm 5a, so that the deformation (or displacement) of the diaphragm 5a is detected as a variation of electric resistance and is then converted into stress (or internal pressure) so as to detect sound pressure, whereby electric signals are produced in response to the detected sound pressure.

The semiconductor sensor chip 5 is fixed to the upper surface 3a of the molded resin 21 via an adhesive paste B1 (see FIG. 5). This forms a cavity S1 between the diaphragm 5a of the semiconductor sensor chip 5 and the upper surface 3a of the molded resin 21. When the semiconductor sensor chip 5 is attached to the upper surface 3a of the molded resin 21, the cavity S1 is closed and is isolated from the external space.

The semiconductor sensor chip 5 is electrically connected to the amplifier 7 via a plurality of wires 25 (e.g., four wires 25).

The amplifier 7 amplifies electric signals output from the semiconductor sensor chip 5. Similar to the semiconductor sensor chip 5, the amplifier 7 is attached onto the upper surface 3a of the molded resin 21 via adhesive pastes B2 (see FIG. 4). The amplifier 7 is electrically connected to the first ends 13a of the chip connection leads 13 via a plurality of wires 27 (e.g., four wires 27). This establishes electrical connection between the semiconductor sensor chip 5 and the chip connection leads 13 via the amplifier 7.

As shown in FIG. 1 and FIGS. 4 to 6, the cover member 9 is formed using a conductive material such as copper, and it includes a top portion 9a having a rectangular shape, which is positioned opposite the upper surface 3a of the substrate 3, and side walls 9b, which are connected with side ends of the top portion 9a and are hung downwardly from the top portion 9a. That is, the cover member 9 as a whole is formed like a hollowed dish whose opening hole is directed downwardly.

The top portion 9a of the cover member 9 is shaped so as to come in contact with the upper ends of the ring-shaped projection 21f of the molded resin 21. That is, the hollow 21g of the molded resin 21 is covered with the top portion 9a of the cover member 9, thus forming a hollow space S2 embracing the semiconductor sensor chip 5 and the amplifier 7 therein. An opening hole 9c, which runs through the cover member 9 in its thickness direction, is formed approximately at the center of the top portion 9a. Thus, the hollow space S2 communicates with the external space outside of the semiconductor device 1 via the opening hole 9c.

The side walls 9b are formed surrounding the periphery of the top portion 9a so as to cover the ring-shaped projection 21f in connection with the sides 21c, 21d, and 21e of the molded resin 21. In addition, electromagnetic shield terminals 29 are integrally formed with the paired side walls 9b, which are positioned at both ends in the arrangement direction of the semiconductor sensor chip 5 and the amplifier 7, wherein they extend from the corresponding side walls 9b.

Specifically, the electromagnetic shield terminals 29 are bent outwardly of the side walls 9b; hence, when the substrate 3 encapsulated in the molded resin 21 is covered with the cover member 9, they are brought into contact with and overlapped with the cover connection leads 19. The electromagnetic shield terminals 29 are fixed to the cover connection leads 19 by way of welding or soldering.

Due to the fixation between the cover connection leads 19 and the electromagnetic shield terminals 29, the cover member 9 is attached to the substrate 3 and is electrically connected to the stage 11 via the electromagnetic shield terminals 29.

In each of the side walls 9b integrally formed with the electromagnetic shield terminals 29, an area forming the electromagnetic shield terminal 29 is physically isolated from other areas; hence, the electromagnetic shield terminals 29 are held inside of the recesses 21i of the molded resin 21.

Next, a manufacturing method of the semiconductor device 1 having the aforementioned constitution will be described in detail.

In the manufacturing method of the semiconductor device 1, a thin metal plate composed of copper is subjected to press working and etching at first, thus forming a lead frame having the stage 11 and the chip connection leads 13, first grounded leads 15, second grounded leads 17, and cover connection leads 19, all of which are integrally connected together at the periphery of the stage 11. Thus, the second ends 13b of the chip connection leads 13 are positioned mutually adjacent to the stage 11.

Simultaneously with the formation of the lead frame or after the completion of the formation of the lead frame, the chip connection leads 13 are subjected to bending so that the second ends 13b of the chip connection leads 13 are shifted in position relative to the stage 11 in the thickness direction of the lead frame. As shown in FIGS. 3 and 4, the gap formed between the second end 13b of the chip connection lead 13 and the stage 11 depends upon the amount of bending the chip connection lead 13 is subjected to.

In addition, simultaneously with the formation of the lead frame or after the completion of the formation of the lead frame, the first grounded leads 15 and the interconnection leads 23 are subjected to bending as well, so that the bent portions 15c of the first grounded leads 15 and the interconnection leads 23 are bent and project relative to the stage 11 in the thickness direction of the lead frame. Herein, they are each bent and project in the prescribed direction substantially identical to the projecting direction of the first ends 13a of the chip connection leads 13. Incidentally, the first grounded leads 15 and the interconnection leads 23 are subjected to bending simultaneously with the bending of the chip connection leads 13 or before or after the bending of the chip connection leads 13.

Thereafter, a metal mold (not shown) used for the formation of the molded resin 21 is used to seal (or encapsulate) the lead frame inside of the molded resin 21; then, the chip connection leads 13, first grounded leads 15, second grounded leads 17, and cover connection leads 19 are subjected to cutting and are individually separated from each other, thus completing the formation of the substrate 3 sealed with the molded resin 21.

After the completion of the formation of the substrate 3, the semiconductor sensor chip 5 and the amplifier 7 are attached onto the upper surface 3a of the substrate 3 via the adhesive pastes B1 and B2. Then, wire bonding is performed so as to electrically connect together the semiconductor sensor chip 3 and the amplifier 7 via the wires 25; and wire bonding is performed so as to electrically connect together the amplifier 7 and the second ends 13b of the chip connection leads 13 via the wires 27.

Figure 7:
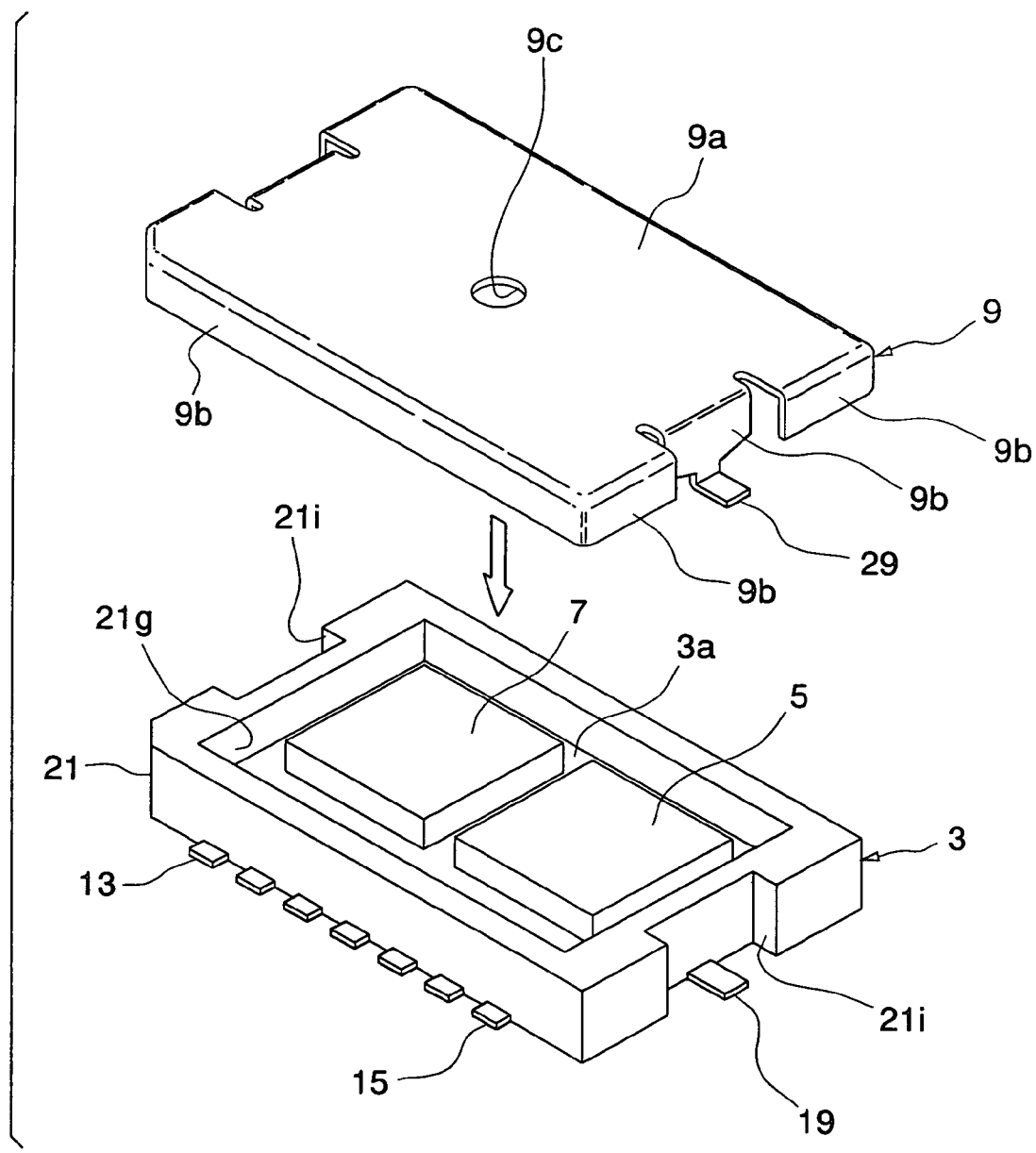
FIG. 7 is an exploded perspective view showing that a cover member is assembled with a substrate, which is encapsulated in a resin and which has a semiconductor sensor chip and an amplifier.
Figure 8:
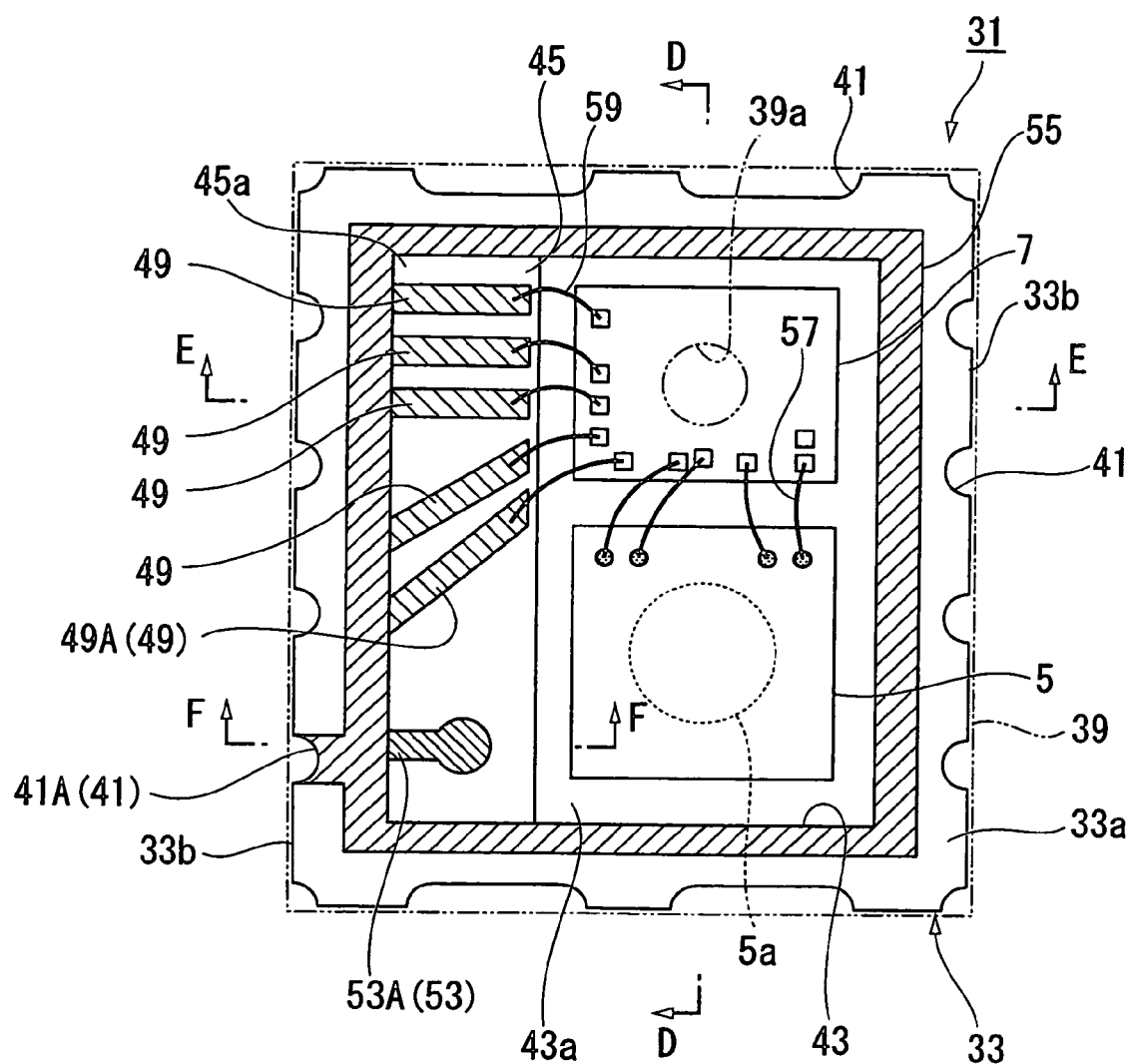
FIG. 8 is a plan view showing a substrate of a semiconductor device in accordance with a further variation of the first embodiment.
Figure 9:
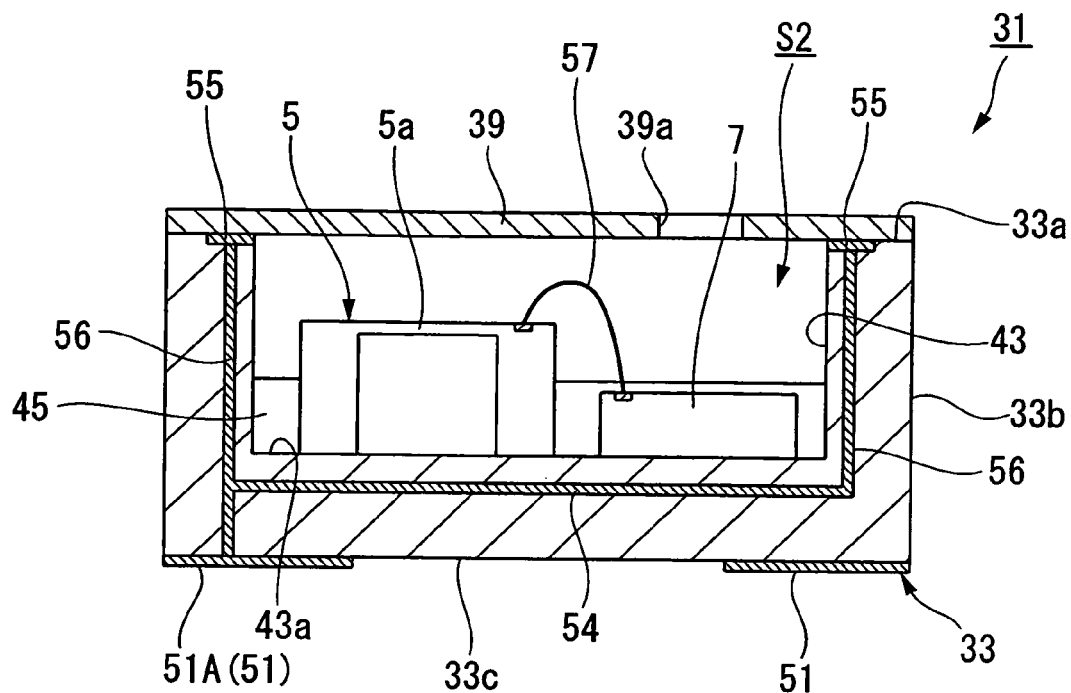
FIG. 9 is a cross-sectional view taken along line D-D in FIG. 8.
Figure 10:
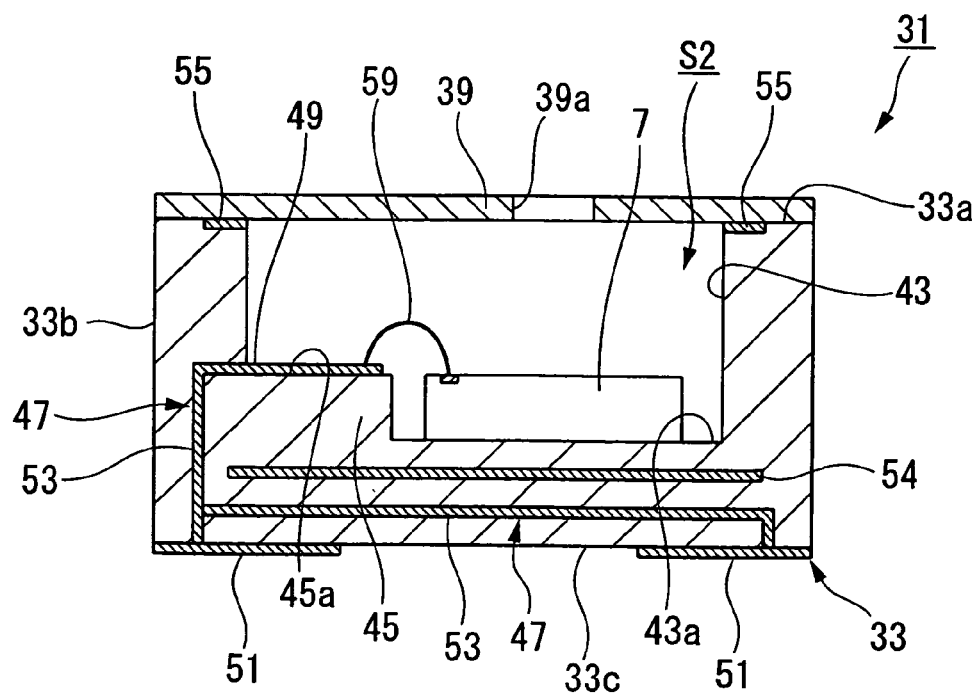
FIG. 10 is a cross-sectional view taken along line E-E in FIG. 8.
Figure 11:
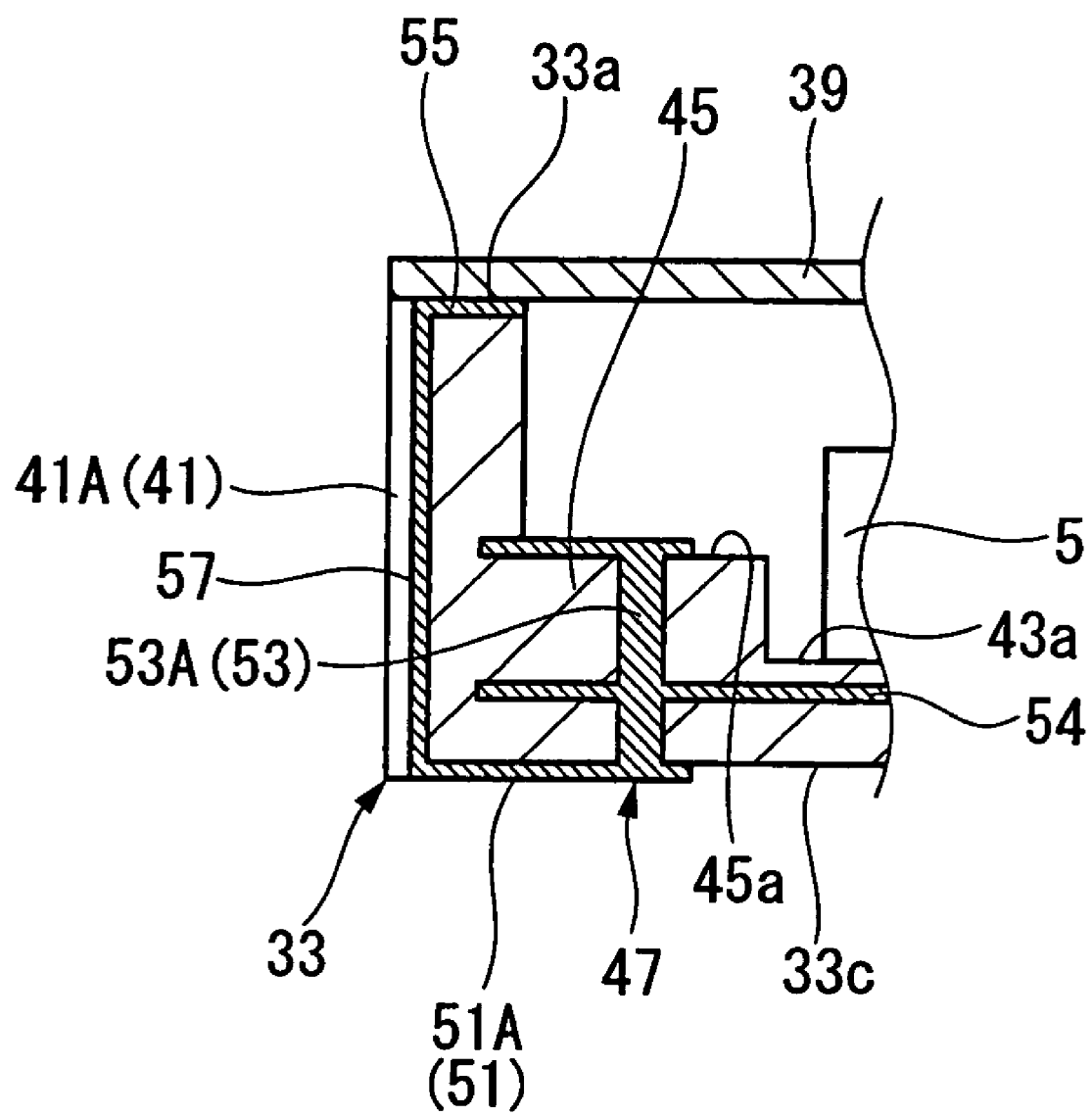
FIG. 11 is a cross-sectional view taken along line F-F in FIG. 8.

Lastly, as shown in FIGS. 1 and 7, the hollow 21g of the molded resin 21 is covered with the cover member 9, and the electromagnetic shield terminals 29 are fixed to the cover connection leads 19 by way of welding or soldering, thus completing the manufacturing of the semiconductor device 1.

When the substrate 3 sealed with the molded resin 21 is assembled together with the cover member 9, the side walls 9b forming the electromagnetic shield terminals 29 are guided by the projections 21h of the molded resin and are thus held inside of the recesses 21i of the molded resin 21. This realizes easy positioning of the cover member 9 in connection with the substrate 3.

When the semiconductor device 1 is mounted on the printed-circuit board (not shown), the chip connection leads 13, first grounded leads 15, and second grounded leads 17 join connection terminals formed on the printed-circuit board via solder, for example.

In the semiconductor device 1 of the first embodiment, the chip connection leads 13 are positioned opposite the second grounded leads 17 with respect to the semiconductor sensor chip 5; that is, they are arranged on both sides of the substrate 3 respectively; hence, it is possible to mount the semiconductor device 1 on the printed-circuit board in a stable manner.

In addition, the chip connection leads 13 and the first grounded leads 15, which are partially exposed on the upper surface 3a of the substrate 3, are adjacently disposed in line along the long side of the rectangular area for arranging the semiconductor sensor chip 5 and the amplifier 7; hence, it is possible to easily downsize the semiconductor device 1 without substantially changing the size of the semiconductor sensor chip 5 and the size of the amplifier 7.

The chip connection leads 13 whose second ends 13b are shifted in position relative to the stage 11 in the thickness direction are disposed in line along one side of the semiconductor sensor chip 5 and the stage 11. Hence, the gaps, which are formed between the stage 11 and the second ends 13b of the chip connection leads 13 subjected to bending, are formed only on one side of the semiconductor sensor chip 5 and the stage 11. This makes it possible for the stage 11 to entirely cover the lower portions of the semiconductor sensor chip 5 and amplifier 7 while securing a sufficiently large size of the stage 11. In addition, the second grounded leads 17 can be positioned close to the stage 11 within the aforementioned gaps. This further downsizes the semiconductor device 1.

The stage 11 is electrically connected to the cover member 9 having conductivity; hence, when the semiconductor device 1 is mounted on the printed-circuit board so that the first and second grounded leads 15 and 17 are electrically connected to the ground terminals of the printed-circuit board establishing the reference potential, it is possible to reliably block electromagnetic noise from being transmitted into the hollow space S2 from the upper surface 3a, lower surface 3b, and sides 21c, 21d, and 21e of the molded resin 21 by means of the cover member 9 and the stage 11.

The interconnection leads 23 for interconnecting together the second grounded leads 17 and the stage 11 are embedded inside of the molded resin 21, so that the second grounded leads 17 and the stage 11 are mutually separated from each other and are exposed externally of the lower surface 3b of the molded resin 21. Hence, when the second grounded leads 17 are soldered to the connection terminals of the printed-circuit board, it is possible to easily prevent the second grounded leads 17 from moving toward the stage 11 by means of solder. This makes is possible for the second grounded leads 17 to reliably join the connection terminals of the printed-circuit board by solder.

Since the interconnection leads 23 are embedded inside of the molded resin 21, it is possible to prevent the stage 11 and the second grounded leads 17 from falling off the molded resin 21.

The semiconductor device 1 of the first embodiment can be modified in a variety of ways; hence, variations will be described below.

(1) The interconnection leads 23 are subjected to bending so as to project upwards compared with the second grounded leads 17 and the stage 11; but this is not a restriction. That is, the present embodiment simply needs both of the second grounded leads 17 and the stage 11 to be reliably embedded inside of the molded resin 21. In other words, the interconnection leads 23 can be subjected to half etching (instead of bending) and thus embedded inside of the molded resin 21.

(2) The second grounded leads 17 are integrally formed with the stage 11 via the interconnection leads 23; but this is not a restriction. For example, the second grounded leads 17 can be separated from the stage 11; that is, they play a role in mounting the semiconductor device 1 on the printed-circuit board. In this variation, it is preferable that the interconnection leads 23, which are embedded inside of the molded resin 21, be interconnected with the stage 11 and the second grounded leads 17. Thus, it is possible to prevent the stage 11 and the second grounded leads 17 from easily falling off the molded resin 21.

(3) The stage 11 is designed so as to form the planar lower surface 3b of the substrate 3 together with the molded resin 21 and is partially exposed externally of the molded resin 21; but this is not a restriction. The present embodiment simply needs the stage 11 to be arranged below the semiconductor sensor chip 5 and the amplifier 7. In other words, the stage 11 can be completely embedded inside of the molded resin 21.

(4) The electromagnetic shield terminals 29 and the cover connection leads 19 are mutually fixed together; but this is not a restriction. The present embodiment simply needs both of the cover member 9 and the stage 11 to be electrically connected together.

(5) The semiconductor sensor chip 5 and the amplifier 7 are arranged on the upper surface 3a of the substrate 3; but this is not a restriction. The semiconductor device 1 can be redesigned to arrange only the semiconductor sensor chip 5. In this variation, the chip connection leads 13 and the first grounded leads 15 are adjacently disposed in line along one side of the rectangular-shaped semiconductor sensor chip 5.

Next, a further variation of the first embodiment will be described in detail with reference to FIGS. 8 to 11, wherein parts identical to those shown in the foregoing drawings are designated by the same reference numerals; hence, the description thereof will be omitted as necessary.

A semiconductor device 31 includes a substrate 33 having a surface 33a, onto which the semiconductor sensor chip 5 and the amplifier 6 are attached, and a cover member 39, which covers the semiconductor sensor chip 5 and the amplifier 6.

The substrate 33 has a rectangular shape, which is defined by four sides 33b and a backside 33c as well as the surface 33a. A plurality of channels 41 are formed on the four sides 33b in such a way that they are each recessed and elongated along the surface 33a and the backside 33c. An internal recess 43 is formed on the surface 33a of the substrate 33.

The semiconductor sensor chip 5 and the amplifier 7 are arranged on a bottom 43a of the internal recess 43. A step portion 45 is formed to project from the bottom 43a of the internal recess 43 on one side along the arrangement direction of the semiconductor sensor chip 5 and the amplifier 7. Due to the formation of the step portion 45, a step-like shape is formed in connection with the surface 33a of the substrate 33 and the bottom 43a of the internal recess 43.

The substrate 33 is designed as a multilayered wiring substrate composed of ceramics, which has a plurality of externally-connected wirings 47 for establishing electrical connection between the semiconductor sensor chip 5, the amplifier 7, and a printed-circuit board (not shown) on which the semiconductor device 31 is mounted.

The externally-connected wirings 47 include an internal terminal 49, which is exposed above an upper surface 45a of the step portion 45 so as to establish electrical connection with the amplifier 7, an external terminal 51, which is exposed below the backside 33c of the substrate 33 so as to establish electrical connection with the printed-circuit board, and a conductive wiring 53, which is formed inside of the substrate 33 so as to establish electrical connection between the internal terminal 49 and the external terminal 51.

Specifically, five internal terminals 49 are disposed in line on the upper surface 45a of the step portion 45 along the arrangement direction of the semiconductor sensor chip 5 and the amplifier 7 in proximity to the amplifier 7. In addition, a plurality of external terminals 51 are arranged on both sides of the substrate 33 along the arrangement direction of the semiconductor sensor chip 5 and the amplifier 7.

Furthermore, a grounded internal terminal 49A is electrically connected to a grounded conductive wiring 53A, which is positioned in proximity to the semiconductor sensor chip 5 on the upper surface 45a of the step portion 45. The grounded conductive wiring 53A is formed so as to run through from the upper surface 45a of the step portion 45 to the backside 33c of the substrate 33 and is thus electrically connected to a grounded external terminal 51A.

A lower shield layer 54 having conductivity is formed inside of the substrate 33 and below the semiconductor sensor chip 5 and the amplifier 7. The lower shield layer 54 is enlarged so as to entirely cover the substrate 33, i.e., an area including at least the semiconductor sensor chip 5 and the amplifier 7 as well as wires 57 establishing electrical connection therebetween. Of course, the lower shield layer 54 is formed so as to entirely cover the bottom 43a of the internal recess 43 of the substrate 33. Alternatively, the lower shield layer 54 can be formed so as to vertically overlap with the conductive wiring 53 in the thickness direction of the substrate 33. When the conductive wiring 53 and the lower shield layer 54 are formed in the same layer, the conductive wiring 53 is arranged so as to surround the lower shield layer 54.

The lower shield layer 54 is electrically connected to a ring-shaped connection pad 55, which is formed on the surface 33a of the substrate 33, the grounded conductive wiring 53A, and the grounded external terminal 51A via conductive portions 56, which are vertically elongated in the thickness direction of the substrate 33. That is, the lower shield layer 54 and the grounded external terminal 51A are integrally formed together.

The ring-shaped connection pad 55 is partially connected with a channel 41A within the channels 41 formed on the four sides 33b of the substrate 33. A conductive portion 57 is formed on the interior surface of the channel 41A and is connected with the grounded external terminal 51A. Therefore, the ring-shaped connection pad 55 is electrically connected to the grounded external terminal 51A via the conductive portion 57 in addition to the conductive portion 56.

All of the externally-connected wiring 47, the ring-shaped connection pad 55, the lower shield layer 54, and the conductive portion 57 formed in the channel 41A are formed by way of screen printing by use of a paste material, which is mainly composed of silver powder, copper powder, and tungsten powder (or a paste in which a binder (e.g., an acrylic resin) is mixed with silver powder, copper powder, and tungsten powder). In addition, the internal terminal 49, which is exposed above the upper surface 45a of the step portion 45, and the external terminal 51, which is exposed below the backside 33c of the substrate 33, are subjected to nickel and gold plating in addition to the aforementioned paste material treatment.

Similar to the first embodiment, the semiconductor sensor chip 5 and the amplifier 7 are attached onto the bottom 43a of the internal recess 43 of the substrate 33 and are electrically connected together via a plurality of wires 57 (i.e., four wires 57). The amplifier 7 is electrically connected to the internal terminal 49 via a plurality of wires 59 (i.e., five wires 59). Thus, the semiconductor sensor chip 5 is electrically connected to the internal terminal 49 via the amplifier 7.

The cover member 39 is formed using a flat plate composed of a conductive material such as copper, which is subjected to nickel plating. When the cover member 39 is attached onto the surface 33a of the substrate 33, it completely covers the internal recess 43 so as to form a hollow space S2 embracing the semiconductor sensor chip 5 and the amplifier 7 together with the substrate 33. An opening hole 39a is formed at a prescribed position of the cover member 39 so as to run through in the thickness direction. Hence, the hollow space S2 communicates with the external space via the opening hole 39a.

The cover member 39 is brought into contact with and is electrically connected to the ring-shaped connection pad 55 having conductivity. That is, the cover member 39 is electrically connected to the grounded external terminal 51A via the ring-shaped connection pad 55, the conductive portion 56, and the conductive portion 57 of the channel 41A.

In the manufacturing of the semiconductor device 31, the substrate 33 is firstly prepared. Each single substrate 33 can be individually manufactured; however, it is possible to produce a plate having a plurality of substrates, which are then divided into individual pieces. In this case, a plurality of through holes are formed between adjacently arranged substrates to run through in the thickness direction; then, they are divided into individual pieces at the through holes, thus forming the channels 41 of the substrate and thus forming the conductive portion 57 in the interior surface of the channel 41A for establishing electrical connection between the ring-shaped connection pad 55 and the grounded external terminal 51A.

The aforementioned through holes may reduce the rigidity of the plate especially at scribing lines between the adjacently arranged substrates; hence, the substrates can be easily divided into pieces by simply bending the plate at the scribing lines.

Next, the semiconductor sensor chip 5 and the amplifier 7 are attached onto the bottom 43a of the internal recess 43 of the substrate 33 via the adhesive paste (not shown); then, they are electrically connected together via the wires 57 by way of wire bonding. Lastly, the cover member 39 is fixed to the surface 33a of the substrate 33, thus completing the manufacturing of the semiconductor device 31. Herein, the conductive adhesive is used to realize the fixation of the cover member 39 with the substrate 33, for example.

Similar to the first embodiment, the semiconductor device 31 is mounted on the printed-circuit board in such a way that the external terminals 51 join the connection terminals of the printed-circuit board.

Since the external terminals 51 are arranged on both sides of the substrate 33, it is possible to mount the semiconductor device 31 on the printed-circuit board in a stable manner.

In addition, the internal terminals 49 are exposed in the hollow space S2 and are adjacently disposed in line in the arrangement direction of the semiconductor sensor chip 5 and the amplifier 7; hence, it is possible to downsize the semiconductor device 31 with ease without substantially changing the sizes of the semiconductor sensor chip 5 and the amplifier 7.

In addition, the lower shield layer 54 of the substrate 33 is electrically connected to the cover member 39 having conductivity, whereby, upon establishment of the electrical connection between the grounded external terminal 51A and ground terminal (not shown) of the printed-circuit board defining the reference potential when the semiconductor device 31 is mounted on the printed-circuit board, it is possible to reliably block electromagnetic noise from being transmitted into the hollow space S2 from the surface 33a and the backside 33b of the substrate 33 by means of the cover member 39 and the lower shield layer 54.

Incidentally, even when a gap between the cover member 39 and the lower shield layer 54 in the thickness direction of the substrate 33 is sufficiently smaller than wavelengths of electromagnetic waves, which may electromagnetically interfere with operations of the semiconductor sensor chip 5 and the amplifier 7, it is possible to reliably block electromagnetic noise from being transmitted into the hollow space S2 from the sides 33b of the substrate 33 without forming the side wall 39b of the cover member 39.

However, when the gap is greater than wavelengths of electromagnetic waves, the cover member 39 should be redesigned to have a flat top portion, which accommodates the surface 33a of the substrate 33, and a side wall, which is extended downwardly from the rectangular periphery of the top portion along the four sides 33b of the substrate, whereby it is possible to block electromagnetic noise from being transmitted into the hollow space S2 from the four sides 33b of the substrate 33 by means of the side wall of the cover member 39.

A further variation of the first embodiment described above is designed such that the internal terminal 49 is formed on the upper surface 45a of the step portion 45. This is not a restriction. That is, the internal terminal 49 can be directly formed on the bottom 43a of the internal recess 43 without the formation of the step portion 45.

A further variation of the first embodiment is designed such that the external terminal 51, which is electrically connected to the internal terminal 49 and the lower shield layer 54, is formed on the backside 33c of the substrate 33. It is also possible to form other external terminals, which are not electrically connected to the internal terminal 49 and the lower shield layer 54, on the backside 33c of the substrate 33.

Moreover, the substrate 33 is not necessarily composed of a ceramic; hence, it can be composed of a glass epoxy resin, for example.

2. Second Embodiment

A semiconductor device 100A of a second embodiment will be described in detail with reference to FIGS. 12 to 17, FIGS. 18A and 18B, and FIG. 19. The semiconductor device 100A is of a QFN (Quad Flat Non-leaded package) type and is designed to detect sound pressure.

As shown in FIGS. 12 to 16, the semiconductor device 100A includes a stage 101 having a rectangular shape; a plurality of external terminals 102 whose first ends 102a are connected to the stage 101 and whose second ends 102b extend externally of the semiconductor device 100A; a plurality of leads 103 which extend from the prescribed sides of the semiconductor device 100A toward the stage 101 so that first ends 103a thereof are positioned in proximity to the stage 101; a resin layer 104 which seals the stage 101, the external terminals 102, and the leads 103 therein and which has an opening hole 104c running through from an upper surface 104a (substantially matching the upper surface of a substrate 100A1) toward a lower surface 104b; a semiconductor sensor chip (or a sound pressure sensor chip) 105 having a rectangular shape fixed onto the upper surface 104a of the resin layer 104; an amplifier 106 that is fixed onto the upper surface 104a of the resin layer 104 so as to amplify electric signals output from the semiconductor sensor chip 105; a plurality of wires 107 for electrically connecting together the semiconductor sensor chip 105, the amplifier 106, and the leads 103; and a dish-like cover member 109 that is attached onto the resin layer 104 so as to define a first space above the semiconductor sensor chip 105 and the amplifier 106. Herein, the leads 103 also serve as external terminals connected to an external device (not shown) but are designated differently from the external terminals 102, which are electrically connected to electromagnetic shield terminals 109d of the cover member 109 so as to form electromagnetic shields. The substrate 100A1 is constituted by the stage 101, the external terminals 102, the leads 103, and the resin layer 104 sealing them.

Figure 14:
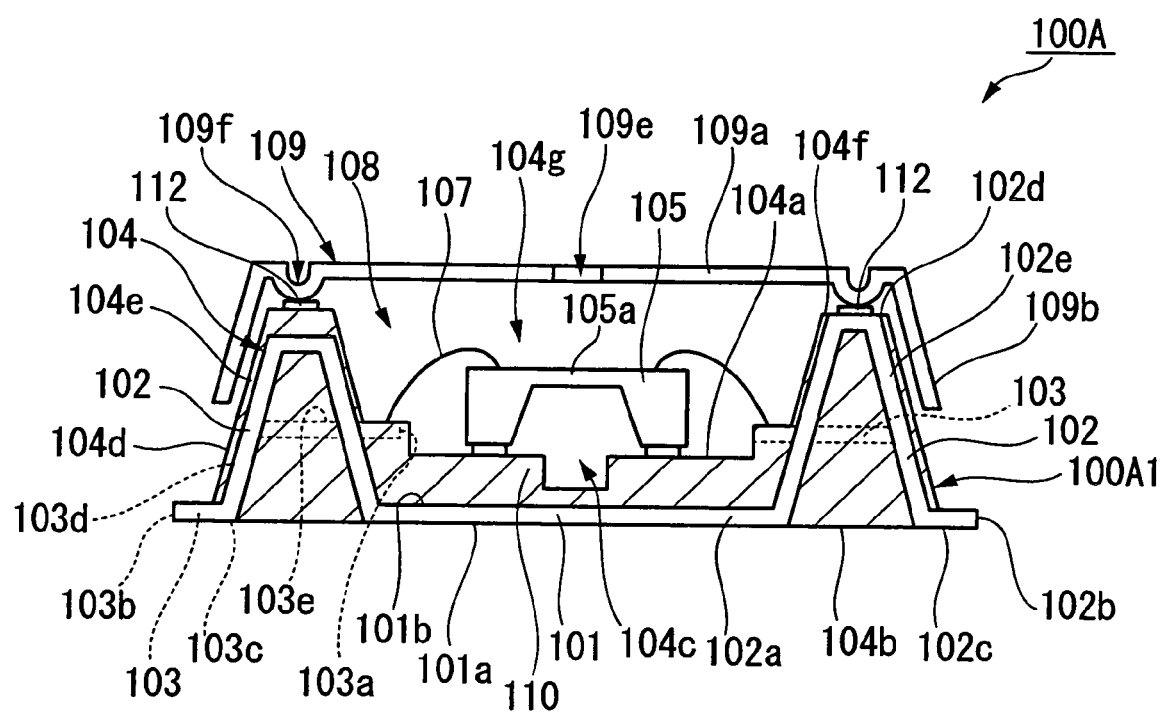
FIG. 14 is a cross-sectional view showing the internal structure of the semiconductor device shown in FIG. 12.
Figure 15:
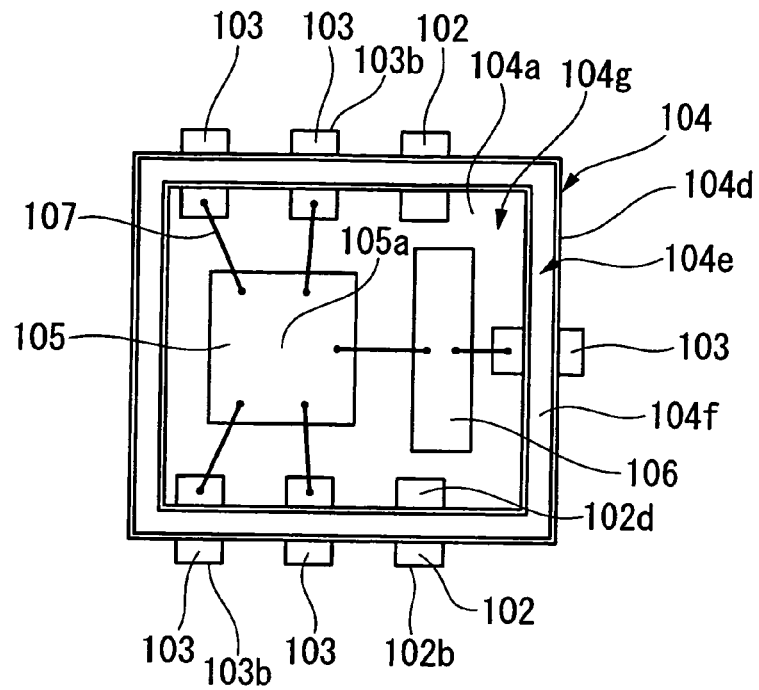
FIG. 15 is a cross-sectional view taken along line X-X in FIG. 13.
Figure 16:
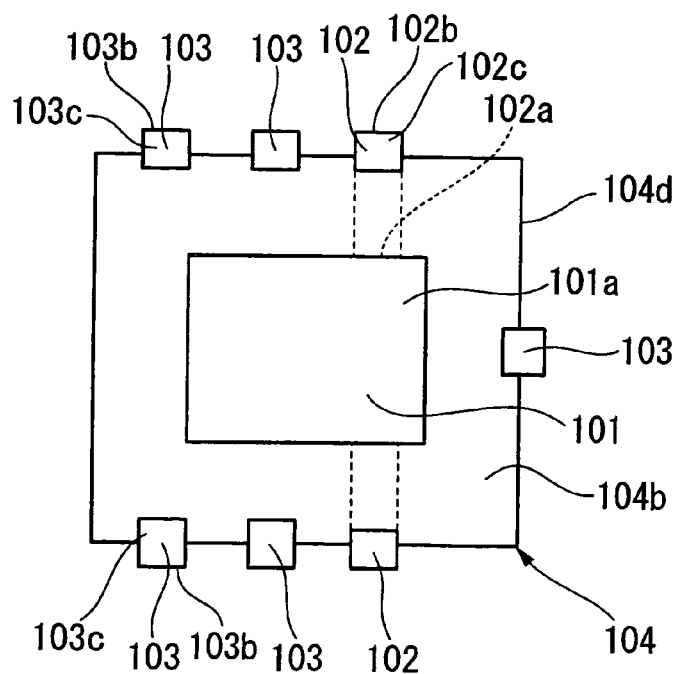
FIG. 16 is a cross-sectional view taken along line Y-Y in FIG. 13.

As shown in FIGS. 14 to 16, the stage 101 is positioned just below the opening hole 104c of the resin layer 104, and a lower surface 101a thereof forms the same plane with the lower surface 104b of the resin layer 104 and is exposed. In addition, the stage 101 is formed in a prescribed size allowing the semiconductor sensor chip 105 and the amplifier 106, which are attached onto the upper surface 104a of the resin layer 104, to be positioned above the stage 101 in view of the upper surface 104a.

As shown in FIGS. 12 to 16, the external terminals 102 have flat, band-like shapes, in which first ends 102a thereof are connected to side ends of the stage 101 and extend outwardly of the resin layer 104 and perpendicular to the side ends of the stage 101 in plan view from the upper surface 101b of the stage 101. The second ends 102b of the external terminals 102 slightly project externally from the prescribed sides of the resin layer 104 (corresponding to the prescribed sides of the substrate 100A1), wherein lower surfaces 102c of the projected side ends 102b (corresponding to the lower surfaces of the external terminals 102) are arranged substantially in the same plane as the lower surface 104b of the resin layer 104. As shown in FIG. 14, the external terminal 102 has a bent portion 102e which projects upwardly so as to form a top portion 102d, which is positioned above and in parallel with the upper surface 101b of the stage 101, between the first end 102a and the second end 102b. The top portion 102d of the bent portion 102e of the external terminal 102 is exposed and is positioned substantially in the same plane as a top portion 104f of a projection 104e of the resin layer 104, which will be described later. The present embodiment uses a pair of the external terminals 102, which are positioned opposite each other, wherein the top portion 102d of the bent portion 102e of one external terminal 102, which is mainly used for supporting the stage 101, is positioned lower than the top portion 104f of the projection 104e of the resin layer 104.

As shown in FIGS. 12 to 16, a plurality of the leads 103 are each formed in a flat-band-like shape similarly to the external terminals 102. Specifically, the present embodiment provides two leads 103 on each of opposite sides 104d of the resin layer 104 in proximity to the semiconductor sensor chip 105. That is, on each of the opposite sides 104d of the resin layer 104, the two leads 103 are extended in parallel with the external terminal 102 in such a way that the two leads 103 and one external terminal 102 are adjacently to each other with an equal spacing therebetween. In addition, a single lead 103 is positioned on one of opposite sides 104d, which are perpendicular to the aforementioned opposite sides 104d (each arranging two leads 103 and one external terminal 102) in plan view from the lower surface 104b of the resin layer 104, in proximity to the amplifier 106. Similar to the external terminals 102, the second ends 103b of the leads 103 slightly project externally of the resin layer 104, so that lower surfaces 103c of the projected second ends 103b of the leads 103 are exposed and are positioned substantially in the same plane as the lower surface 104b of the resin layer 104 and the lower surfaces 102c of the second ends 102 of the external terminals 102. As shown in FIG. 14, the lead 103 has a bent portion 103d lying between the first end 103a and the second end 103b, wherein an upper surface 103e of the first end 103a is positioned higher than an upper surface 103e of the second end 103b and is positioned substantially in the same plane as an internal upper surface 104a positioned inwardly of the projection 104e of the resin layer 104.

As shown in FIGS. 12 to 16, the resin layer 104 for sealing the stage 101, the external terminals 102, and the leads 103 has the upper surface 104a and the lower surface 104b, wherein the projection 104e projects upwardly from the upper surface 104a so as to seal the bent portions 102e of the external terminals 102 and the bent portions 103d of the leads 103 in proximity to the sides 104d. The projection 104e is elongated along the sides 104d of the resin layer 104 and is gradually reduced in dimensions (or width) toward the tip end thereof (i.e., the top portion 104f). The projection 104e forms an internal recess 104g on the upper surface 104a of the resin layer 104. The opening hole 104c, which is recessed in a direction from the upper surface 104a to the lower surface 104b, is formed approximately at the center of the upper surface 104a of the resin layer 104 within the internal recess 104g. Specifically, the opening hole 104c runs through from the upper surface 104a to the upper surface 101b of the stage 101, which is positioned below the resin layer 104.

Figure 13:
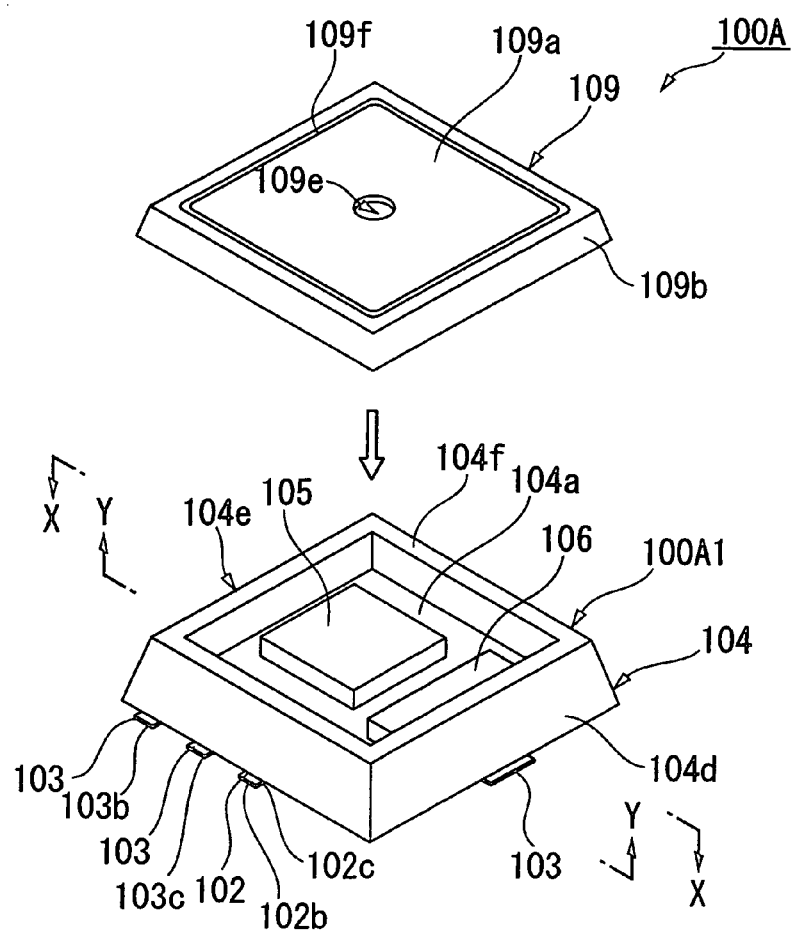
FIG. 13 is an exploded perspective view showing that a cover member is assembled with a substrate so as to form the semiconductor device.

As shown in FIGS. 13 to 15, the rectangular-shaped semiconductor sensor chip 105 has a trapezoidal recess, which is recessed in a direction from the lower surface to the upper surface approximately at the center in plan view of the lower side and in which a thinned portion forms a diaphragm (or a moving electrode) 105a. The diaphragm 105a vibrates (or deforms) in response to sound pressure applied thereto. A bridge-resistance circuit is formed on the upper surface of the diaphragm 105a so as to translate the displacement thereof into variations of electric resistance, based on which electric signals are produced in response to the sound pressure. The lower surface of the semiconductor sensor chip 105 is attached onto the upper surface 104a of the resin layer 104 via adhesive. Herein, the opening hole 104c of the resin layer 104 is positioned just below the diaphragm 105. When the semiconductor sensor chip 105 is attached onto the upper surface 104a of the resin layer 104, a second space 110 is formed in an airtight manner with respect to the trapezoidal recess of the semiconductor sensor chip 105 and the opening hole 104c of the resin layer 104.

The amplifier 106 such as an operation amplifier (which is an integrated circuit, i.e., IC) is attached onto the upper surface 104a of the resin layer 104 via adhesive, whereby the amplifier 106 is positioned in parallel with the semiconductor sensor chip 105.

A plurality of bonding pads are arranged for the semiconductor sensor chip 105 and the amplifier 106. By use of the bonding pads, the semiconductor sensor chip 105 and the amplifier 106 as well as the upper surfaces 103e of the leads 103, which are exposed in the first space 108 above the upper surface 104a of the resin layer 104, are connected together via the wires 107, thus establishing electrical connections between the semiconductor sensor chip 105, the amplifier 106, and the leads 103.

Figure 12:
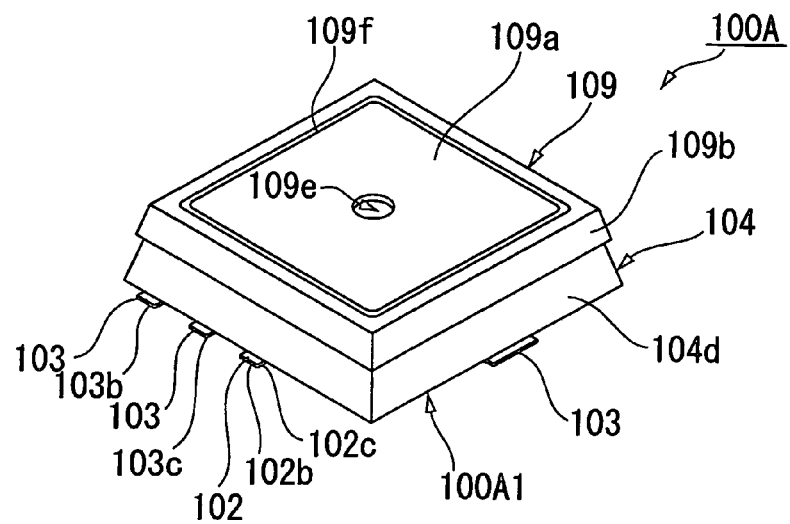
FIG. 12 is a perspective view showing a semiconductor device in accordance with a second embodiment of the present invention.

As shown in FIGS. 12 to 14, the cover member 109 is formed using a conductive material such as copper and is formed in a dish-like-shape whose hollow is directed downwardly. Specifically, the cover member 109 is constituted by a top portion 109a having a rectangular shape and a side wall 109b, which hangs down from the side ends of the top portion 109a. A through hole 109e running through the cover member 109 is formed approximately at the center of the top portion 109a. A coining 109f, which is recessed on the upper surface of the top portion 109a, is formed and continuously elongated in a rectangular shape along four sides of the upper surface in a plan view (see FIG. 12). That is, the coining 109f projects downwardly compared with the other portion of the top portion 109a of the cover member 109. The lower end portion of the coining 109f is attached to the top portion 104f of the projection 104e of the resin layer 104 via a conductive adhesive 112, so that the internal recess 104g of the resin layer 104 embracing the semiconductor sensor chip 105 and the amplifier 106 is covered with the top portion 109a of the cover member 109. Herein, the side wall 109b of the cover member 109 hangs downwardly toward the lower surface 104b of the resin layer 104 so as to cover the sides 104d of the resin layer 104. In addition, the top portion 109a of the cover member 109 is attached onto the top portion 102d of the bend portion 102e of the external terminal 102, which is exposed on the top portion 104f of the projection 104e of the resin layer 104, via the conductive adhesive 112, thus establishing electrical connection between the conductive cover member 109, the external terminal 102, and the stage 101, all of which are thus placed substantially at the same potential.

Next, a manufacturing method of the semiconductor device 100A will be described below.

As described above, the semiconductor device 100A is manufactured using a lead frame 120, which is prepared in advance. As shown in FIGS. 17, 18A, 18B, and 19, the lead frame 120 includes a rectangular frame 120a, two pairs of the leads 103 that project inwardly from the outer periphery of the rectangular frame 120a and are positioned opposite to each other (see FIG. 17), a pair of the external terminals 102 that project inwardly from the outer periphery of the rectangular frame 120a and are positioned opposite to each other, and the stage 101 that is interconnected with and supported by the external terminals 102. The lead frame 120 is formed by way of either press working or etching or by way of both of press working and etching, wherein the bent portions 103d of the leads 103 and the bent portions 102e of the external terminals 102 are formed at the same time.

Figure 19:
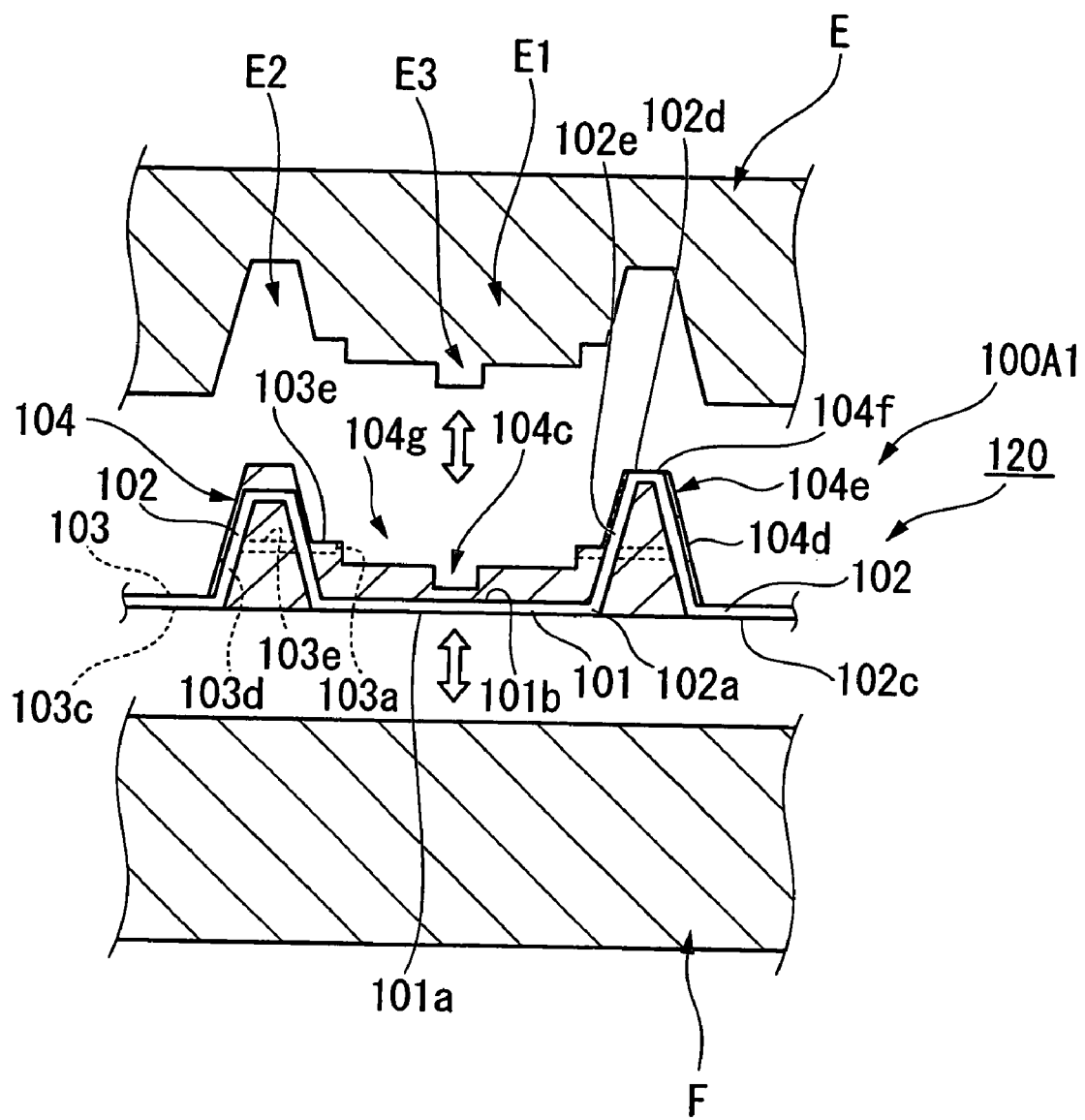
FIG. 19 is an exploded cross-sectional view showing that a resin layer is formed to encapsulate the substrate by use of a pair of metal molds.

After completion of the preparation of the lead frame 120, as shown in FIG. 19, the rectangular frame 120a, the leads 103, and the prescribed parts of the external terminals 102 are held between and tightly clamped between a pair of metal molds E and F. Specifically, the upper metal mold E, which is positioned above the lead frame 120, has a trapezoidal projection E1 for forming the internal recess 104g of the resin layer 104, a recessed channel E2 for forming the projection 104e and the sides 104d of the resin layer 104, and a small projection E3 for forming the opening hole 104c. The lower metal mold F, which is positioned below the lead frame 120, has a planar interior surface. As shown in FIG. 19, when the lead frame 120 is tightly held between the pair of the metal molds E and F, the planar interior surface of the lower metal mold F is brought into contact with the lower surface 101a of the stage 101, the lower surface 103c of the lead 103, which is positioned outwardly of the bent portion 103d, and the lower surface 102c of the external lead 102, which is positioned outwardly of the bent portion 102e. With respect to the upper metal mold E, the interior surface of the trapezoidal projection E1 is brought into contact with the upper surface 103e of the lead 103, which is positioned in proximity to the first end 103a rather than the bent portion 103d, while the bottom of the recessed channel E2 is brought into contact with the top portion 102d of the external terminal 102, which is positioned outwardly of the bent portion 102e. Furthermore, the upper end of the small projection E3 is positioned slightly above the upper surface 101b of the stage 101.

Thereafter, a melted resin composed of an epoxy resin is injected into a cavity formed between the metal molds E and F clamping the lead frame 120, thus embedding the stage 101, the external leads 102, and the leads 103 therein. After completion of the hardening of the resin, the metal molds E and F are removed. Thus, it is possible to form the resin layer 104 in which the internal recess 104g and the opening hole 104c are formed above the stage 101, and the top portion 102d of the bent portion 102e of the external lead 102 is exposed on the top portion 104f of the projection 104.

The aforementioned lead frame 120 partially encapsulated in the resin layer 104 is soaked in a plating solution including metals such as silver, gold, and palladium (Pd) so as to form a plating layer on the top portion 103e of the lead 103 in proximity to the first end 103a as well as the lower surface 103c in proximity to the second end 103b; then, the lead 103 and the external terminal 102, which extend externally of the resin layer 104, are subjected to cutting. The plating layer is used to improve the wettability of solder in connecting the leads 103 and the pattern (or connection terminals) of the printed-circuit board (which is installed in a portable telephone, for example) and in electrically connecting the semiconductor sensor chip 105, the amplifier 105, and the leads 103 via the wires 107. The plating layer is also formed on the lower surface 102c of the lead 102.

Next, as shown in FIGS. 13 to 15, the semiconductor sensor chip 105 and the amplifier 106 are positioned in parallel with each other and are attached onto the upper surface 104a of the internal recess 104g of the resin layer 104 via the adhesive. Herein, the semiconductor sensor chip 105 is positioned in such a way that the lower surface thereof is positioned opposite the upper surface of the internal recess 104g, and the diaphragm 105a is positioned just above the opening hole 104c. In addition, the wires 107 join the leads 103 and the bonding pads of the semiconductor sensor chip 105 and the amplifier 106, thus electrically connecting together the leads 103, the semiconductor sensor chip 105, and the amplifier 106.

Then, the dish-shaped cover member 109, which has the top portion 109a and the side wall 109b, is assembled together with the substrate 100A1 sealed with the resin layer 104 in such a way that the lower surface of the coining 109f of the top portion 109a is attached onto the upper surface 104f of the projection 104e of the resin layer 104 via the conductive adhesive 112. When the lower surface of the coining 109f is adhered onto the top portion 104f of the projection 104e of the resin layer 104, it is required that the top portion 102d of the external terminal 102 be electrically connected to the top portion 9a (i.e., the lower surface of the coining 109f) of the cover member 109 via the conductive adhesive 112, wherein the installed position of the cover member 109 relative to the substrate 100A1 is not necessarily set with high precision. The side wall 109b of the cover member 109 completely covers the internal recess 104g of the resin layer 104 so as to surround the sides 104d of the resin layer 104. This operation establishes precise positioning between the cover member 109 and the substrate 100A1 sealed with the resin layer 104 in such a way that the lower surface of the top portion 109a (i.e., the lower surface of the coining 109f) is electrically connected to the external terminal 102 exposed on the top portion 104f of the projection 104e. That is, the present embodiment realizes easy installation of the cover member 109 being electrically connected with the external terminals 102, thus completing the manufacturing of the semiconductor device 100A.

Next, the effect and operation of the semiconductor device 100A, which is manufactured as described above, will be described in detail.

The semiconductor device 100A of the present embodiment is installed in an electronic device such as a portable telephone having a printed-circuit board. Herein, the lower surfaces 103c of the leads 103 are exposed so as to be formed in substantially the same plane as the lower surface 104b of the resin layer 104; hence, the semiconductor device 100A can be mounted on the printed-circuit board at the prescribed position so that the lower surfaces 103c of the leads 103 reliably come in contact with the contact terminals of the printed-circuit board. Then, the leads 103 and the contact terminals of the printed-circuit board are connected together via solder.

In addition, the lower surfaces 102c of the external terminals 102, which are partially exposed externally of the resin layer 104, are horizontally held in substantially the same plane as the lower surfaces 103c of the leads 103. Therefore, when the semiconductor device 100A is mounted on the printed-circuit board, the lower surfaces 102c of the external terminals 102 reliably come in contact with the contact terminals of the printed-circuit board. When the leads 103 and the contact terminals of the printed-circuit board are connected together via solder, it is possible to simultaneously connect together the lower surfaces 102c of the external terminals 102 and the contact terminals of the printed-circuit board via solder. This establishes a soldered connection between the external terminals 102, the leads 103, and the contact terminals of the printed-circuit board with ease. This makes it possible to place the cover member 109, the external terminals 102, and the stage 101 substantially at the same potential with ease. In short, it is possible to form an electromagnetic shield embracing the semiconductor sensor chip 105 and the amplifier 106 by means of the cover member 109 and the stage 101.

The semiconductor device 100A mounted on the printed-circuit board introduces sound pressure of the sound externally generated thereof into the first space 108 via the through hole 109e of the cover member 109, so that the sound pressure reaches the diaphragm 105a of the semiconductor sensor chip 105, which thus correspondingly vibrates. The bridge-resistance circuit detects the displacement (or deformation) of the diaphragm 105a as variations of electric resistance, which are then converted into electric signals. The electric signals output from the semiconductor sensor chip 105 are amplified by the amplifier 106, by which it is possible to accurately detect the sound pressure. In addition, the semiconductor device 100A is influenced by electromagnetic noise, which occurs externally thereof, other than the sound pressure. The electromagnetic noise may transmit through the resin layer 104 to reach the semiconductor sensor chip 105, so that the diaphragm 105a may unexpectedly vibrate.

The semiconductor device 100A of the present invention is characterized in that the semiconductor sensor chip 105 and the amplifier 106 embraced in the first space 108 are covered with the cover member 109 having the top portion 109a and the side wall 109b and the stage 101 and are thus surrounded by the electromagnetic shield. That is, the electromagnetic noise transmitted through the resin layer 104 is blocked by the electromagnetic shield embracing the semiconductor sensor chip 105 and the amplifier 106, thus reliably preventing the electromagnetic noise from reaching the semiconductor sensor chip 105. Thus, the semiconductor device of the present embodiment can detect sound pressure with high reliability without being affected by electromagnetic noise.

In the semiconductor device 100A, it is possible to electrically connect together the cover member 109 and the external terminal 102 exposed on the top portion 104f of the projection 104e of the resin layer 104 by way of a simple operation in which the top portion 109a, which is positioned in such a way that the side wall 109b is positioned along the sides 104d of the resin layer 104, is adhered to the projection 104e of the resin layer 104 via the conductive adhesive 112. The semiconductor device 100A is mounted on the printed-circuit board of a portable telephone, for example, by simply soldering the lower surfaces 102c of the external terminals 102 to the connection terminals of the printed-circuit board, thus forming the electromagnetic shield embracing the semiconductor sensor chip 105 and the amplifier 106. Compared with the conventionally-known semiconductor devices, the present embodiment can reliably form the electromagnetic shield without requiring high precision for the installation of the cover member 109 assembled with the substrate 100A1 sealed with the resin layer 104. This noticeably reduces the work required for the installation of the cover member 109. That is, it is possible to reduce the cost for manufacturing the semiconductor device 100A.

In the semiconductor device 100A, the upper portion is covered with the top portion 109a of the cover member 109; the sides 104d of the resin layer 104 are covered with the side wall 109b of the cover member 109; and the lower portion is covered with the stage 101 whose size is larger than that of the semiconductor sensor chip 105, thus forming the electromagnetic shield. This makes it possible to reliably protect the semiconductor sensor chip 105 from electromagnetic noise. Thus, it is possible to realize the semiconductor device 100A having high reliability because the semiconductor sensor chip 105 can detect sound pressure with high accuracy.

The present embodiment is not necessarily limited to the aforementioned example; hence, it can be modified in a variety of ways, which will be described below.

(1) The cover member 109 is not necessarily constituted by the top portion 109a and the side wall 109b. That is, the cover member 109 can be modified to have only the top portion 109a while the side wall 109b is omitted.

(2) The lower surface of the coining 109f of the cover member 109 is joined to the top portion 104f of the projection 104e of the resin layer 104 via the conductive adhesive 112. However, the coining 109f is not necessarily formed in the cover member 109. Instead, the lower surface of the top portion 109a is formed in a planar shape, which is joined to the top portion 104f of the projection 104e via the conductive adhesive 112.

(3) The sound pressure of the externally generated sound is introduced into the first space 108 via the through hole 109e formed in the top portion 109a of the cover member 109. The through hole 109e is not necessarily formed in the top portion 109a of the cover member 109. Instead, another hole is formed in the stage 101 so as to establish communication between the external space and the opening hole 104c of the resin layer 104. That is, the sound pressure of the externally generated sound is transmitted toward the diaphragm 105a via the opening hole 104c and the hole. In this case, the first space 108 is closed in an airtight manner, while the second space 110 is opened and is connected with the external space, thus making it possible for the semiconductor sensor chip 105 to detect the sound pressure.

(4) The lower surface 101a of the stage 101 covering the lower portion of the semiconductor sensor chip 105 is partially exposed so as to be formed in substantially the same plane as the lower surface 104b of the resin layer 104. Instead, the lower surface 101a of the stage 101 is completely embedded inside of the resin layer 104 and is positioned in proximity to the upper surface 104a of the resin layer 104.

(5) The opening hole 104c of the resin layer 104 is elongated to be slightly higher than the upper surface 101b of the stage 101. Instead, the opening hole 104c can be elongated downwardly so that the bottom thereof reaches the upper surface 101b of the stage 101.

(6) The semiconductor device 100A is not necessarily equipped with both of the semiconductor sensor chip 105 and the amplifier 106. That is, the semiconductor device 100A is equipped with only the semiconductor sensor chip 105. In that case, an amplifier is mounted on the printed-circuit board of a portable telephone so as to amplify electric signals output from the semiconductor sensor chip 105.

(7) The semiconductor sensor chip 105 is not necessarily arranged such that the lower surface thereof is fixed onto the upper surface 104a of the resin layer 104. Instead, the upper surface of the semiconductor sensor chip 105 is positioned opposite to the upper surface 104a of the resin layer 104. In this case, the diaphragm 105a is formed in proximity to the opening hole 104c.

(8) The through hole 109e of the cover member 109 is not necessarily positioned just above the diaphragm 105a of the semiconductor sensor chip 105. The present embodiment simply requires that the through hole 109e is formed so as to establish communication between the first space 108 and the external space, wherein the positioning of the through hole 109 is not necessarily limited. For example, even when the through hole 109e is still positioned above the diaphragm 105a but is horizontally shifted in position, the semiconductor sensor chip 105 is not deteriorated in the detection accuracy with regard to the sound pressure. In addition, this is advantageous in that, when the water content is introduced into the first space 108 through the through hole 109e, it is possible to prevent the water content from directly reaching the diaphragm 105a; hence, it is possible to maintain or improve the detection accuracy with regard to the sound pressure.

The present embodiment is not necessarily limited to the aforementioned one; hence, it can be modified in a variety of ways, which will be described below.

With reference to FIGS. 20 to 23, a first variation of the present embodiment will be described in detail. That is, a semiconductor device 100B is designed to detect sound pressure of the externally generated sound and is manufactured using a lead frame of a QFP (i.e., Quad Flat Package) type. In FIGS. 20 to 23, parts identical to those shown in the aforementioned embodiment are designated by the same reference numerals; hence, the description thereof is omitted as necessary. Similar to the semiconductor device 100A, the semiconductor device 100B includes a substrate 100B1 in which the stage 101, the external terminals 102, and the leads 103 are sealed with the resin layer 104.

Figure 20:
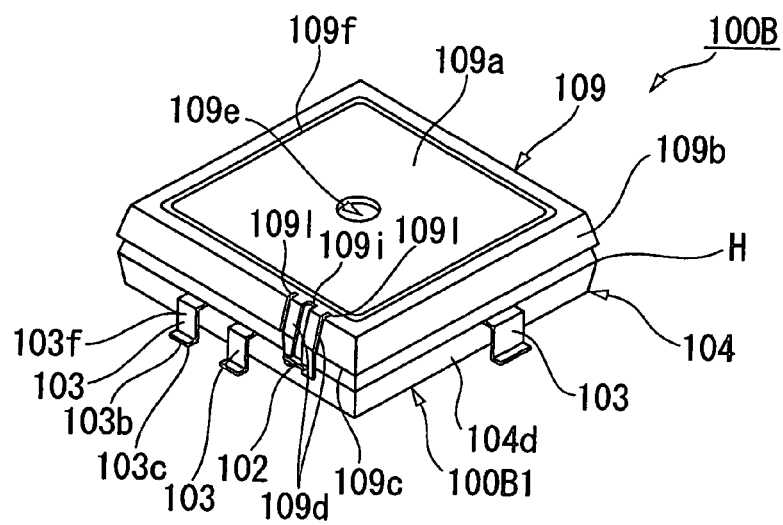
FIG. 20 is a perspective view showing a semiconductor device in accordance with a first variation of the second embodiment.
Figure 21:
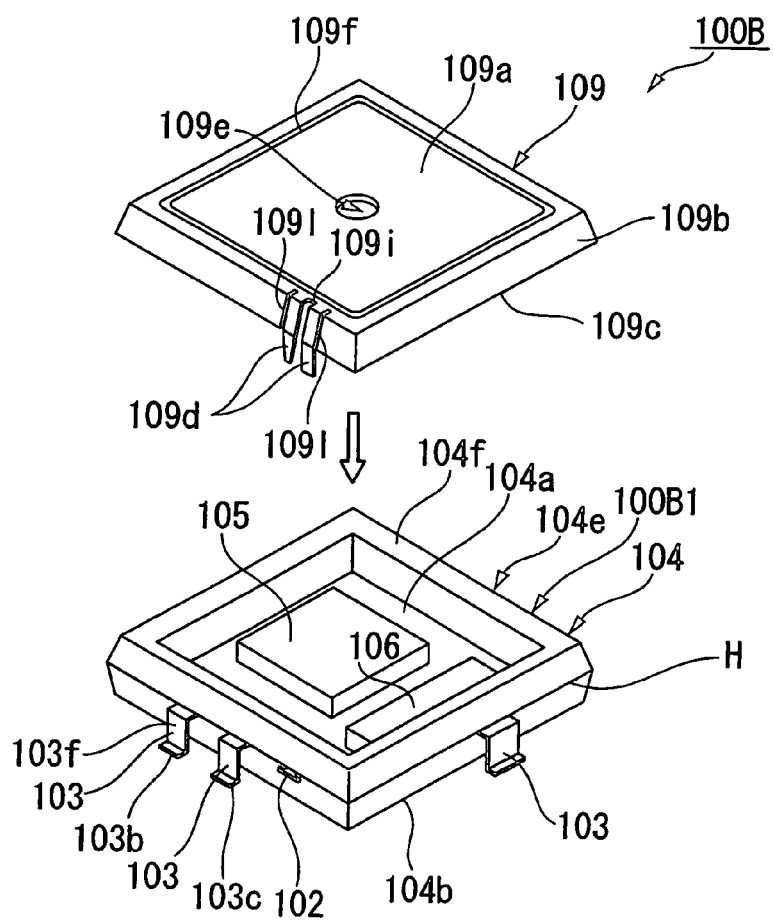
FIG. 21 is an exploded perspective view showing that the semiconductor device of the first variation is manufactured by assembling together a cover member with a substrate sealed with a resin layer.
Figure 22:
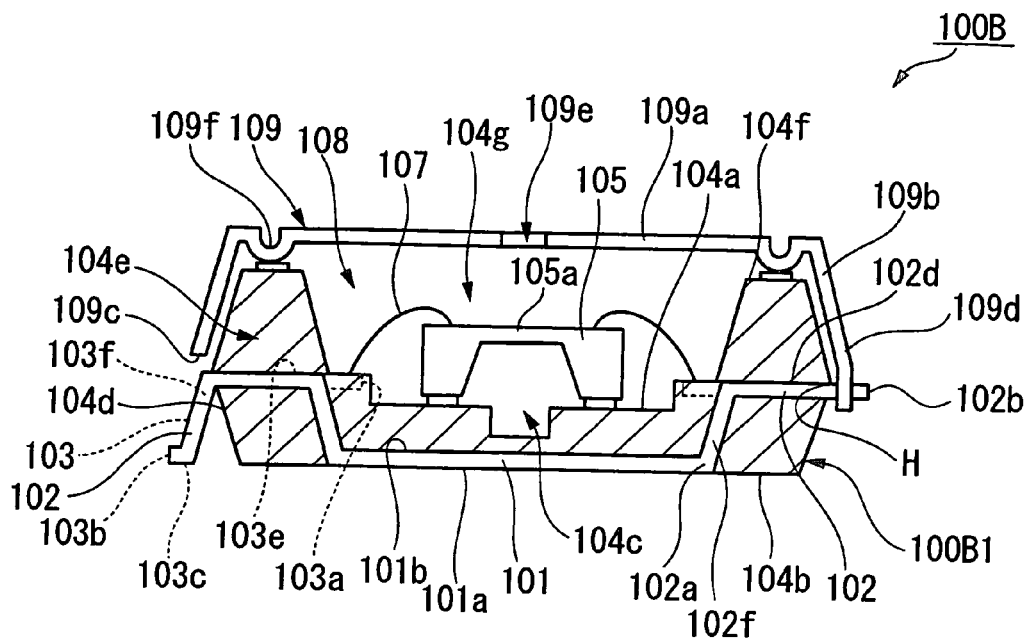
FIG. 22 is a cross-sectional view of the semiconductor device shown in FIG. 20.
Figure 23:
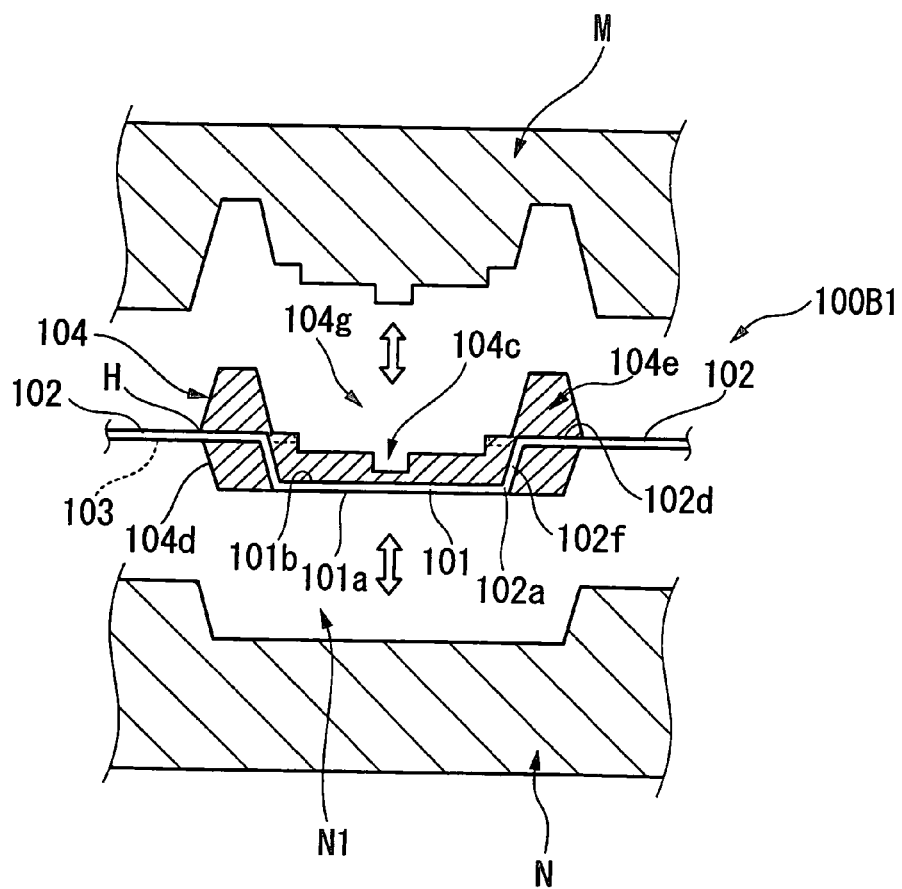
FIG. 23 is a cross-sectional view showing that the substrate is sandwiched between paired metal molds so as to form the resin layer.

Compared with the semiconductor device 100A, the external terminals 102, the leads 103, the resin layer 104, and the cover member 9 included in the semiconductor device 100B are modified in shape and constitution. In the first variation, as shown in FIGS. 20 to 22, the prescribed portions of the leads 103 completely sealed with the resin layer 104 are horizontally elongated so that the other portions extended externally of the sides 104d of the resin layer 104 hang down toward the lower surface 104b of the resin layer 104. That is, the leads 103 have hung-down portions 103f whose lower ends are bent horizontally outwardly of the semiconductor device 100B. Hence, the lower surfaces 103c of the leads 103 are arranged substantially in the same plane as the lower surface 104b of the resin layer 104.

The external terminals 102 have bent portions 102f, which are completely embedded in the resin layer 104 and which lie between the first ends 102a connected with the stage 101 and the second ends 102b. As shown in FIG. 22, the upper surface 102d is elevated upwardly due to the bent portion 102f and is positioned substantially in the same plane as the upper surface 103e of the first end 103a of the lead 103. Thus, the external terminal 102 is not exposed on the top portion 104f of the projection 104e of the resin layer 104, while the prescribed portion of the external terminal 102, which is upwardly held due to the bent portion 102f, is elongated horizontally and slightly projects externally of the resin layer 104.

The resin layer 104 has a bent point H that is positioned substantially in the same plane as the upper surface 103e of the first end 103a of the lead 103 and the upper surface 102d of the second end 102b of the external terminal 102. That is, the sides 104d of the resin layer 104 are bent at the bent point H so that the lower portions thereof below the bent point H have small slopes, which are inclined downwardly and inwardly of the semiconductor device 100B. The lower surface 104b of the resin layer 104 is positioned substantially in the same plane as the lower surface 103c of the lead 103 and the lower surface 101a of the stage 101.

Similar to the semiconductor device 100A, the cover member 109 of the semiconductor device 100B is constituted by the top portion 109a, which is fixed onto the top portion 104f of the projection 104e of the resin layer 104, and the side wall 109b, which hangs downwardly from the side ends of the top portion 109a so as to cover the sides 104d of the resin layer 104. In addition, the cover member 109 of the semiconductor device 100B has an electromagnetic shield terminal 109d, which is elongated from the side end of the top portion 109a to the lower end 109c of the side wall 109b along the side wall 109b and is further elongated downwardly. The electromagnetic shield terminal 109d is divided into two pieces by way of a cut portion 109i, which is elongated from the lower end to the upper end connected with the side end of the top portion 109a. That is, two pieces of the electromagnetic shield terminal 109d are separated from each other with a gap therebetween by way of slits 109l, which are elongated from the lower end 109c of the side wall 109b to the side end of the top portion 109a. Hereinafter, two pieces of the electromagnetic shield terminal 109d will be referred to as two shield terminals 109d, which are separated from each other by way of the cut portion 109i.

When the cover member 109 is assembled together with the resin layer 104, the prescribed portion of the external terminal 102, which is elongated externally of the resin layer 104, is inserted into the cut portion 109i between the two shield terminals 109d, which thus sandwich the external terminal 102 therebetween. This brings the two shield terminals 109d in contact with the external terminal 102, thus establishing electrical connection between the conductive cover member 109, the external terminal 102, and the stage 101.

Next, a manufacturing method of the semiconductor device 100B will be described below.

Figure 17:
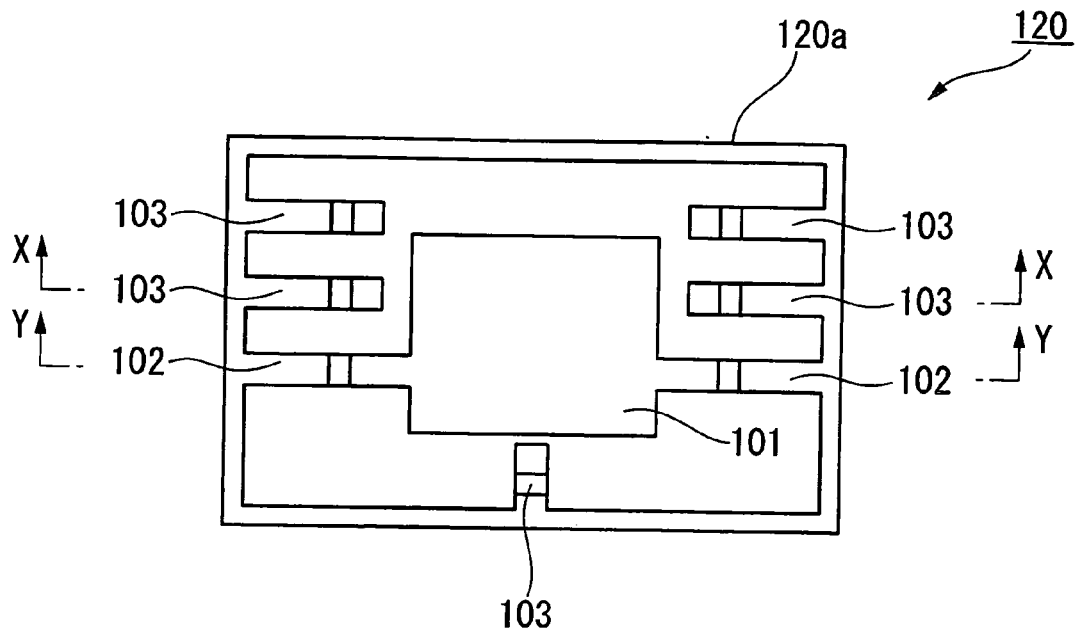
FIG. 17 is a plan view showing a lead frame for use in manufacturing of the semiconductor device.
Figure 18A:
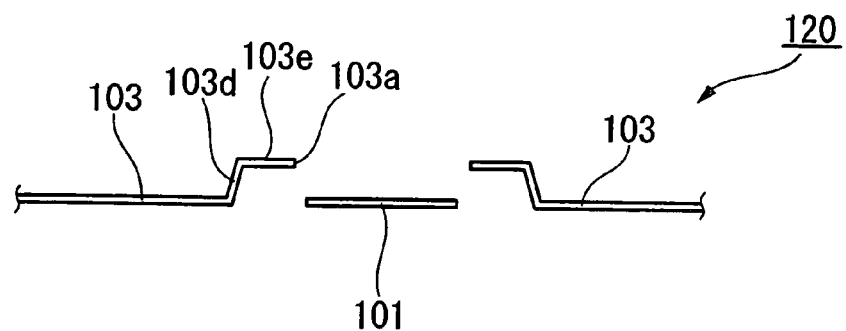
FIG. 18A is a cross-sectional view taken along line X-X in FIG. 17.
Figure 18B:
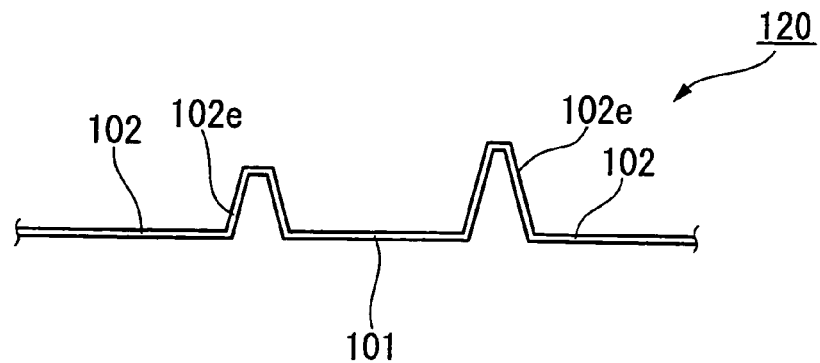
FIG. 18B is a cross-sectional view taken along line Y-Y in FIG. 17.

The semiconductor device 100B is manufactured using the aforementioned lead frame 120 shown in FIG. 17. In the first variation, the lead frame 120 is modified such that the bent portion 102f of the external terminal 102 is formed, and the upper surface 102d of the second end 102b integrally elongated from the bent portion 102f is positioned so as to be higher than the upper surface 101b of the stage 101. Incidentally, the hung-down portions 103f of the leads 103, which extend externally of the resin layer 104 and are bent and hung down, are not formed; hence, the leads 103 are simply elongated externally of the resin layer 104 in a horizontal direction.

Then, the rectangular frame 120a of the lead frame 120 and the prescribed portions of the leads 103 and the external terminals 102 are held between and clamped by a pair of metal molds M and N. Specifically, the lower metal mold N has a trapezoidal recess N1 having slopes, which are inclined so as to make the lower portions of the sides 104d, which are below the bent point H in the resin layer 104, incline downwardly. The upper metal mold M is shaped similar to the aforementioned upper metal mold E (see FIG. 19) originally used in the second embodiment. After the lead frame 120 and its associated parts are subjected to clamping between the paired metal molds M and N, a melted resin is injected into a cavity, which is formed between the metal molds M and N; then, after completion of the hardening of the resin, the metal molds M and N are removed, thus forming the resin layer 104.

Thereafter, unnecessary portions of the leads 103 and the external terminals 102, which extend externally of the resin layer 104, are subjected to cutting, thus making the prescribed lengths of the leads 103 and the external terminals 102 remain. In addition, the prescribed portions of the leads 103, which still remain externally of the resin layer 104, are bent downwardly so as to form the hung-down portions 103f. At this time, the lower surfaces 103c of the hung-down portions 103f are positioned substantially in the same plane as the lower surface 104b of the resin layer 104. Then, similar to the second embodiment, the semiconductor sensor chip 105 and the amplifier 106 are attached onto the upper surface 104a of the resin layer 104 and are connected with the wires 107.

Next, there is provided the cover member 109 in which the top portion 109a, the side wall 109b, and the shield terminals 109d are formed in advance. The cover member 109 is subjected to positioning such that the lower surface of the top portion 109a is adhered onto the top portion 104f of the projection 104e of the resin layer 104 via the adhesive. In the first variation, the prescribed portion of the external terminal 102, which extends externally of the resin layer 104, is inserted into the cutout portion 109i between the two shield terminals 109d, so that the prescribed portion of the external terminal 102 is sandwiched and tightly held between the two shield terminals 109d. This makes it possible for the external terminal 102 to come in contact with the two shield terminals 109d and to be electrically connected to each other. That is, the semiconductor device 100B is completed in manufacture when the installation of the cover member 109 is completed and is thus assembled with the substrate 100A1 sealed with the resin layer 104.

Next, the operation and effect of the semiconductor device 100B will be described below.

Similar to the second embodiment, the semiconductor device 100B of the first variation is installed in a portable telephone in such a way that the lower surfaces 103c of the hung-down portions 103f of the leads 103 are brought into contact with the connection terminals of the printed-circuit board; then, the leads 103 are connected with the printed-circuit board by way of solder. Thus, it is possible to realize the installation of the semiconductor device 100B by way of a simple operation.

When the semiconductor device 100B is mounted on the printed-circuit board, the lower surface 101a of the stage 101, which is exposed and is positioned substantially in the same plane as the lower surface 104b of the resin layer 104 in connection with the external terminals 102, is brought into contact with the connection terminals of the printed-circuit board. This allows the cover member 109, which is electrically connected with the external terminals 102, to be placed substantially at the same potential as the stage 101, wherein the semiconductor sensor chip 105 is embraced in the electromagnetic shield formed by the cover member 109 and the stage 101.

That is, the semiconductor device 100B requires a simple operation, in which the top portion 109a of the cover member 109 is fixed onto the projection 104e of the resin layer 104 while the side wall 109b is positioned along the sides 104d of the resin layer 104, so that the external terminal 102 is inserted into and tightly held in the cutout portion 109i between the two shield terminals 109d, thus allowing the cover member 109 to be electrically connected to the external terminal 102. When the semiconductor device 100B is mounted on the printed-circuit board of an electronic device such as a portable telephone, it is possible to bring the stage 101 into contact with the connection terminals of the printed-circuit board; and it is also possible to form the electromagnetic shield embracing the semiconductor sensor chip 105 by means of the stage 101 and the cover member 109. In short, with the installation of the cover member 109, it is possible to easily form the electromagnetic shield; hence, it is possible to reduce the cost for manufacturing the semiconductor device 100B.

In the semiconductor device 100B, the cover member 109 is assembled with the substrate 100B1 sealed with the resin layer 104 such that the external terminal 102 is sandwiched between the two shield terminals 109d, thus realizing tight connection between the cover member 109 and the substrate 100B1. This reliably prevents the cover member 109 from being shifted in position or from falling off.

The first variation can be further modified in a variety of ways, which will be described below.

(1) The two shield terminals 109d are formed by way of the cutout portion 109i, which is elongated from the lower end to the upper end corresponding to the side end of the top portion 109a, and the two slits 109l, which are elongated from the lower end 109c of the side wall 109b to the side end of the top portion 109a so as to form a gap with the side wall 109b. This is not a restriction. For example, the cutout portion 109i is elongated from the lower end of the electromagnetic shield terminal 109d to the position which is below the lower end 109c of the side wall 109b; that is, the lower portion of the electromagnetic shield terminal 109d is divided into two pieces via the cutout portion 109i so as to form the two shield terminals 109d, wherein the external terminal 102 is tightly held in the lower side of the cutout portion 109i.

(2) When the semiconductor device 100B is mounted on the printed-circuit board, the stage 101 comes in contact with the contact terminals of the printed-circuit board so that the electromagnetic shield is formed by means of the cover member 109, the external terminals 102, and the stage 101. This is not a restriction. For example, the external terminal 102 can be modified similar to the lead 103 such that the prescribed portion thereof, which extends externally of the resin layer 104, is bent to form a hung-down portion whose lower surface is positioned substantially in the same plane as the lower surface 103c of the lead 103. In this modification, when the semiconductor device 100B is mounted on the printed-circuit board, the lower surfaces of the hung-down portions of the external terminals 102 are brought into contact with the contact terminals of the printed-circuit board so as to establish electrical connection therebetween.

Figure 24:
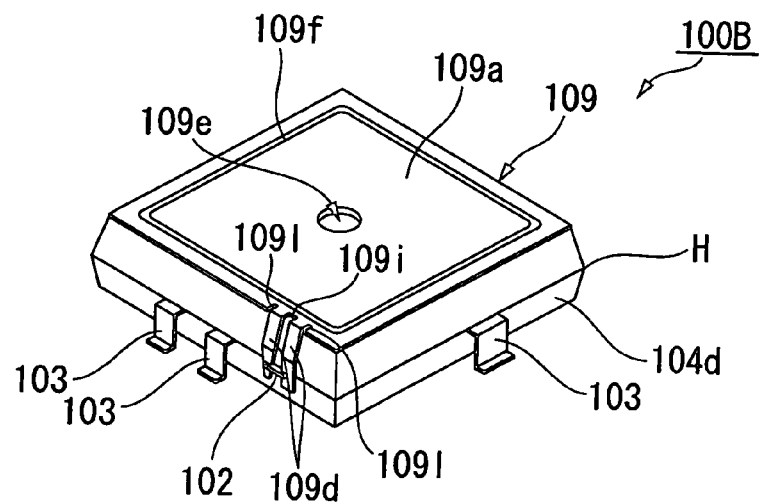
FIG. 24 is a perspective view showing a semiconductor device in accordance with a second variation of the second embodiment.
Figure 25:
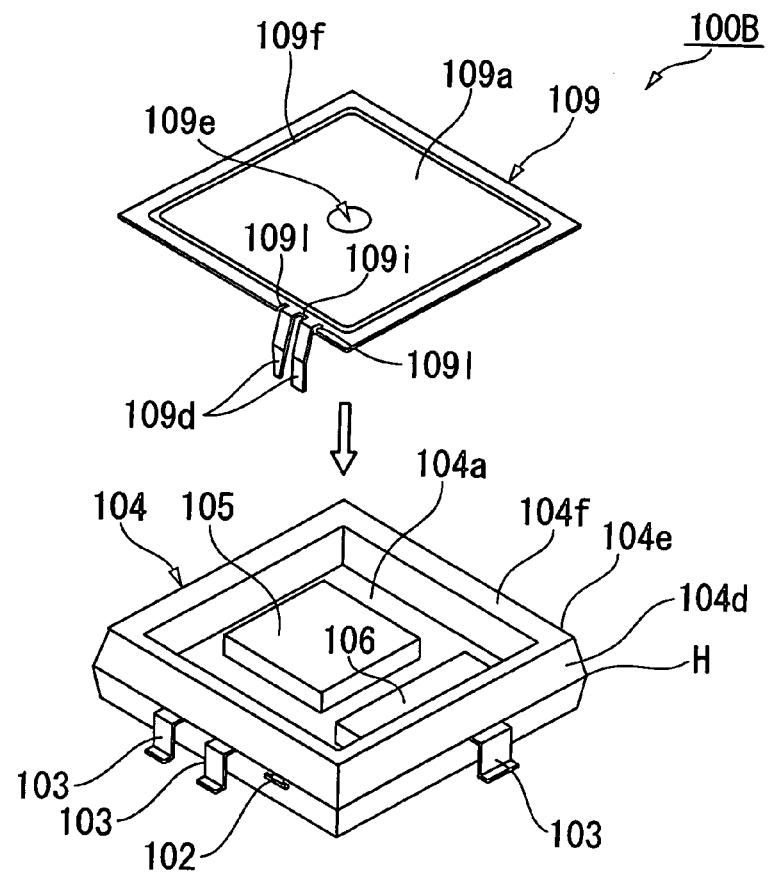
FIG. 25 is an exploded perspective view showing that the semiconductor device of the second variation is manufactured by assembling together a cover member and a substrate sealed with a resin layer.

(3) The cover member 109 does not necessarily have the side wall 109b. That is, the semiconductor device 100B can be further modified as shown in FIGS. 24 and 25, which show a second variation of the second embodiment and in which the cover member 109 does not have the side wall 109b. The elimination of the side wall 109b may cause a small reduction in the electromagnetic shield effect; however, it is possible to retain other effects demonstrated by the semiconductor device 100B.

Figure 26:
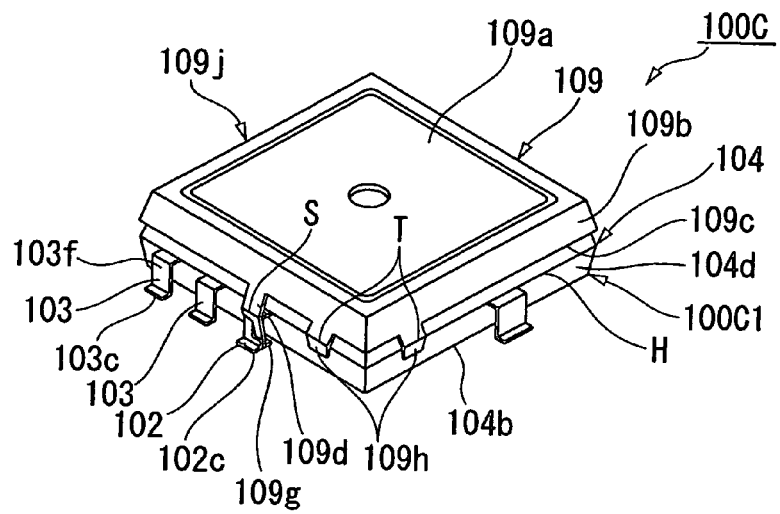
FIG. 26 is a perspective view showing a semiconductor device in accordance with a third variation of the second embodiment.

Next, a third variation of the second embodiment will be described with reference to FIGS. 26 and 27, which show a semiconductor device 100C. Similar to the semiconductor device 100B, the semiconductor device 100C of the third variation is of a QFP type, which is manufactured using a lead frame. Herein, parts identical to those used in the second embodiment and its foregoing variations are designated by the same reference numerals; hence, the description thereof will be omitted as necessary.

Figure 27:
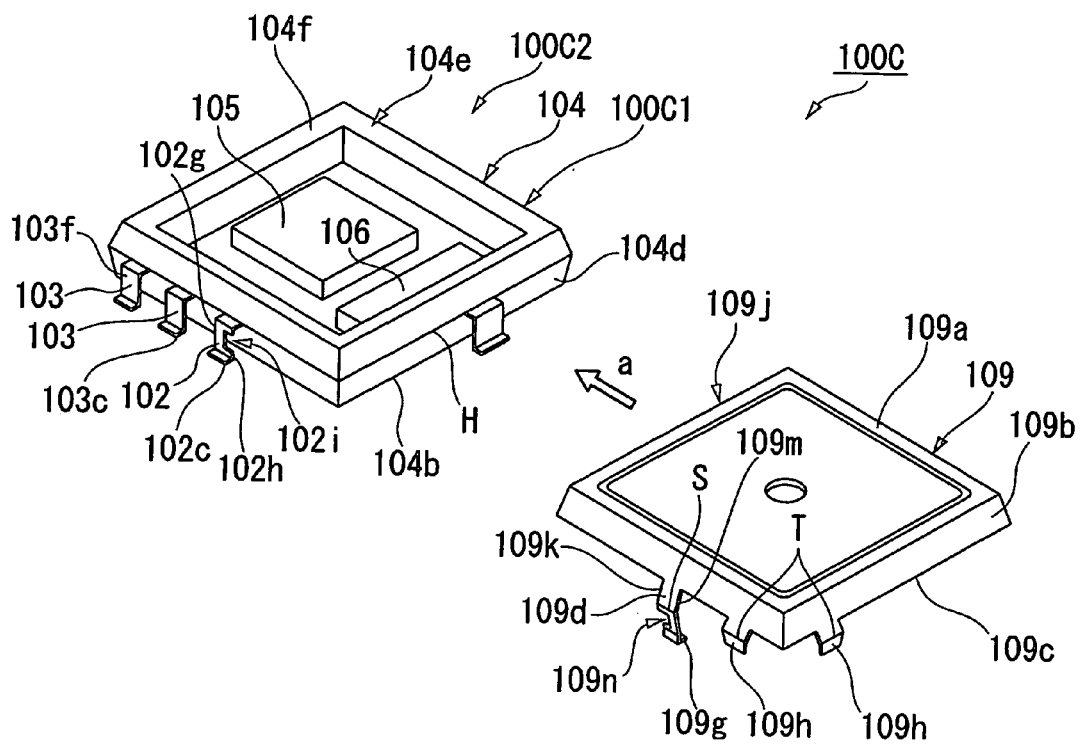
FIG. 27 is an exploded perspective view showing that the semiconductor device of the third variation is manufactured by assembling together a cover member and a substrate sealed with a resin layer.

Compared with the semiconductor device 100B of the first variation in which the upper portion of the resin layer 104 is covered with the cover member 109 so that the external terminal 102 is connected to the shield terminals 109d, the semiconductor device 100C of the third variation is designed such that, as shown in FIG. 27, the cover member 109 is moved horizontally (i.e., in a direction "a") and is then assembled with the resin layer 104 so that the external terminal 102 is connected to the electromagnetic shield terminal 109*d*. For this reason, the cover member 109 and the external terminal 102 are modified in shape and constitution in the semiconductor device 100C compared with the semiconductor device 100B. Similar to the second embodiment and its first variation, a substrate 100C1 used in the semiconductor device 100C is constituted by the stage 101, the external terminals 102, the leads 103, and the resin layer 104. For the sake of convenience, the main part of the semiconductor device 100C excluding the cover member 109 (i.e., the substrate 100C1 equipped with and electrically connected with the semiconductor sensor chip 105 and the amplifier 106) will be referred to as a main body 100C2.

Similar to the first variation, the cover member 109 is basically constituted by the top portion 109*a*, the side wall 109*b*, and the electromagnetic shield terminal 109*d*. Herein, the top portion 109*a* having a rectangular shape is partially modified such that the side wall 109*b* is arranged on only three sides within the four sides; hence, the side wall 109*b* is not formed on one side, which is an opening 109*j*.

The side wall 109*b* has three engagement portions 109*h*, which extend downwardly from the lower end 109*c*, on three sides respectively. As shown in FIG. 26, after the cover member 109 is sealed with the resin layer 104, the lower end of the engagement portion 109*h* is positioned so as to be higher than the lower surface 104*b* of the resin layer 104, and the lower portion of the engagement portion 109*h* is bent at the bent point H along the lower portion of the side 104*d* of the resin layer 104; that is, the engagement portion 109*h* is formed so as to engage with the bent shape of the side 104*d* of the resin layer 104. In other words, the engagement portion 104*h*, whose upper end is connected to the lower end 109*c* of the side wall 109*b*, is formed in a slightly bent shape that is bent at a bent point T matching the bent point H of the side 104*d* of the resin layer 104. Specifically, the upper portion of the engagement portion 109*h*, which ranges from the upper end to the bent point T, is expanded outwardly in a direction toward the bent point T, while the lower portion of the engagement portion 109*h*, which ranges from the bent point T to the lower end, is contracted inwardly in a direction toward the lower end.

The electromagnetic shield terminal 109*d* of the cover member 109 extends downwardly such that the upper end thereof is connected to the lower end 109*c* of the side wall 109*b* at a position above the external terminal 102. The upper portion of the electromagnetic shield terminal 109*d* is shaped so as to match the side wall 109*b*, while the lower portion is bent inwardly in a direction toward the lower end thereof, that is, the electromagnetic shield terminal 109*d* is formed in a slightly bent shape that is bent at a bent point S. In addition, the lower end of the electromagnetic shield terminal 109*d* is further bent toward the side 104*d* of the resin layer 104, which is assembled with the cover member 109. The bent lower end of the electromagnetic shield terminal 109*d* has a lower surface 109*g*, which is positioned substantially in the same plane as the lower surface 103*c* of the lead 103. A pair of side ends 9*k* and 9*m* are formed along the lower portion of the electromagnetic shield terminal 109*d*, wherein the side end 109*k*, which is positioned close to the opening 109*j* of the cover member 109, has an engagement recess 109*n*, which is recessed toward the other side end 109*m*. The engagement recess 109*n* is formed in a U-shape whose opening is directed leftward when it is viewed from the exterior of the electromagnetic shield terminal 109*d*.

Similar to the lead 103, the prescribed portion of the external terminal 102, which extends externally of the resin layer 104, is bent downwardly so as to form a hung-down portion. The lower end of the hung-down portion of the external terminal 102 has a lower surface 102*c*, which is positioned substantially in the same plane as the lower surface 103*c* of the lead 103 (substantially matching the lower surface 109*g* of the electromagnetic shield terminal 109*d* of the cover member 109, which is assembled with the substrate 100C1 sealed with the resin layer 104). A pair of side ends 102*g* and 102*h* are formed in the hung-down portion of the external terminal 102, which extends externally of the resin layer 104, wherein an engagement recess 102*i*, which is recessed toward the side end 102*g* positioned adjacent to the lead 103, is formed in the side end 102*h*. The engagement recess 102*i* is formed in a U-shape whose opening is directed rightward when it is viewed from the exterior of the external terminal 102.

Next, a manufacturing method of the semiconductor device 100C will be described below. The following description refers to a method for the installation of the cover member 109 and a method for electrically connecting together the cover member 109 and the external terminal 102 (and the stage 101).

The semiconductor device 100C is characterized in that the cover member 109 has the top portion 109*a* and the side wall 109*b* as well as the opening 109*j*, by which it is introduced into the main body 100C2. Specifically, the opening 109*j* of the cover member 109 is directed toward the main body 100C2 in such a way that the prescribed portion of the side wall 109*b* arranging the electromagnetic shield terminal 109*d* substantially matches in positioning with the prescribed side 104*d* of the resin layer 104 arranging the external terminal 102 while the lower surface of the top portion 109*a* horizontally matches in positioning with the top portion 104*f* of the projection 104*e* of the resin layer 104; then, the cover member 109 is horizontally moved into and engages with the main body 100C2 via the opening 109*j*. At this time, the cover member 109 is moved horizontally so as to cover the upper portion of the main body 100C2 while the lower surface of the top portion 109*a* comes in contact with and slides along the top portion 104*f* of the projection 104*e* of the resin layer 104. The engagement portions 109*h* having the bent shapes are formed on the opposite sides of the side wall 109*b* along the moving direction "a" of the cover member 109 and engage with the resin layer 104 such that the bent point T thereof substantially matches the bent point H while the interior surfaces thereof slide in contact with the corresponding sides 104*d* of the resin layer 104. That is, the cover member 109 is moved so as to slide along and gradually engages with the resin layer 104 by means of the engagement portions 109*h* as the bent point T matches the bent point H. Then, when the engagement portion 109*h*, which is formed in the back portion of the side wall 109*b* positioned backward of the cover member 109, comes in contact with and engages with the corresponding side 104*d* of the resin layer 104, the cover member 109 completely engages with the main body 100C2 at the prescribed position.

Due to the engagement between the engagement recess 109*n* of the electromagnetic shield terminal 109*d* and the engagement recess 102*i* of the external terminal 102, which is established at completion of the installation of the cover member 109 assembled with the main body 100C2, the upper portion of the electromagnetic shield terminal 109*d* (which is above the engagement recess 109*n*) matches the upper exterior side of the external terminal 102 while the lower portion of the electromagnetic shield terminal 109*d* (which is below the engagement recess 109*n*) matches the lower interior side of the external terminal 102. That is, the electromagnetic shield terminal 109*d* and the external terminal 102 cross each other by means of the engagement recess 109n and the engagement recess 102i, wherein they partially overlap each other when viewed from the exterior of the electromagnetic shield member 109d. Specifically, the side end 109k of the engagement recess 109n of the electromagnetic shield terminal 109d crosses and comes in contact with the side end 102g of the engagement recess 102i of the external terminal 102, whereby the electromagnetic shield terminal 109d is tightly connected with the external terminal 102. In this state, the lower exterior portion of the electromagnetic shield terminal 109d (which is below the engagement recess 109n) comes in two-dimensional contact with the interior surface of the external terminal 102, while the lower surface 109g is positioned substantially in the same plane as the lower surface 102c of the external terminal 102. This reliably establishes fine installation of the cover member 109 and electrical connection between the electromagnetic shield terminal 109d and the external terminal 102. Herein, the electrical connection between the electromagnetic shield terminal 109d and the external terminal 102 can be enhanced by way of soldering for example.

At completion of the installation of the cover member 109 assembled with the main body 100C2, the engagement portion 109h is brought into two-dimensional contact with and engaged with the upper portion and lower portion of the side 104d of the resin layer 104, which are split at the bent point H, respectively. This holds the cover member 109 by means of the engagement portion 109h and also establishes the connected state between the electromagnetic shield terminal 109d and the external terminal 102. In this state, the lower surface of the top portion 109a of the cover member 109 is held and tightly attached to the top portion 104f of the projection 104e of the resin layer 104. That is, the semiconductor device 100C does not necessarily use the adhesive realizing the adhesion between the cover member 109 and the resin layer 104.

Similar to the second embodiment and its variations, the semiconductor device 100C of the third variation using the specifically designed cover member 109 is mounted on the printed-circuit board of a portable telephone, wherein the lower surfaces 103c of the hung-down portions 103f of the leads 103 are brought into contact with and bonded to the contact terminals of the printed-circuit board by way of soldering.

In addition, both of the lower surface 102c of the external terminal 102 and the lower surface 109g of the electromagnetic shield terminal 109d come in contact with the connection terminals of the printed-circuit board; and the leads 103 are simultaneously soldered to the connection terminals of the printed-circuit board as described above. Thus, it is possible to form the electromagnetic shield embracing the semiconductor sensor chip 105 by means of the cover member 109 and the stage 101, which are electrically connected together, via the external terminals 102.

In the semiconductor device 100C, it is possible to establish connection between the electromagnetic shield terminal 109d and the external terminal 102 with a simple operation in which the cover member 109 is introduced into the main body 100C2 via the opening 109j as it moves horizontally. With a simple operation in which the semiconductor device 100C is mounted on the printed-circuit board, it is possible to reliably form the electromagnetic shield embracing the semiconductor sensor chip 105. Hence, it is possible to reduce the workload for the installation of the cover member 109; and it is therefor possible to reduce the cost for manufacturing the semiconductor device 100C.

Since the cover member 109 is reliably held by means of the engagement portion 109h in such a way that the lower surface of the top portion 109a of the cover member 109 comes in tight contact with the top portion 104f of the projection 104e of the resin layer 104, it is unnecessary to use the adhesive realizing the fixation between the cover member 109 and the resin layer 104. In this point, it is possible to reduce the workload for the installation of the cover member 109; and it is therefore possible to reduce the cost for manufacturing the semiconductor device 100C.

The semiconductor device 100C of the third variation can be further modified or changed in design. For example, the electromagnetic shield terminal 109d does not necessarily have the lower surface 109g (which is formed in the lower end thereof below the engagement recess 109n), which is positioned substantially in the same plane as the lower surface 102c of the lower end of the external terminal 102 (which is below the engagement recess 102i). It is simply required that the electromagnetic shield terminal 109d be designed to realize installation of the cover member 109 and to establish electrical connection with the external terminal 102; hence, the lower surface 109g is not necessarily formed in the lower end of the electromagnetic shield terminal 109d.

3. Third Embodiment

Next, a third embodiment of the present invention will be described in detail with reference to FIGS. 28 to 30. The third embodiment is directed to a semiconductor device of an SOP (Small Outline Package) type, which is a surface mount type package manufactured using a lead frame.

Figure 28:
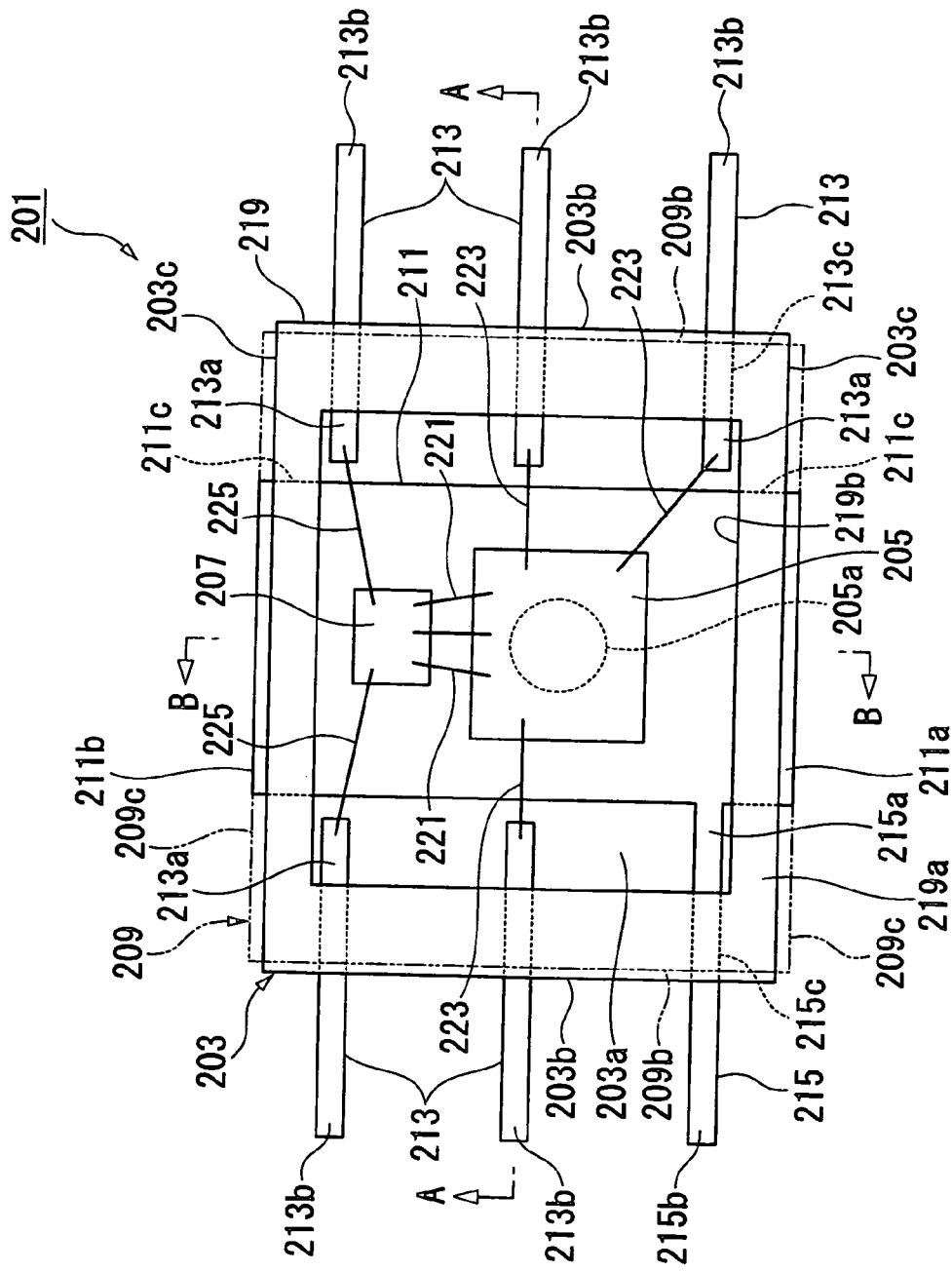
FIG. 28 is a plan view showing a semiconductor device in accordance with a third embodiment of the present invention.
Figure 29:
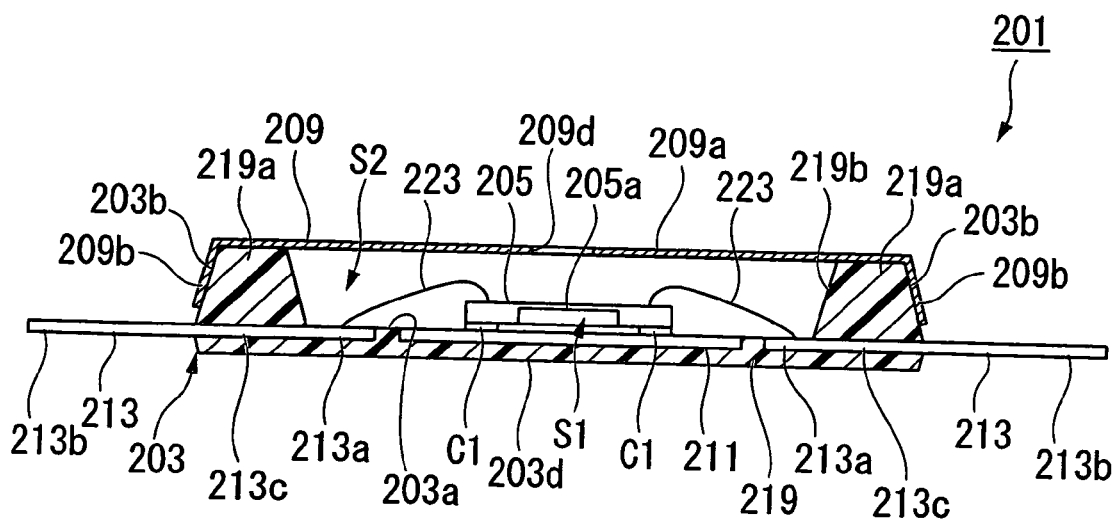
FIG. 29 is a cross-sectional view taken along line A-A in FIG. 28.
Figure 30:
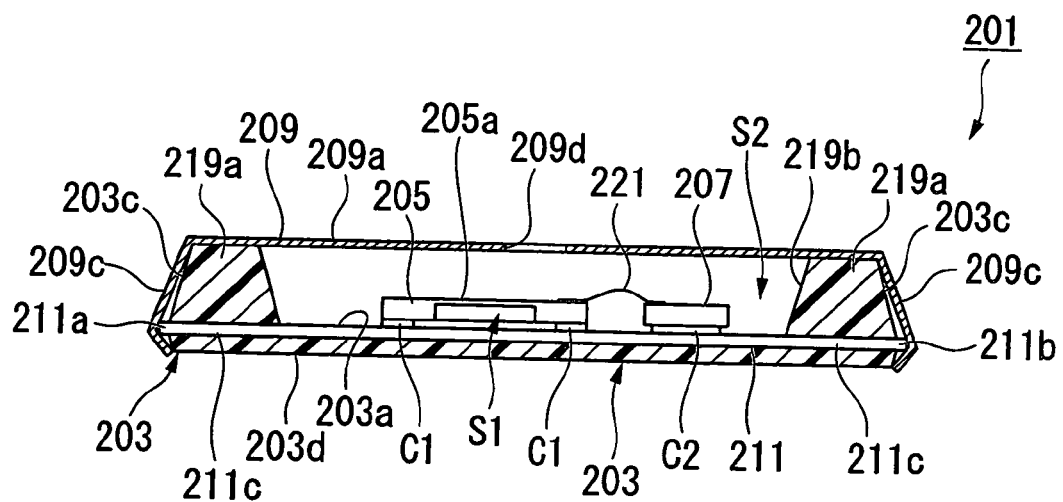
FIG. 30 is a cross-sectional view taken along line B-B in FIG. 28.

As shown in FIGS. 28 to 30, a semiconductor device 201 includes a substrate 203 having a rectangular shape; a semiconductor sensor chip 205 and an amplifier 207, which are attached onto an upper surface 203a of the substrate 203; a cover member 209 for covering the upper portion of the substrate 203 including the semiconductor sensor chip 205 and the amplifier 207; and a stage 211 having a flat-plate-like shape, which is positioned below the semiconductor sensor chip 205 and the amplifier 207 and which forms the upper surface 203a of the substrate 203.

A plurality of leads 213 are formed on both sides of the stage 211, and a lead 215 is formed on the prescribed side of the stage 211. The substrate 203 has the leads 213 and the lead 215 as well as a molded resin (or a resin layer) 219 for sealing and fixing the leads 213 and the lead 215 in position.

Each of the leads 213 and the lead 215 is formed in a band-like shape. Specifically, three leads 213 (or two leads 213 and one lead 215) are adjacently arranged on one side with the equal spacing therebetween along an arrangement direction of the semiconductor sensor chip 205 and the amplifier 207. First ends 213a of the leads 213 and a first end 215a of the lead 215 are positioned adjacent to the stage 211 so as to form the upper surface 203a of the substrate 203 together with the molded resin 219. Second ends 213b of the leads 213 and a second end 215b of the lead 215 are elongated so as to project externally of prescribed sides 203b of the substrate 203. The leads 213 and 215 serve as external terminals, which are soldered to connection terminals of a printed-circuit board (not shown), when the semiconductor device 201 is mounted on the printed-circuit board.

Specifically, there are provided five chip connection leads 213, which are isolated from the stage 211, and a single grounded lead 215 (or a single shield terminal 215), which is formed integrally together with the stage 211. The chip connection leads 213 are used for electrically connecting together the semiconductor sensor chip 205 and the amplifier 207. The grounded lead 215 is connected to a ground pattern of the printed-circuit board, on which the semiconductor device 201 is mounted, and is positioned adjacent to one of the chip connection leads 213.

The stage 211 is composed of a conductive material such as copper and is formed so as to entirely cover the lower portion of the substrate 203 including the semiconductor sensor chip 205 and the amplifier 207. That is, the stage 211 is formed so as to cover a specific area of the substrate 203 at least including the semiconductor sensor chip 205, the amplifier 207, the wires 221 establishing mutual electrical connection therebetween; however, it can be formed so as to entirely cover the upper surface 203a of the substrate 203.

The stage 211 extends so as to slightly project externally of sides 203c, which are perpendicular to the foregoing sides 203b of the substrate 203 arranging the leads 213 and 215, thus forming extended portions 211a and 211b. No lead is formed on the sides 203c of the substrate 203, from which the extended portions 211a and 211b slightly project. Incidentally, the projected length adapted to the extended portions 211a and 211b is 1 mm or less.

All of the stage 211, the chip connection leads 213, and the grounded lead 215 are formed using the same lead frame.

The molded resin 219 having a rectangular shape in plan view is shaped so as to form the upper surface 203a and a lower surface 203b of the substrate 203. In the molded resin 219, a ring-shaped projection 219a is formed so as to project upwardly from the periphery of the upper surface 203a of the substrate 203.

The ring-shaped projection 219a has a trapezoidal shape in cross section (see FIGS. 29 and 30), in which the width thereof is gradually reduced in an upward direction. An internal recess 219b is defined by the ring-shaped projection 219a and is formed in connection with the upper surface 203a of the molded resin 219. An intermediate portion 211c of the stage 211, intermediate portions 213c of the chip connection leads 213, and an intermediate portion of the grounded lead 215 are embedded inside of the ring-shaped projection 219a. Incidentally, the intermediate portion 211c of the stage 211 is positioned between the prescribed area arranging the semiconductor sensor chip 205 and the amplifier 207 and the extended portions 211a and 211b.

The semiconductor sensor chip 205 serves as a sound pressure sensor chip for converting sound into electric signals. Specifically, the semiconductor sensor chip 205 has a diaphragm 205a that vibrates in response to variations of sound pressure corresponding to sound generated in the external space existing externally of the semiconductor device 201. The diaphragm 205a is formed so as to vibrate in the thickness direction of the semiconductor sensor chip 205. When the diaphragm 205a vibrates in response to sound pressure applied thereto, the semiconductor sensor chip 205 detects the deformation (or displacement) of the diaphragm 205a as variations of electrostatic capacitance or variations of electric resistance, based on which electric signals are output therefrom.

For example, when electric signals are produced based on variations of electrostatic capacitance, the semiconductor sensor chip 205 serves as a capacitor microphone having a fixed electrode (not shown), which is arranged opposite the diaphragm 205a. Herein, variations of distance between the diaphragm 205a and the fixed electrode are translated into variations of electrostatic capacitance, based on which the semiconductor sensor chip 205 outputs electric signals.

When electric signals are produced based on variations of electric resistance, the semiconductor sensor chip 205 translates the deformation of the diaphragm 205a into variations of electric signals, based on which it outputs electric signals.

The semiconductor sensor chip 205 is adhered onto the stage 211 forming the upper surface 203a of the substrate 203 via an adhesive paste C1 composed of an insulating material such that the diaphragm 205a is positioned opposite the upper surface 203a of the substrate 203. That is, a cavity S1 is formed between the diaphragm 205a of the semiconductor sensor chip 205 and the upper surface 203a of the substrate 203. The cavity S1 is closed in an airtight manner and is isolated from the external space thereof when the semiconductor sensor chip 205 is fixed onto the upper surface 203a of the substrate 203. The semiconductor sensor chip 205 is electrically connected to the amplifier 207 and the first ends 213a of the leads 213 via wires 221 and 223.

The amplifier 207 amplifies electric signals output from the semiconductor sensor chip 205. Similar to the semiconductor sensor chip 205, the amplifier 207 is adhered onto the upper surface 203a of the molded resin 219 via an adhesive paste C2. The amplifier 207 is electrically connected to the first ends 213a of the leads 213 via wires 225.

The cover member 209 is composed of a conductive material such as copper and is constituted by a top portion 209a having a rectangular shape, which is distanced from and positioned opposite the upper surface 203a of the substrate 203, and two pairs of side walls 209b and 209c, which are connected to and hung down from side ends of the top portion 209a. The cover member 209 as a whole is formed in a dish-like shape whose opening is directed downward.

The lower surface of the top portion 209a is shaped so as to come in contact with the top portion of the ring-shaped projection 219a of the molded resin 219; hence, it covers the internal recess 219b of the molded resin 219 so as to form a hollow space S2 embracing the semiconductor sensor chip 205 and the amplifier 207 therein. An opening hole 209d, which runs through the cover member 209 in its thickness direction, is formed approximately at the center of the top portion 209a. The hollow space S2 communicates with the external space, which exists externally of the semiconductor device 201, via the opening hole 209d.

The side walls 209b and 209c lying on both sides of the stage 211 are formed surrounding the periphery of the top portion 209a so as to cover the ring-shaped projection 219a along the sides 203b and 203c of the molded resin 219. That is, the paired side walls 209b adhere to the sides 203b of the molded resin 219, from which the leads 213 and 215 project outwardly, via the adhesive (not shown).

The paired side walls 209c lying on both sides along the arrangement direction of the semiconductor sensor chip 205 and the amplifier 207 are positioned in connection with the sides 203c of the molded resin 219, from which the extended portions 211a and 211b of the stage 211 slightly project outwardly, and are thus engaged with the extended portions 211a and 211b. That is, the tip ends of the side walls 209c are bent inwardly (see FIG. 30), so that the bent portions thereof hold the extended portions 211a and 211b of the stage 211. This brings the side walls 209c in contact with the extended portions 211a and 211b, thus establishing electrical connection between the cover member 209 and the stage 211.

Next, a manufacturing method of the semiconductor device 201 will be described below.

In the manufacturing of the semiconductor device 201, a thin metal plate composed of copper is subjected to press working or etching so as to form a lead frame, in which the stage 211, the chip connection leads 213, and the grounded lead 215 are integrally connected together. Specifically, the chip connection leads 213 and the grounded leads 215 are interconnected at the second ends 213 and 215 thereof.

Next, a metal mold (not shown) is used to form the molded resin 219, which seals the lead frame; then, the chip connection leads 213 and the grounded lead 215 are respectively separated from each other, thus forming the substrate 203.

After completion of the formation of the substrate 203, the semiconductor sensor chip 205 and the amplifier 207 are adhered onto the stage 211 forming the upper surface 203a of the substrate 203 via the adhesive pastes C1 and C2. Then, they are subjected to wire bonding so as to establish electrical connection therebetween via the wires 221. In addition, the semiconductor sensor chip 205, the amplifier 207, and the first ends 213a of the chip connection leads 213 are electrically connected together via the wires 223 and 225.

Lastly, the cover member 209 is attached to the substrate 203 such that the top portion 209a covers the internal recess 219b of the molded resin 219, thus completing the manufacturing of the semiconductor device 201. The fixation of the cover member 209 is realized by the adhesion between the side walls 209b and the sides 203b of the molded resin 203 and the engagement between the side walls 209c and the sides 203c of the molded resin 219.

When the semiconductor device 201 is mounted on the printed-circuit board (not shown), the first ends 213a of the chip connection leads 213 and the first ends 215a of the grounded leads 215 are electrically connected to the connection terminals of the printed-circuit board by way of soldering.

As described above, the semiconductor sensor chip 205 and the amplifier 207 are covered with the top portion 209a of the cover member 209 and the stage 211 in the thickness direction of the substrate 203 and are also surrounded by the side walls 209b and 209c of the cover member 209 along the sides 203b and 203c of the substrate 203. In addition, the cover member 209 is brought into contact with and electrically connected to the stage 211, which is integrally connected to the grounded lead 215.

Therefore, when the semiconductor device 201 is mounted on the printed-circuit board (not shown), the grounded lead 215 is simply brought into contact with and electrically connected to the ground pattern of the printed-circuit board, so that the cover member 209 and the stage 211 embracing the semiconductor sensor chip 205 and the amplifier 207 are electrically connected to the ground pattern of the printed-circuit board; hence, it is possible to form an electromagnetic shield for blocking electromagnetic noise from being transmitted into the hollow space S2.

Since the electromagnetic shield is formed using the cover member 209 and the stage 211 so as to embrace the semiconductor sensor chip 205 and the amplifier 207, it is possible to reduce a specific part of the hollow space S2 that is not completely covered with the cover member 209 and the stage 211, i.e., an area that may allow electromagnetic noise to be transmitted into the hollow space S2. Thus, it is possible to improve the shield performance against the electromagnetic noise with ease.

Specifically, none of the leads 213 and 215 are arranged on the sides 203c of the substrate 203 forming the contact area in which the side walls 209c of the cover member 209 come in contact with the stage 211; that is, the present embodiment can enlarge the contact area. In other words, it is possible to further enlarge the area for embracing the semiconductor sensor chip 205 and the amplifier 207 by means of the cover member 209 and the stage 211; that is, it is possible to reduce the area which allows electromagnetic noise from being transmitted into the hollow space S2; hence, it is possible to noticeably improve the shield performance against the electromagnetic noise. The improvement of the shield performance may be effective when the semiconductor sensor chip 205 serves as a capacitor microphone, which may be easily affected by electromagnetic induction because of high impedance thereof.

The side walls 209b and 209c of the cover member 209 are adjacently arranged so as to entirely cover the sides 203b and 203c of the substrate 203; hence, when the cover member 209 is attached to the substrate 203, it is possible to easily determine the positioning of the cover member 209 relative to the substrate 203. In addition, the side walls 209c of the cover member 209 are brought into contact with the extended portions 211a an 211b of the stage 211 along the sides 203c of the substrate 203; hence, with a simple operation in which the cover member 209 is attached to the substrate 203, it is possible to easily form the electromagnetic shield.

The adhesive for adhering the cover member 209 to the substrate 203 is simply applied to the sides 203b of the substrate 203. In other words, the adhesive is not applied to the upper surface of the substrate 203; hence, it is possible to reliably prevent the adhesive from leaking into the hollow space S2. In addition, it is possible to prevent the volume and shape of the hollow space S2 from being unexpectedly changed; and it is possible to prevent an unexpected change of the volume and shape of the hollow space S2 from badly affecting the sound characteristic of the diaphragm 205a of the semiconductor sensor chip 205. Furthermore, the upper surface 203a of the substrate 203 for arranging the semiconductor sensor chip 205 and the amplifier 207 thereon is formed using the stage 211 and is thus easily formed in a planar shape; hence, it is possible to easily attach the semiconductor sensor chip 205 and the amplifier 207 to the planar upper surface 203a of the substrate 203.

The third embodiment can be modified in a variety of ways, which will be described below.

(1) The fixation of the cover member 209 attached to the substrate 203 is not necessarily realized by way of both of the adhesion between the side walls 209b of the cover member 209 and the sides 203b of the molded resin 219 and the engagement between the side walls 209c and the sides 203c; however, this is not a restriction. That is, the fixation can be realized by either the adhesion or the engagement.

(2) The stage 211 is not necessarily positioned so as to form the upper surface 203a of the substrate 203. The present embodiment simply requires that the stage 211 be positioned below the semiconductor sensor chip 205 and the amplifier 207. That is, the stage 211 can be completely embedded inside of the molded resin 219.

(3) The leads 213 and 215 do not necessarily project externally of the sides 203b of the substrate 203. Since they are required to be exposed externally of the substrate 203, they can be positioned so as to be exposed externally of the lower surface 203d of the substrate 203, for example.

Figure 31:
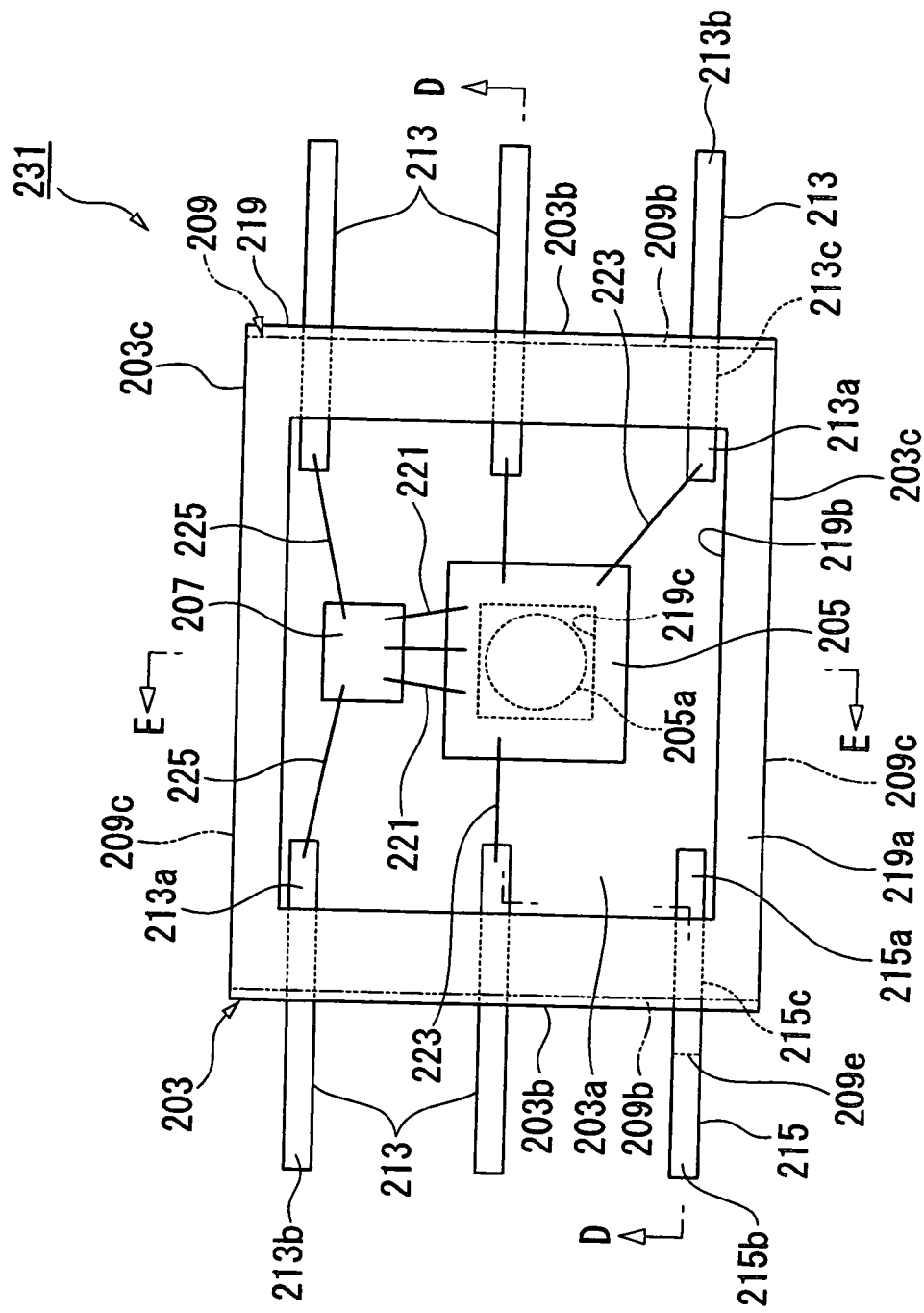
FIG. 31 is a plan view showing a semiconductor device in accordance with a first variation of the third embodiment.

Next, a first variation of the third embodiment will be described in detail with reference to FIGS. 31 to 33. A semiconductor device 231 of the first variation differs from the semiconductor device 201 in that the lower portion of the semiconductor sensor chip 205 is not covered with the stage 211 but is covered with another member. For the sake of convenience, the first variation will be simply described with respect to the aforementioned difference, wherein parts of the semiconductor device 231 identical to those of the semiconductor device 201 are designated by the same reference numerals; hence, the description thereof will be omitted as necessary.

Instead of the stage 211, a lower shield member 233 is positioned below the semiconductor sensor chip 205 and the amplifier 207 in the semiconductor device 231 shown in FIGS. 31 to 33. The lower shield member 233 is composed of a conductive material such as copper and is constituted by a flat portion 233a having a rectangular shape, which is positioned so as to entirely cover the lower surface 203d of the substrate 203, and side walls 233b and 233c, which are connected with side ends of the flat portion 233a and which project upwardly in the thickness direction of the substrate 203. That is, the lower shield member 233 as a whole is formed in a dish-like shape whose opening is directed upwardly.

As described above, the flat portion 233a of the lower shield member 233 is positioned so as to entirely cover the lower surface 203d of the substrate 203 below the semiconductor sensor chip 205 and the amplifier 207. Herein, it is required that the flat portion 233a of the lower shield member 233 is formed so as to entirely cover at least the prescribed area of the substrate 203 including the semiconductor sensor chip 205, the amplifier 207, and the wires 221 establishing electrical connection therebetween; alternatively, the flat portion 233a can be formed to suit the upper surface 203a of the substrate 203.

The side walls 233b and 233c of the lower shield member 233 adhere to the sides 203b and 203c of the substrate 203 via the adhesive (not shown), whereby the lower shield member 233 is attached to the substrate 203. The upper ends of the side walls 233c attached to the sides 203c of the substrate 203, in which none of the leads 213 and 215 are arranged, are brought into contact with the lower ends of the side walls 209c of the cover member 209, whereby the lower shield member 233 is electrically connected to the cover member 209 (see FIG. 33).

Figure 32:
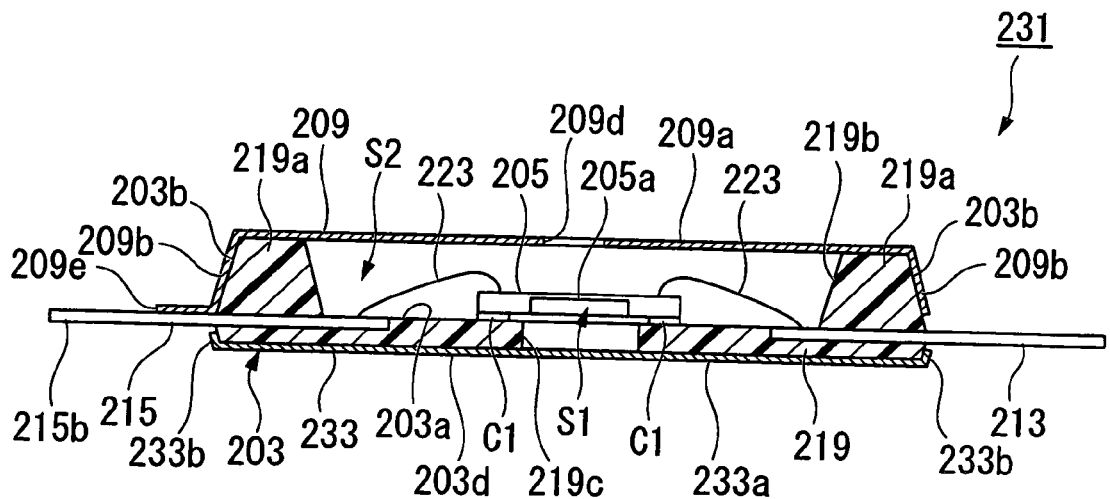
FIG. 32 is a cross-sectional view taken along line D-D in FIG. 31.
Figure 33:
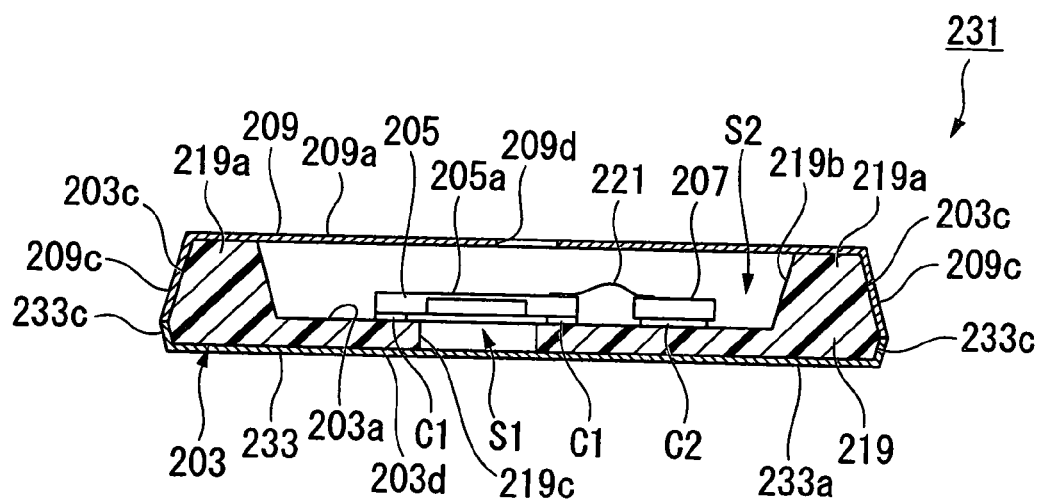
FIG. 33 is a cross-sectional view taken along line E-E in FIG. 31.

A bent terminal 209e is formed by bending the lower end of the side wall 209b of the cover member 209 outwardly of the substrate 203 (see FIG. 32). When the cover member 209 is attached to the substrate 203, the bent terminal 209e overlaps with the grounded lead 215 in the thickness direction of the substrate 203, whereby the cover member 209 is electrically connected to the grounded lead 215. Incidentally, the bent terminal 209e joins the grounded lead 215 by way of soldering, for example.

A hole 219c, which is recessed downwardly and runs through from the upper surface 203a to the lower surface 203d, is formed approximately at the center of the molded resin 219; hence, the semiconductor sensor chip 205 is adhered to the upper surface 203a so as to cover the hole 219c. In this state, the diaphragm 205a of the semiconductor sensor chip 205 is positioned opposite the flat portion 233a of the lower shield member 233 via the hole 219c. That is, a cavity S1 is formed by the semiconductor sensor chip 205, the hole 219c, and the flat portion 233a of the lower shield member 233. The cavity S1 is closed in an airtight manner.

Since the semiconductor sensor chip 205 and the amplifier 207 are fixed onto the upper surface 203a of the substrate 203 sealed with the molded resin 219, the semiconductor device 231 does not need the adhesive pastes C1 and C2.

The semiconductor device 231 slightly differs from the semiconductor device 201 in such a way that the semiconductor sensor chip 205 and the amplifier 207 are vertically covered by the cover member 209 and the lower shield member 233 in the thickness direction of the substrate 203 and are horizontally surrounded by the sides 203b and 203c of the substrate 203. This makes it possible to reduce a specific part of the hollow space S2, which is not covered with the cover member 209 and the lower shield member 233, i.e., an area allowing electromagnetic noise from being transmitted into the hollow space S2. Thus, it is possible to improve the shield performance of the electromagnetic shield with ease.

Specifically, none of the leads 213 and 215 are arranged in the sides 203c of the substrate 203, by which the cover member 209 and the lower shield member 233 come in contact with each other and which form a relatively large contact area between the cover member 209 and the lower shield member 233. Thus, it is possible to enlarge the overall space, which is defined by the cover member 209 and the stage 211 so as to embrace the semiconductor sensor chip 205 and the amplifier 207 therein; and it is possible to remarkably reduce the area that allows electromagnetic noise from being transmitted into the hollow space S2.

In addition, the side walls 233b and 233c of the lower shield member 233 are positioned adjacent to the sides 203b and 203c of the substrate 203; hence, it is possible to establish positioning of the lower shield member 233 relative to the substrate 203 with ease when the lower shield member 233 is attached to the substrate 203.

With a simple operation in which the cover member 209 and the lower shield member 233 are attached to the substrate 203, it is possible to bring the side walls 209c and the side walls 233c into contact with the sides 203c of the substrate 203; hence, it is possible to easily form the electromagnetic shield.

Arranging the lower shield member 233 below the lower surface 203d of the substrate 203 allows the hole 219c to run through from the upper surface 203a to the lower surface 203d of the substrate 203; hence, it is possible to easily increase the volume of the cavity S1. When the cavity S1 has a small volume, an air spring constant of the cavity S1 becomes large so that the diaphragm 205a may be difficult to vibrate, whereby the displacement of the diaphragm 205a becomes small so that variations of sound pressure cannot be detected with high accuracy. In contrast, the semiconductor device 231 introduces the lower shield member 233 so as to increase the volume of the cavity S1.

It is necessary that the cavity S1 be closed in an airtight manner against the external space of the semiconductor device 231. In that sense, the semiconductor device 231 is designed such that the lower surface 203d of the substrate 203 is covered with the lower shield member 233; hence, even when the hole 219c runs through from the upper surface 203a to the lower surface 203d of the substrate 203, it is possible to prevent the hole 219c from communicating with the external space of the semiconductor device 231.

The lower shield 233 is fixed in position by adhering the side walls 233b and 233c to the sides 203b and 203c of the substrate 203; but this is not a restriction. For example, the lower portion of the substrate 203 can be simply held between the side walls 233b and 233c of the lower shield member 233. Alternatively, the lower shield member 233 can be fixed in position by adhering the flat portion 233a to the lower surface 203d of the substrate 203.

When the lower shield member 233 is adhered to the substrate 203, the adhesive is arranged between the lower surface 203d of the substrate 203 and the lower shield member 233. In other words, it is possible to form a small gap between the lower surface 203d of the substrate 203 and the lower shield member 233 by appropriately controlling the amount of the adhesive and/or the adhesion area. This may slightly reduce the airtight property of the cavity S1 so as to make the internal pressure of the cavity S1 substantially match the atmospheric pressure. In this case, the internal pressure of the cavity S1 may change in response to variations of atmospheric pressure and/or variations of temperature in the surrounding of the semiconductor device 231, whereby the diaphragm 205a may be difficult to deform based on these variations.

The gap may causes air flow based on variations of static pressure between the cavity S1 and the external space of the semiconductor device 231; hence, the gap is controlled in dimensions so as to block air from being transmitted due to variations of air pressure applied to the diaphragm 205a.

The static pressure is regarded as the air pressure of the cavity S1 or the air pressure of the external space in the static state causing no air flow. Variations of static pressure are relatively small per unit time. For example, variations of static pressure occur in the cavity S1 when the cavity S1 is heated or cooled or when outgas occurs due to the reflow caused by the adhesion of the semiconductor sensor chip 205 attached to the substrate 203. In addition, variations of static pressure may further include static variations of the atmospheric air in the external space due to altitude. In contrast, variations of air pressure are regarded as dynamic variations of sound pressure and are thus larger than variations of static pressure per unit time. That is, variations of static pressure inside of the cavity S1 and variations of the atmospheric pressure in the external space are not regarded as variations of air pressure.

In the semiconductor device 231, the bent terminal 209e of the cover member 209 is brought into contact with the grounded lead 215; but this is not a restriction. That is, it is simply required that the grounded lead 215 be electrically connected to either the cover member 209 or the lower shield member 233. For example, it is possible to form a bent terminal, which is similar to the bent terminal 209e of the cover member 209, in the lower shield member 233, wherein the bent terminal of the lower shield member 233 is brought into contact with the grounded lead 215.

Next, a second variation of the third embodiment will be described in detail with reference to FIGS. 34 to 36. That is, a semiconductor device 241 of the second variation is designed such that the stage 211 is additionally incorporated into the semiconductor device 231. In the following description of the semiconductor device 241, parts identical to those of the semiconductor devices 201 and 231 are designated by the same reference numerals; hence, the description thereof will be omitted as necessary.

Figure 34:
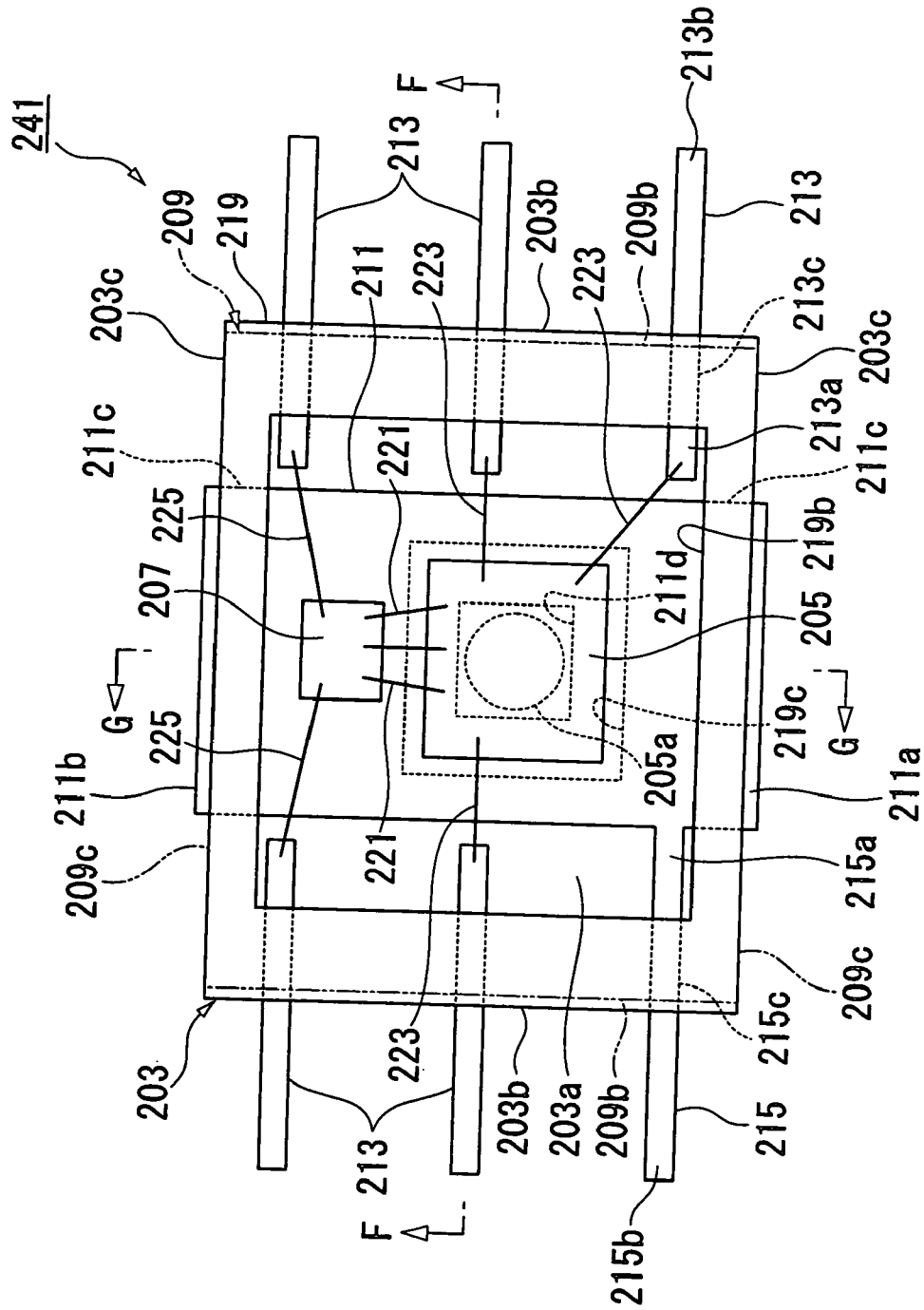
FIG. 34 is a plan view showing a semiconductor device in accordance with a second variation of the third embodiment.
Figure 35:
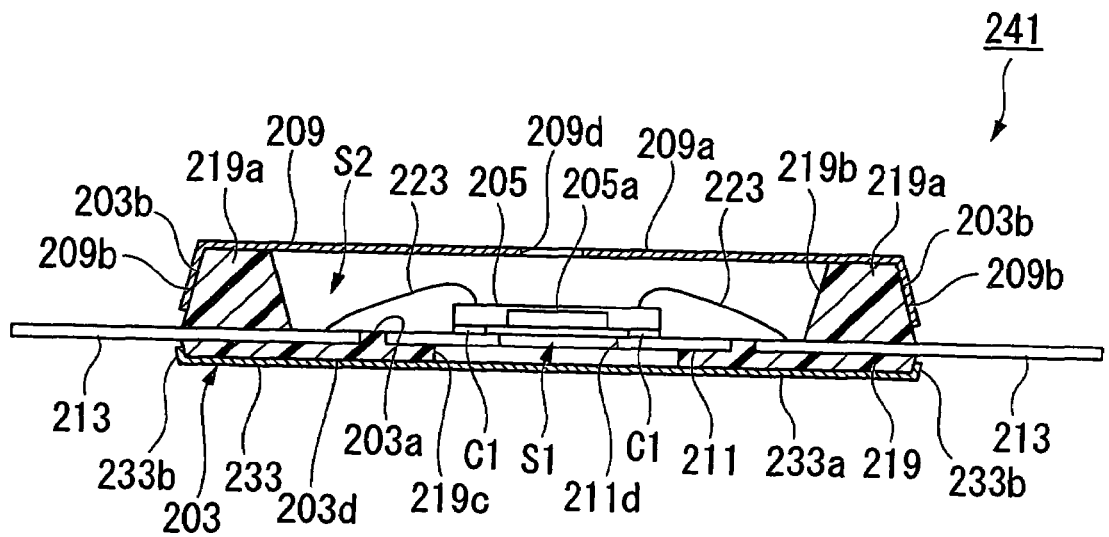
FIG. 35 is a cross-sectional view taken along line F-F in FIG. 34.
Figure 36:
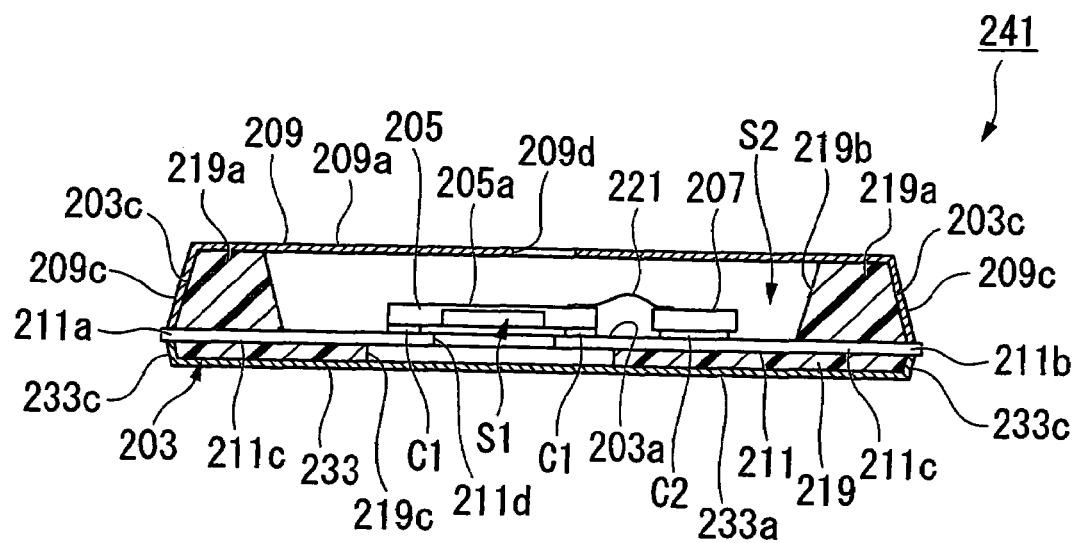
FIG. 36 is a cross-sectional view taken along line G-G in FIG. 34.

As shown in FIGS. 34 to 36, the semiconductor device 241 includes both of the stage 211, which forms the upper surface 203a of the substrate 203 used in the semiconductor device 201, and the lower shield member 233 used in the semiconductor device 231. A lower shield for covering the semiconductor sensor chip 205 and the amplifier 207 is formed by means of the stage 211 and the lower shield member 233. In the semiconductor device 241, the lower ends of the side walls 209c of the cover member 209 and the upper ends of the side walls 233c of the lower shield member 233 are brought into contact with the extended portions 211a and 211b of the stage 211, which slightly project outwardly of the sides 203c of the substrate 203. This establishes electrical connection between the cover member 209, the lower shield member 233, and the stage 211. In addition, a through hole 211d is formed in the stage 211 so as to communicate with the foregoing hole 219c of the molded resin 219. That is, the cavity S1 is defined by the semiconductor sensor chip 205, the through hole 211d of the stage 211, the hole 219c of the molded resin 219, and the flat portion 233a of the lower shield member 233.

The semiconductor device 241 demonstrates effects similar to both of the effects of the semiconductor devices 201 and 231. In addition, the hole 219c of the molded resin 219 can be increased in dimensions so as to be larger than the size of the semiconductor sensor chip 205. Due to the formation of the through hole 211d of the stage 211 communicating the hole 219c of the molded resin 219, it is possible to secure a mount surface of the semiconductor sensor chip 205, wherein it is possible to increase the hole 219c in dimensions so as to be larger than the through hole 211d. This may further increase the volume of the cavity S1.

Next, a third variation of the third embodiment will be described in detail with reference to FIGS. 37 to 39. A semiconductor device 251 of the third variation differs from the semiconductor device 231 with respect to the constitution of the cover member 209; hence, the following description will be mainly given with respect to the structural difference regarding the cover member 209, wherein parts identical to those used in the semiconductor device 231 are designated by the same reference numerals; hence, the description thereof will be omitted as necessary.

Figure 37:
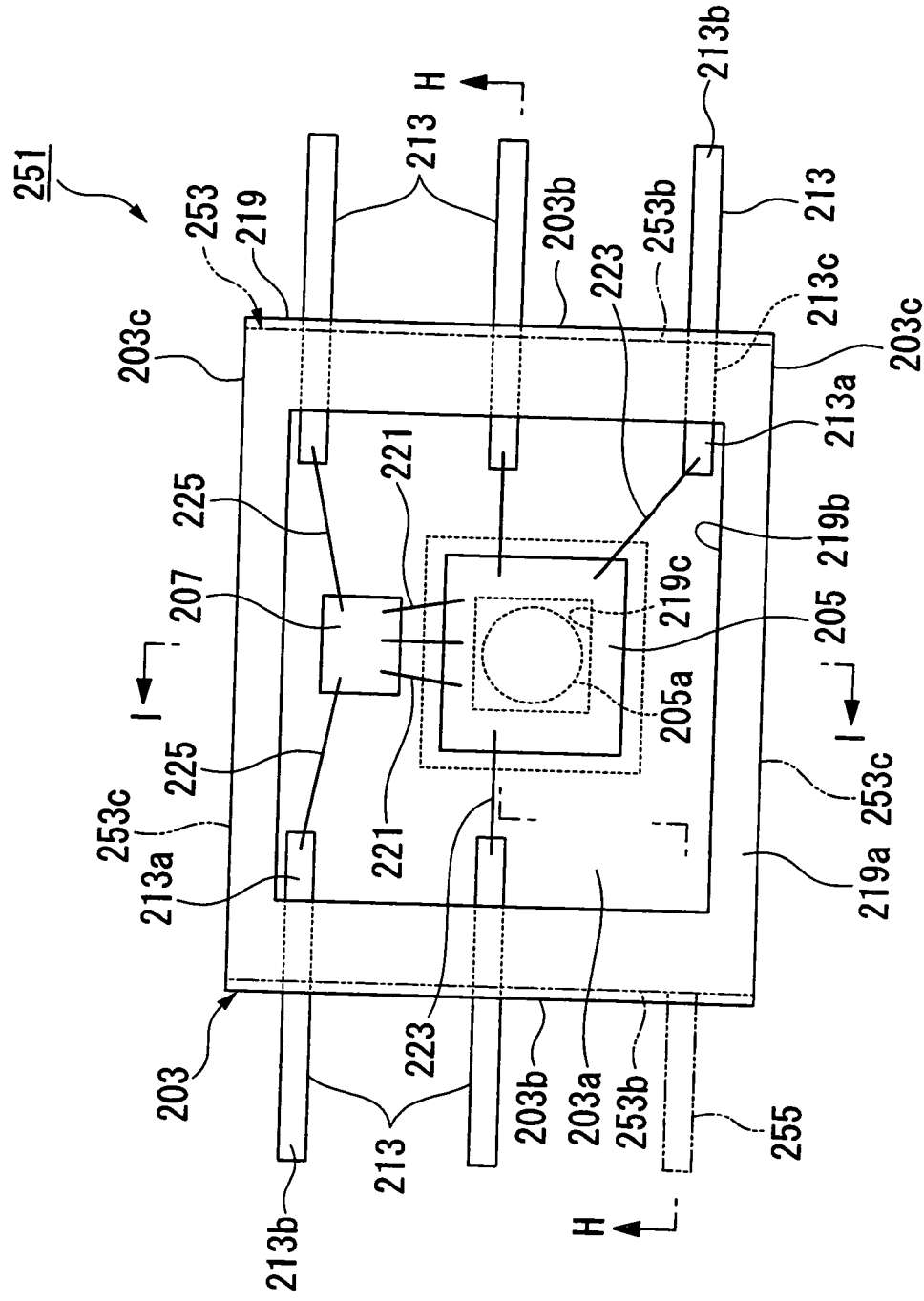
FIG. 37 is a plan view showing a semiconductor device in accordance with a third variation of the third embodiment.
Figure 38:
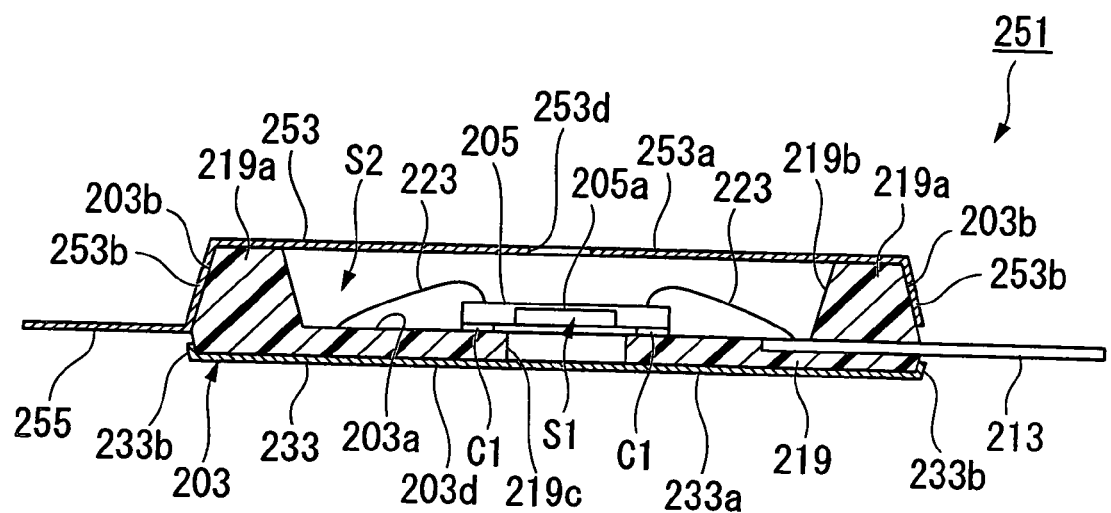
FIG. 38 is a cross-sectional view taken along line H-H in FIG. 37.
Figure 39:
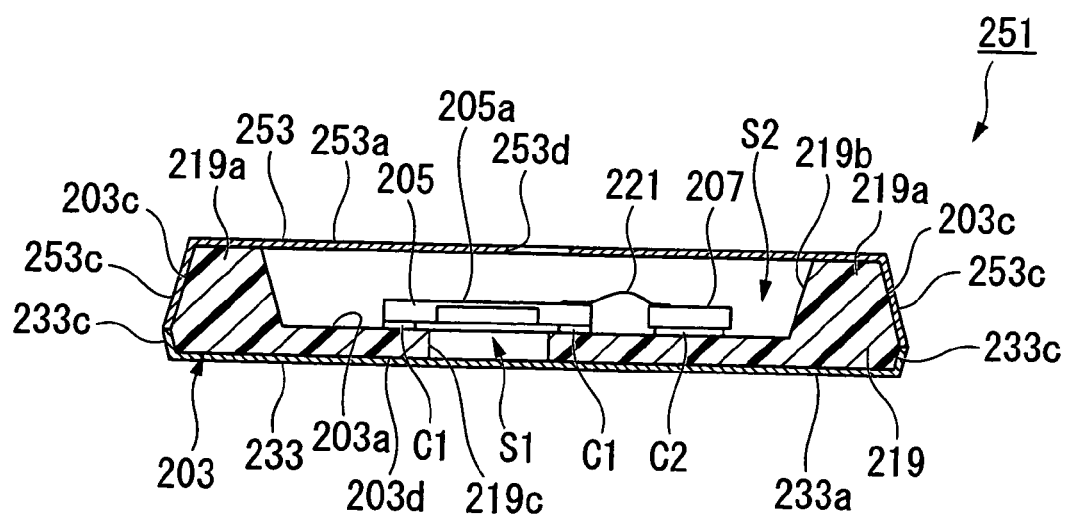
FIG. 39 is a cross-sectional view taken along line I-I in FIG. 37.
Figure 40:
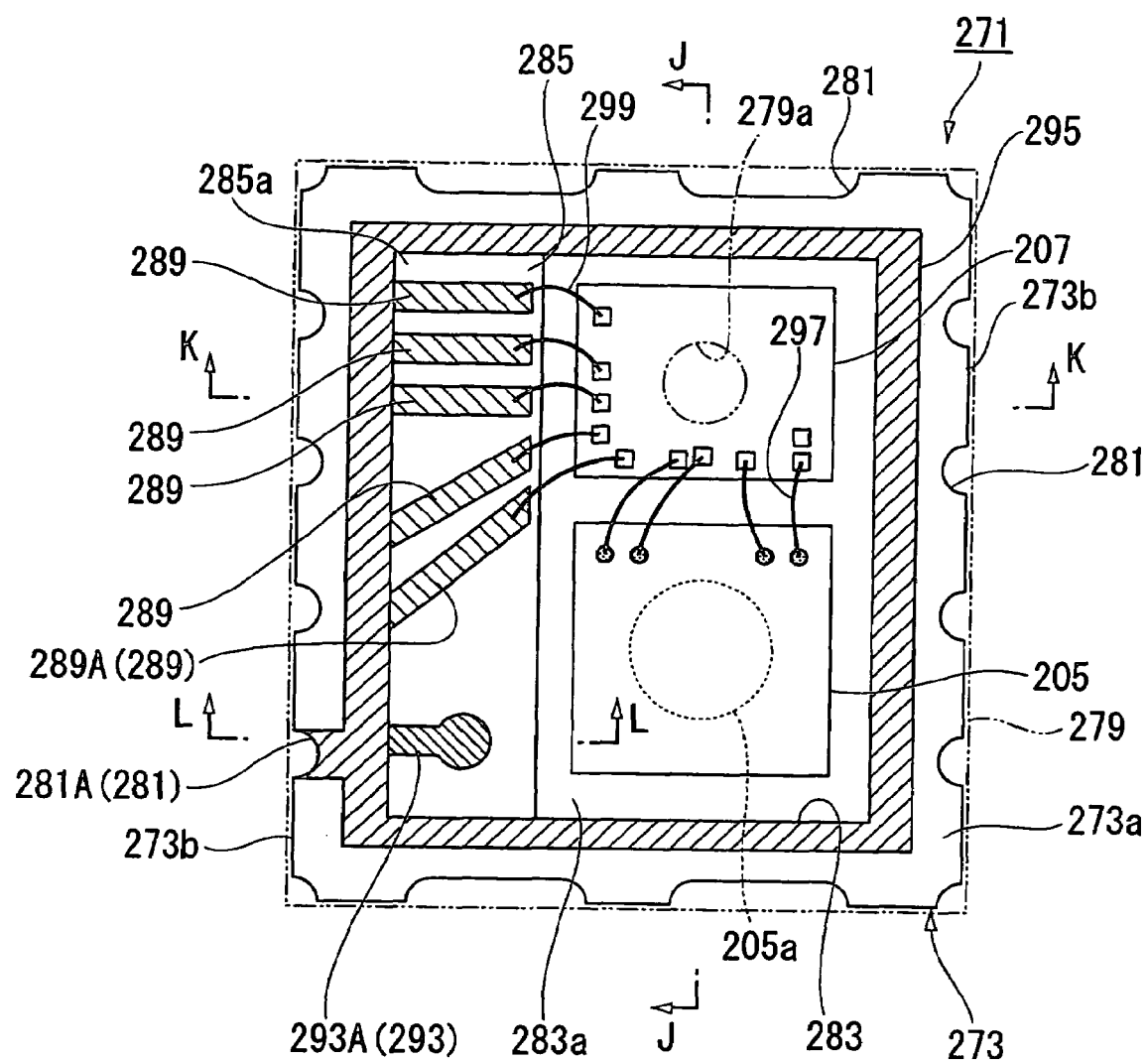
FIG. 40 is a plan view showing a semiconductor device in accordance with a fourth variation of the third embodiment.
Figure 41:
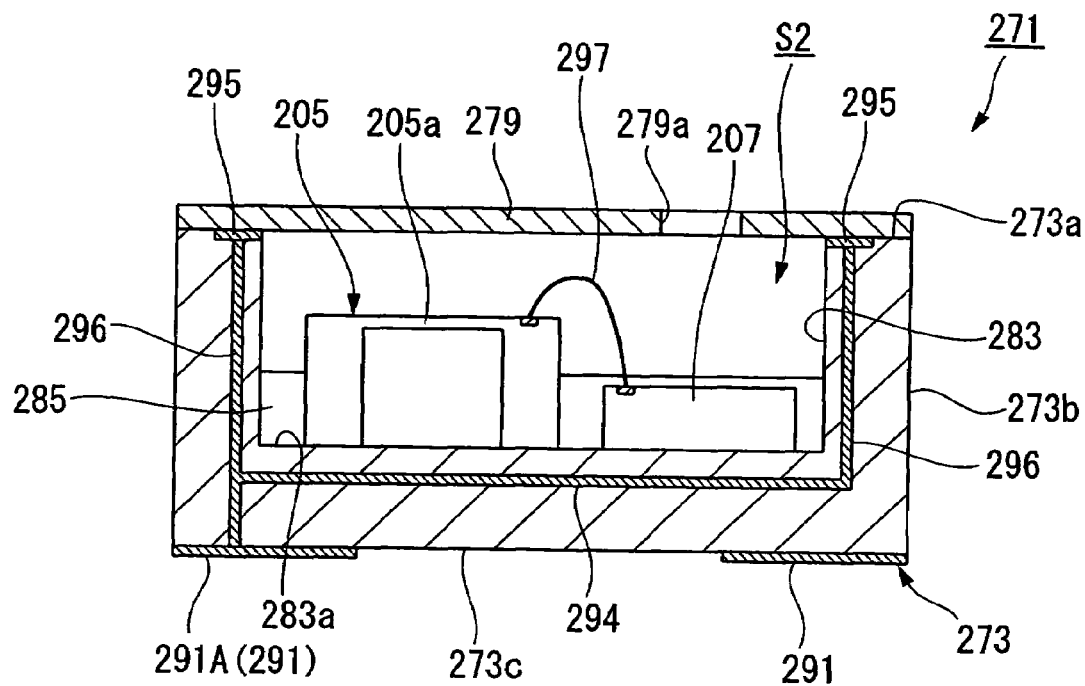
FIG. 41 is a cross-sectional view taken along line J-J in FIG. 40.
Figure 42:
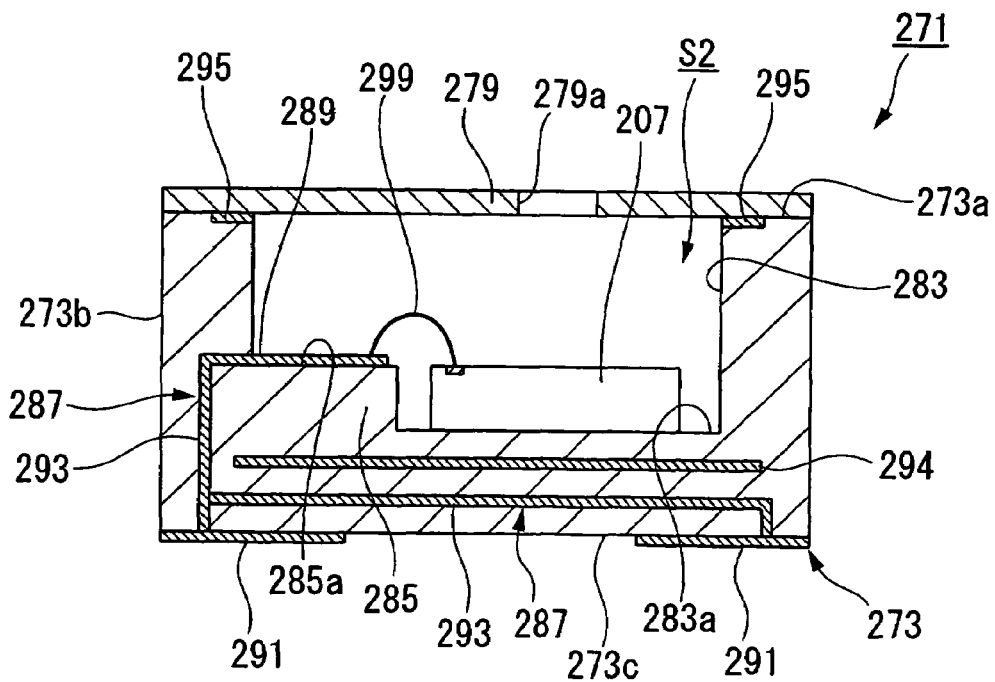
FIG. 42 is a cross-sectional view taken along line K-K in FIG. 40.
Figure 43:
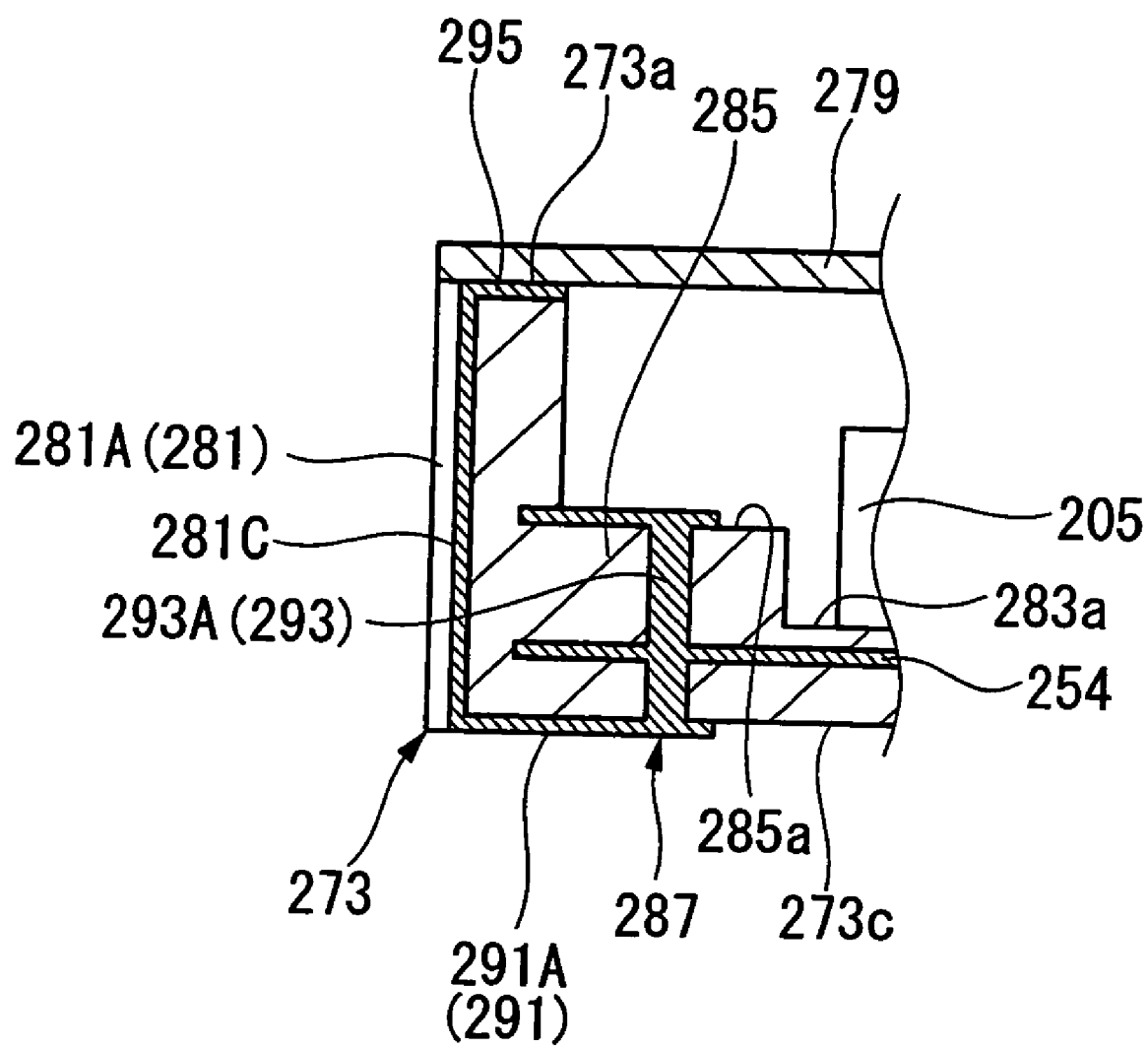
FIG. 43 is a cross-sectional view taken along line L-L in FIG. 40.

As shown in FIGS. 37 to 39, the semiconductor device 251 has a cover member 253. Similar to the cover member 209, the cover member 253 is composed of a conductive material such as copper and is constituted by a top portion 253a having a rectangular shape, which is positioned opposite the upper surface 203a of the substrate 203, and two pairs of side walls 253b and 253c, which hang down from the periphery of the top portion 253a, whereby the cover member 253 as a whole is formed in a dish-like shape whose opening is directed downwardly. In addition, an opening hole 253d is formed approximately at the center of the top portion 253a so as to establish communication between the hollow space S2 and the external space of the semiconductor device 251. Specifically, the side walls 253b, which are positioned opposite each other, are arranged in contact with the sides 203b of the substrate 203 arranging the chip connection leads 213, and the other side walls 253c, which are positioned opposite each other, are arranged in contact with the other sides 203c of the substrate 203 with no lead.

A grounded lead (or a shield connection terminal) 255 is formed by bending a prescribed part of the lower end of the side wall 253b and is bent outwardly of the side 203b of the substrate 203. Similar to the grounded lead 215, the grounded lead 255 is connected to the ground pattern of the printed-circuit board (not shown) on which the semiconductor device 255 is mounted. When the cover member 253 is attached to the substrate 203, the grounded lead 255 is positioned adjacent to one of the chip connection leads 213.

Similar to the cover member 209 used in the semiconductor device 231, the lower ends of the side walls 253c of the cover member 253 are brought into contact with the upper ends of the side walls 233c of the lower shield member 233, thus establishing electrical connection between the cover member 253 and the lower shield member 233.

The semiconductor device 251 demonstrates effects similar to the foregoing effects of the semiconductor device 231. Since the grounded lead 255 is integrally formed together with the cover member 253, it is possible to easily form an electromagnetic shield by use of the cover member 253 and the lower shield member 233, both of which are arranged externally of the substrate 203.

Next, a fourth variation of the third embodiment will be described in detail with reference to FIGS. 40 to 43, wherein parts identical to those shown in the foregoing drawings are designated by the same reference numerals; hence, the description thereof will be omitted as necessary.

A semiconductor device 271 includes a substrate 273 having a surface 273a, onto which the semiconductor sensor chip 205 and the amplifier 206 are attached, and a cover member 279, which covers the semiconductor sensor chip 205 and the amplifier 206.

The substrate 273 has a rectangular shape, which is defined by four sides 273b and a backside 273c as well as the surface 273a. A plurality of channels 281 are formed on the four sides 273b in such a way that they are each recessed and elongated along the surface 273a and the backside 273c. An internal recess 283 is formed on the surface 273a of the substrate 273.

The semiconductor sensor chip 205 and the amplifier 207 are arranged on a bottom 283a of the internal recess 283. A step portion 285 is formed so as to project from the bottom 283a of the internal recess 283 in one side along the arrangement direction of the semiconductor sensor chip 205 and the amplifier 207. Due to the formation of the step portion 285, a step-like shape is formed in connection with the surface 273a of the substrate 273 and the bottom 283a of the internal recess 283.

The substrate 273 is designed as a multilayered wiring substrate composed of a ceramic, which has a plurality of externally-connected wirings 287 for establishing electrical connection between the semiconductor sensor chip 205, the amplifier 207, and a printed-circuit board (not shown) on which the semiconductor device 271 is mounted.

The externally-connected wirings 287 include an internal terminal 289, which is exposed above an upper surface 285a of the step portion 285 so as to establish electrical connection with the amplifier 207, an external terminal 291, which is exposed below the backside 273c of the substrate 273 so as to establish electrical connection with the printed-circuit board, and a conductive wiring 293, which is formed inside of the substrate 273 so as to establish electrical connection between the internal terminal 289 and the external terminal 291.

Specifically, five internal terminals 289 are disposed in line on the upper surface 285a of the step portion 285 along the arrangement direction of the semiconductor sensor chip 205 and the amplifier 207 in proximity to the amplifier 207. In addition, a plurality of external terminals 291 are arranged on both sides of the substrate 273 along the arrangement direction of the semiconductor sensor chip 205 and the amplifier 207.

Furthermore, a grounded internal terminal 289A is electrically connected to a grounded conductive wiring 293A, which is positioned in proximity to the semiconductor sensor chip 205 on the upper surface 285a of the step portion 285. The grounded conductive wiring 293A is formed so as to run through from the upper surface 285a of the step portion 285 to the backside 273c of the substrate 273 and is thus electrically connected to a grounded external terminal 291A.

A lower shield layer 294 having conductivity is formed inside of the substrate 273 and below the semiconductor sensor chip 205 and the amplifier 207. The lower shield layer 294 is enlarged so as to entirely cover the substrate 273, i.e., an area including at least the semiconductor sensor chip 205 and the amplifier 207 as well as wires 297 establishing electrical connection therebetween. Of course, the lower shield layer 294 is formed so as to entirely cover the bottom 283a of the internal recess 283 of the substrate 273. Alternatively, the lower shield layer 294 can be formed so as to vertically overlap with the conductive wiring 293 in the thickness direction of the substrate 273. When the conductive wiring 293 and the lower shield layer 294 are formed in the same layer, the conductive wiring 293 is arranged so as to surround the lower shield layer 294.

The lower shield layer 294 is electrically connected to a ring-shaped connection pad 295, which is formed on the surface 273a of the substrate 273, the grounded conductive wiring 293A, and the grounded external terminal 291A via conductive portions 296, which are vertically elongated in the thickness direction of the substrate 273. That is, the lower shield layer 294 and the grounded external terminal 291A are integrally formed together.

The ring-shaped connection pad 295 is partially connected with a channel 281A within the channels 281 formed on the four sides 273b of the substrate 273. A conductive portion 281C is formed on the interior surface of the channel 281A and is connected with the grounded external terminal 291A. Therefore, the ring-shaped connection pad 295 is electrically connected to the grounded external terminal 291A via the conductive portion 281C in addition to the conductive portion 296.

All of the externally-connected wiring 287, the ring-shaped connection pad 295, the lower shield layer 294, and the conductive portion 281C formed in the channel 281A are formed by way of screen printing by use of a paste material, which is mainly composed of silver powder, copper powder, and tungsten powder (or a paste in which a binder (e.g., an acrylic resin) is mixed with silver powder, copper powder, and tungsten powder). In addition, the internal terminal 289, which is exposed above the upper surface 285a of the step portion 285, and the external terminal 291, which is exposed below the backside 273c of the substrate 273, are subjected to nickel and gold plating in addition to the aforementioned paste material.

The semiconductor sensor chip 205 and the amplifier 207 are attached onto the bottom 283a of the internal recess 283 of the substrate 273 and are electrically connected together via a plurality of wires 297 (i.e., four wires 297). The amplifier 207 is electrically connected to the internal terminal 289 via a plurality of wires 299 (i.e., five wires 299). Thus, the semiconductor sensor chip 205 is electrically connected to the internal terminal 289 via the amplifier 207.

The cover member 279 is formed using a flat plate composed of a conductive material such as copper, which is subjected to nickel plating. When the cover member 279 is attached onto the surface 273a of the substrate 273, it completely covers the internal recess 283 so as to form a hollow space S2 embracing the semiconductor sensor chip 205 and the amplifier 207 together with the substrate 273. An opening hole 279a is formed at a prescribed position of the cover member 279 so as to run through in the thickness direction. Hence, the hollow space S2 communicates with the external space via the opening hole 279a.

The cover member 279 is brought into contact with and is electrically connected to the ring-shaped connection pad 295 having conductivity. That is, the cover member 279 is electrically connected to the grounded external terminal 291A via the ring-shaped connection pad 295, the conductive portion 296, and the conductive portion 281C of the channel 281A.

In the manufacturing of the semiconductor device 271, there is firstly prepared the substrate 273. Each single substrate 273 can be individually manufactured; however, it is possible to produce a plate having a plurality of substrates, which are then divided into individual pieces. In this case, a plurality of through holes are formed between adjacently arranged substrates so as to run through in the thickness direction; then, they are divided into individual pieces at the through holes, thus forming the channels 281 of the substrate and thus forming the conductive portion 281C in the interior surface of the channel 281A for establishing electrical connection between the ring-shaped connection pad 295 and the grounded external terminal 291A.

The aforementioned through holes may reduce the rigidity of the plate especially at scribing lines between the adjacently arranged substrates; hence, the substrates can be easily divided into pieces by simply bending the plate at the scribing lines.

Next, the semiconductor sensor chip 205 and the amplifier 207 are attached onto the bottom 283a of the internal recess 283 of the substrate 273 via the adhesive paste (not shown); then, they are electrically connected together via the wires 297 by way of wire bonding. Lastly, the cover member 279 is fixed to the surface 273a of the substrate 273, thus completing the manufacturing of the semiconductor device 271. Herein, the conductive adhesive is used to realize the fixation of the cover member 279 with the substrate 273, for example.

When the semiconductor device 271 is mounted on the printed-circuit board in such a way that the external terminals 291 join the connection terminals of the printed-circuit board.

The semiconductor device 271 demonstrates effects similar to those of the third embodiment and the foregoing variations. When the cover member 279 is attached to the substrate 273, the cover member 279 and the lower shield layer 294 are electrically connected together. With a simple operation in which the grounded external terminal 291A is electrically connected to the ground pattern of the printed-circuit board, it is possible to easily form an electromagnetic shield. Since the lower shield layer 294 entirely covers the lower side of the hollow space S2, it is possible to further reduce the area allowing electromagnetic noise from being transmitted into the hollow space S2; hence, it is possible to further improve the shield performance against electromagnetic noise.

The semiconductor device 271 is designed such that the electromagnetic shield is formed using only the cover member 279 and the lower shield layer 294. When a gap, which is formed between the cover member 279 and the lower shield layer 294 in the thickness direction, is sufficiently smaller than wavelengths of electromagnetic waves, it is possible to reliably block electromagnetic noise from being transmitted into the hollow space S2 via the sides 273b of the substrate 273 without forming the foregoing side walls 209b and 209c integrally with the cover member 209.

Lastly, it is possible to further modify the fourth variation in a variety of ways, which will be described below.

(1) The internal terminals 289 are not necessarily disposed in line along the arrangement direction of the semiconductor sensor chip 205 and the amplifier 207; that is, the internal terminals 289 can be disposed on both sides of the semiconductor sensor chip 205 and the amplifier 207 or in their surrounding areas. In this case, step portions (similar to the step portion 285) are formed on both sides of the semiconductor sensor chip 205 and the amplifier 207 or in their surrounding areas, so that the internal terminals 289 are arranged on the upper surfaces thereof (similar to the upper surface 285a). Alternatively, the internal terminals 289 can be formed directly on the bottom 283a of the internal recess 283 without forming the step portion 285.

(2) The external terminals 291, which are electrically connected to the internal terminals 289 and the lower shield layer 294, are not necessarily formed on the backside 273c of the substrate 273. Instead, it is possible to form external terminals which are not electrically connected to the internal terminals 289 and the lower shield layer 294.

(3) The substrate 273 is not necessarily composed of a ceramic; hence, the substrate 273 can be composed of a glass epoxy resin, for example. The lower shield layer 294 is not necessarily positioned inside of the substrate 273. For example, the lower shield layer 294 can be positioned so as to form the bottom 283a of the internal recess 283.

(4) The cover member 279 as a whole is not necessarily formed in a flat shape. That is, the cover member 279 can be constituted by a flat top portion, which is positioned above the surface 273a of the substrate 273, and side walls, which extend downward from the periphery of the top portion in the thickness direction of the substrate 273 so as to adjacently join the sides 273b of the substrate 273. This makes it possible to easily establish positioning of the cover member 279 relative to the substrate 273 when the cover member 279 is attached to the substrate 273. In this case, even when the gap, which is formed between the cover member 279 and the lower shield layer 294 in the thickness direction of the substrate 273, is larger than wavelengths of electromagnetic waves, it is possible to reliably block electromagnetic noise from being transmitted into the hollow space via the sides 273b of the substrate 273 by means of the side walls of the cover member 279.

(5) When the cover member 279 is constituted by the top portion and side walls, it is possible to horizontally extend the lower shield layer 294, which is thus exposed externally of the sides 273b of the substrate 273, whereby the side walls of the cover member 279 are brought into contact with the extended portions of the lower shield layer 279 in proximity to the sides 273b of the substrate 273. Alternatively, the side walls of the cover member 279 are adhered to the sides 273b of the substrate 273 via the adhesive.

All the aforementioned semiconductor devices are not necessarily designed such that both of the semiconductor sensor chip 205 and the amplifier 207 are attached onto the upper surface 203a of the substrate 203. That is, they can be redesigned such that only the semiconductor sensor chip 205 is attached onto the upper surface 203a of the substrate 203.

4. Fourth Embodiment

Next, a fourth embodiment of the present invention will be described in detail with reference to FIGS. 44 to 49, 50A-50E, 51, and 52. The fourth embodiment is directed to a semiconductor device of a SON (Small Outline Non-leaded package) type, which is manufactured using a lead frame so as to detect sound pressure.

Figure 44:
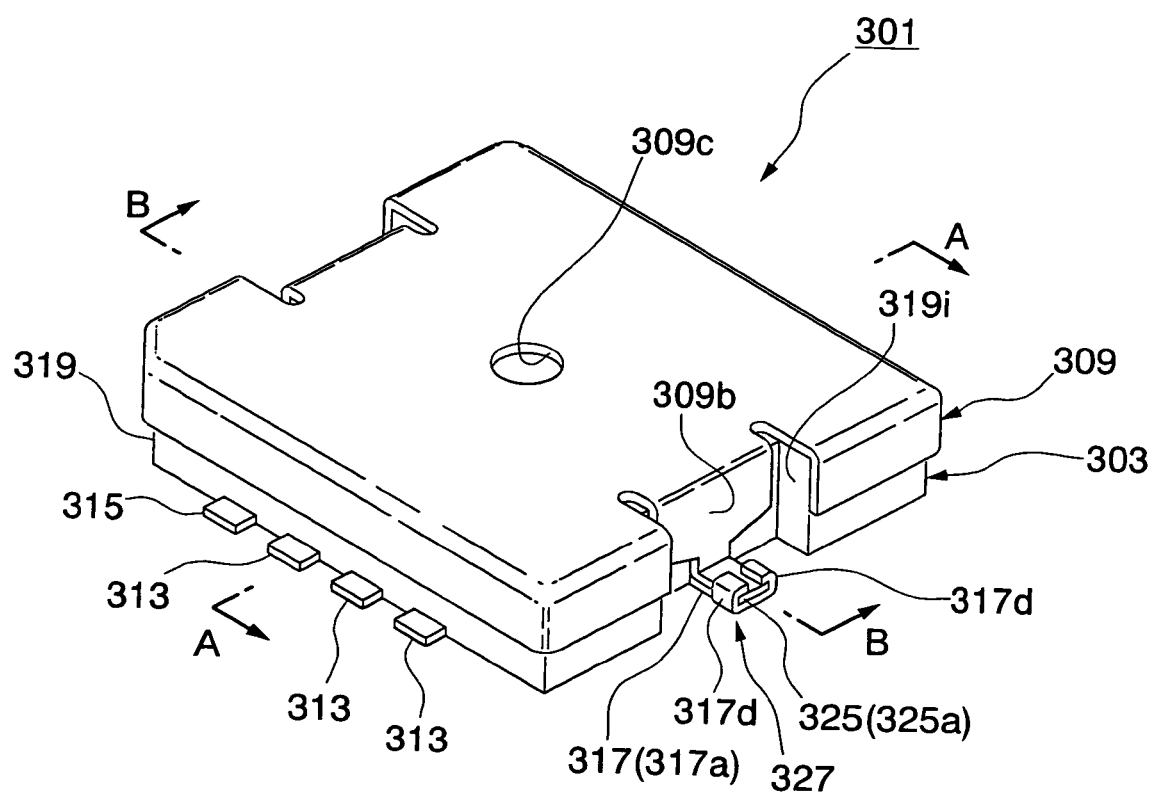
FIG. 44 is a perspective view showing a semiconductor device in accordance with a fourth embodiment of the present invention.
Figure 45:
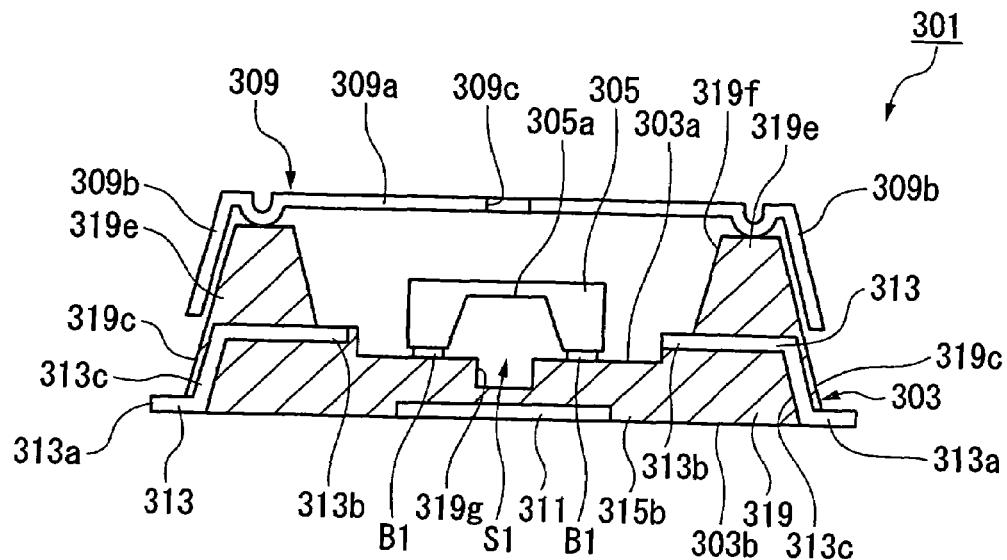
FIG. 45 is a cross-sectional view taken along line A-A in FIG. 44.
Figure 46:
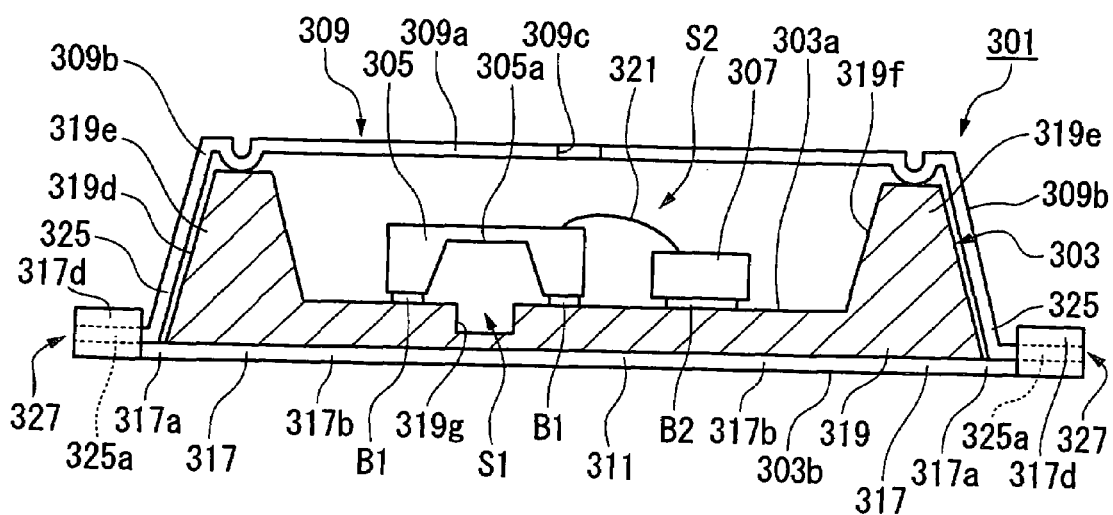
FIG. 46 is a cross-sectional view taken along line B-B in FIG. 44.

As shown in FIGS. 44 to 46, a semiconductor device 301 is constituted by a substrate 303 having a rectangular shape in plan view, a pair of a semiconductor sensor chip 305 and an amplifier 307 attached onto an upper surface 303a of the substrate 303, and a cover member 309, which covers the substrate 303 so as to embrace the semiconductor sensor chip 305 and the amplifier 307.

As shown in FIGS. 44 to 49, the substrate 303 includes a stage 311 having a rectangular shape in plan view, a plurality of leads 313, 315, and 317, which are arranged so as to surround the stage 311, and a molded resin (or a resin layer) 319 that seals and integrally fixes the stage 311 and the leads 313, 315, and 317. The stage 311 is partially exposed externally of the lower surface of the molded resin 319 so as to form a planar lower surface 303b of the substrate 303. The stage 311 is formed in a prescribed shape allowing the semiconductor sensor chip 305 and the amplifier 307, which are attached onto the upper surface 303a of the substrate 303, to be positioned thereabove in plan view.

As shown in FIGS. 45 to 49, the leads 313, 315, and 317 are partially exposed externally of the molded resin 319 together with the stage 311 so as to form the planar lower surface 303b of the substrate 303. That is, the leads 313, 315, and 317 serve as external terminals, which are soldered to connection terminals of a printed-circuit board (not shown), when the semiconductor device 301 is mounted on the printed-circuit board. Each of the leads 313, 315, and 317 is formed in a band-like shape. Specifically, there are provided a plurality of chip connection leads 313, which are isolated from the stage 311, a plurality of grounded leads integrally formed together with the stage 311, and a plurality of cover connection leads (or external terminals) 317.

Figure 48:
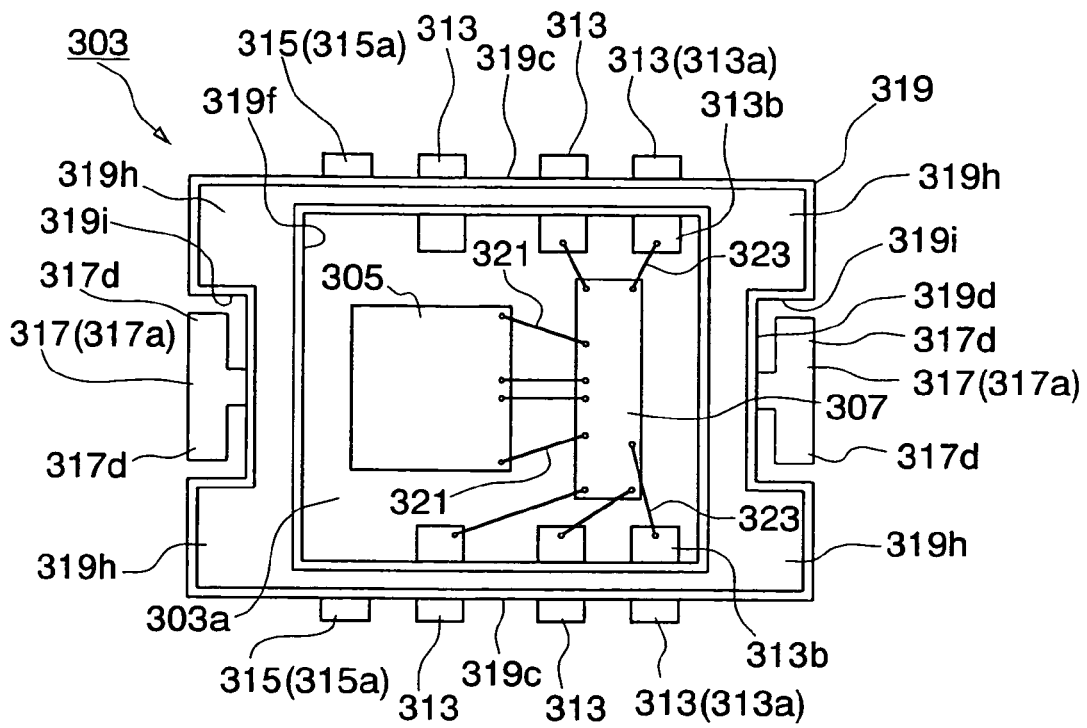
FIG. 48 is a plan view of the substrate.
Figure 49:
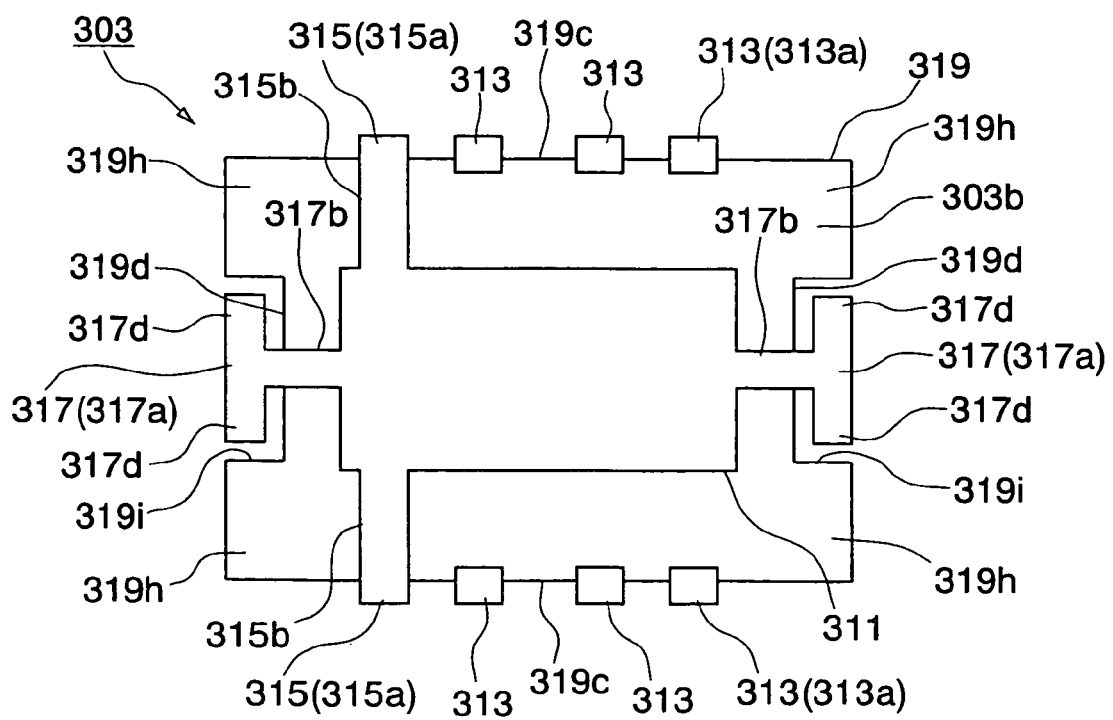
FIG. 49 is a bottom view of the substrate.

As shown in FIGS. 45, 48, and 49, the chip connection leads 313 are used to establish electrical connection with the semiconductor sensor chip 305. Specifically, two sets of three chip connection leads 313 are disposed along a pair of opposite sides 319c of the molded resin with equal spacing therebetween along the arrangement direction of the semiconductor sensor chip 305 and the amplifier 307. The chip connection leads 313 extend inwardly toward the stage 311 from the sides 319c of the molded resin 319, wherein first ends 313a thereof slightly project externally of the molded resin 319 and are exposed externally of the lower surface 303b of the substrate 303. The chip connection leads 313 have bent portions 313c lying between the first ends 313a and second ends 313b, which are positioned in proximity to the stage 311, whereby the second ends 313b are positioned upwardly compared with the first ends 313a due to the bent portions 313c. Incidentally, the second ends 313b of the chip connection leads 313 are partially exposed and are positioned substantially in the same plane as the upper surface 303a of the substrate 303, which is formed by the molded resin 319.

There are provided two grounded leads 315, which are positioned adjacent to two chip connection leads 313 with equal spacing therebetween. Similar to the chip connection leads 313, first ends 315a of the grounded leads 315 slightly project externally of the molded resin 319, and second ends 315b are connected to the side ends of the stage 311. The first ends 315a and the second ends 315b of the grounded leads 315 are partially exposed externally of the lower surface 303b of the substrate 303.

As shown in FIGS. 46, 48, and 49, there are provided two cover connection leads 317 on a pair of opposite sides 319d, which are perpendicular to the opposite sides 319c of the molded resin 319 in plan view, wherein first ends 317a of the cover connection leads 317 project externally of the molded resin 319. Second ends 317b of the cover connection leads 317 are connected to both ends of the stage 311 viewed in the longitudinal direction. The first ends 317a and the second ends 317b of the cover connection leads 317 are partially exposed externally of the lower surface 303b of the substrate 303.

Figure 47:
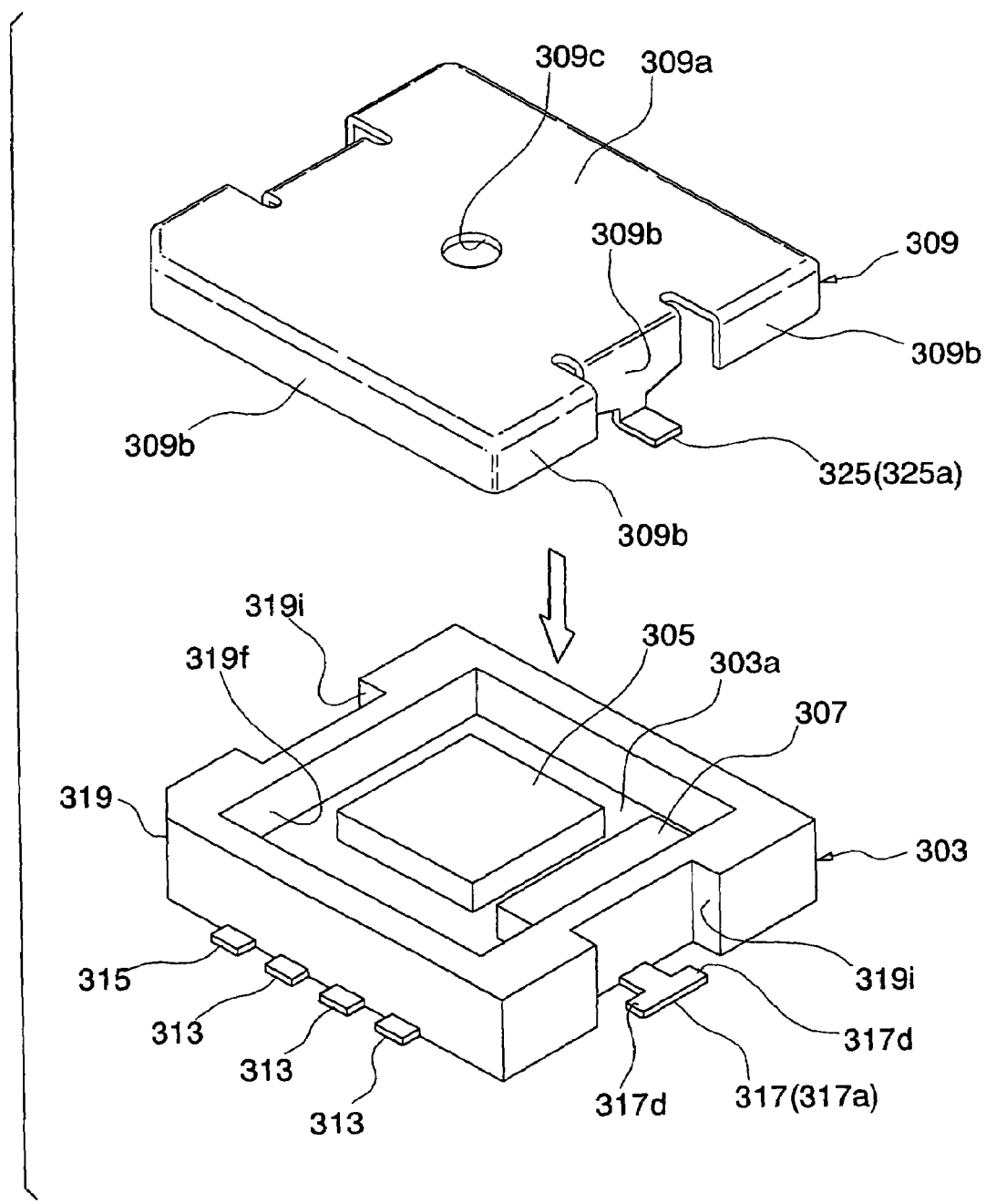
FIG. 47 is an exploded perspective view showing that a cover member is assembled with a substrate sealed with a resin layer.

The first ends 317a of the cover connection leads 317 have engagement portions 317d, which are engaged with electromagnetic shield terminals 325 of the cover member 309 (see FIG. 47). The engagement portions 317d are horizontally expanded from the first ends 317a of the cover connection leads 317.

The stage 311, the chip connection leads 313, the grounded leads 315, and the cover connection leads 317 are integrally formed together by means of a lead frame.

As shown in FIGS. 45 to 49, the molded resin 319 has a rectangular shape in plan view so as to form the upper surface 303a and the lower surface 303b of the substrate 303. The molded resin 319 has a ring-shaped projection 319e that projects upwardly from the upper surface 303a along the sides 319c and 319d sealing the chip connection leads 313. The ring-shaped projection 319e is formed in a trapezoidal shape (see FIG. 45) so that the width viewed in cross section is gradually reduced in an upward direction, whereby an internal recess 319f is formed on the upper surface 303a of the molded resin 319.

A recess 319g is formed approximately at the center of the upper surface 303a of the molded resin 319 and is recessed downwardly from the upper surface 303a. The recess 319g has a bottom and an opening, which is directed to the stage 311.

The molded resin 319 has projections 319h, which horizontally project from the sides 319d of the molded resin 319 and which are positioned on both sides of the cover connection leads 317 (see FIG. 49), whereby recesses 319i are formed so as to horizontally embrace the cover connection leads 317 therein. The recesses 319i are formed for the purpose of protecting the cover connection leads 317.

The semiconductor sensor chip 305 is a sound pressure sensor chip that converts sound into electric signals. The semiconductor sensor chip 305 has a diaphragm 305a that vibrates in the thickness direction thereof in response to variations of sound pressure caused by sound generated in the external space of the semiconductor device 301. A bridge-resistance circuit (not shown) is formed on the upper surface of the diaphragm 305a so as to detect the deformation (or displacement) of the diaphragm 305a as variations of electric resistance, based on which the semiconductor sensor chip 305 produces electric signals.

The semiconductor sensor chip 305 is adhered onto the upper surface 303a of the molded resin 319 via an adhesive paste B1 so as to cover the recess 319g. This forms a cavity S1 having a prescribed shape and size, which allow the diaphragm 305a to vibrate, between the diaphragm 305a and the recess 319g of the molded resin 319. When the semiconductor sensor chip 305 is fixed to the upper surface 303a of the molded resin 319, the cavity S1 is closed in an airtight manner and is isolated from the exterior of the semiconductor device 301. The semiconductor sensor chip 305 is electrically connected to the amplifier 307 via a plurality of wires 321 (e.g., four wires 321).

The amplifier 307 amplifies electric signals output from the semiconductor sensor chip 305. Similar to the semiconductor sensor chip 305, the amplifier 307 is adhered onto the upper surface 303a of the molded resin 319 via an adhesive paste B2. The amplifier 307 is electrically connected to the first ends 313a of the chip connection leads 313 via a plurality of wires 323 (e.g., four wires 323). That is, the semiconductor sensor chip 305 is electrically connected to the chip connection leads 313 via the amplifier 307.

As shown in FIGS. 44 to 47, the cover member 309 is composed of a conductive material such as copper and is constituted by a top portion 309a having a rectangular shape, which is positioned opposite the upper surface 303a of the substrate 303, and side walls 309b, which hang down from the side ends of the top portion 309a, whereby the cover member 309 as a whole is formed in a dish-like shape whose opening is directed downwardly.

The top portion 309a is brought into contact with the top portion of the ring-shaped projection 309e of the molded resin 319, whereby the top portion 309a covers the internal recess 319f of the molded resin 319 so as to form a hollow space S2 embracing the semiconductor sensor chip 305 and the amplifier 307. An opening hole 309c, which runs through the cover member 309 in its thickness direction, is formed approximately at the center of the top portion 309a, whereby the hollow space S2 communicates with the external space of the semiconductor device 301 via the opening hole 309a.

The side walls 309b are formed entirely along the periphery of the top portion 309a so as to cover the ring-shaped projection 319e along the sides 319b and 319c of the molded resin 319. In addition, the electromagnetic shield terminals 325 are integrally formed together with the side walls 309b positioned at both sides in the arrangement direction of the semiconductor sensor chip 305 and the amplifier 307, wherein the electromagnetic shield terminals 325 are extended outwardly of the sides walls 309b. Tip ends 325a of the electromagnetic shield terminals 325 are bent outwardly and are thus overlapped with the cover connection leads 317 when the cover member 309 is assembled together with the substrate 303.

After the electromagnetic shield terminals 325 are brought into contact with the first ends 317a of the cover connection leads 317, the engagement portions 317d of the cover connection leads 317 are bent and folded and are thus tightly engaged with the cover connection leads 317. That is, the engagement portions 317d serve as caulking tools 327 for tightening the electromagnetic shield terminals 325 and fixing them to the cover connection leads 317. Thus, the cover member 309 is fixed to the substrate 303 by means of the caulking tools 327, whereby the cover member 309 is electrically connected to the stage 311 via the electromagnetic shield terminals 325; that is, the cover member 309 and the stage 311 are placed substantially at the same potential. Incidentally, the prescribed portions of the side walls 309b arranging the electromagnetic shield terminals 325 are physically isolated from the other portions of the side walls 309b; hence, the electromagnetic shield terminals 325 are reliably held inside of the recesses 319i of the molded resin 319.

Next, a manufacturing method of the semiconductor device 301 will be described below.

In the manufacturing of the semiconductor device 301, a thin metal plate composed of a 42-alloy or copper is subjected to press working or etching so as to form a lead frame (not shown), in which the stage 311, the chip connection leads 313 arranged in the periphery of the stage 311, the grounded leads 315, and the cover connection leads 317 are integrally connected together. Simultaneously with the formation of the lead frame or after the formation of the lead frame, the chip connection leads 313 are subjected to bending so that the second ends 313b thereof are shifted in position in the thickness direction of the lead frame with respect to the stage 311.

Next, a metal mold (not shown) is used to form the molded resin 319 for sealing the lead frame; then, the chip connection leads 313, the grounded leads 315, and the cover connection leads 317 are separated from each other so as to form the substrate 303 having the aforementioned structure.

After completion of the formation of the substrate 303, the semiconductor sensor chip 305 and the amplifier 307 are adhered onto the upper surface 303a of the substrate 303 via the adhesive pastes B1 and B2 and are then subjected to wire bonding so that the semiconductor sensor chip 305 and the amplifier 307 are electrically connected together via the wires 321 while the amplifier 307 and the second ends 313b of the chip connection leads 313 are electrically connected together via the wires 323.

Lastly, as shown in FIGS. 44 and 45, the cover member 309 is arranged so as to cover the internal recess 319f of the molded resin 319, and the electromagnetic shield terminals 325 of the cover member 309 are fixed to the cover connection leads 317, thus completing the manufacturing of the semiconductor device 301.

When the substrate 303 is covered with the cover member 309, the prescribed portions of the side walls 309b arranging the electromagnetic shield terminals 325 are guided by the projections 319h of the molded resin 319 and are thus held inside of the recesses 319i of the molded resin 319. This makes it easy to establish positioning of the cover member 309 relative to the substrate 303.

The fixation of the electromagnetic shield terminals 325 and the cover connection leads 317 is performed by way of the following procedures.

First, before the substrate 303 is covered with the cover member 309, as shown in FIGS. 50A-50E and FIG. 51, the engagement portions 317d of the cover connection leads 317 are subjected to bending. Before the bending, the cover connection leads 317 are each formed in a flat T-shape; then, the engagement portions 317 are bent and folded in the thickness direction of the molded resin 319 so as to form the engagement portions 317d.

Figure 50A:
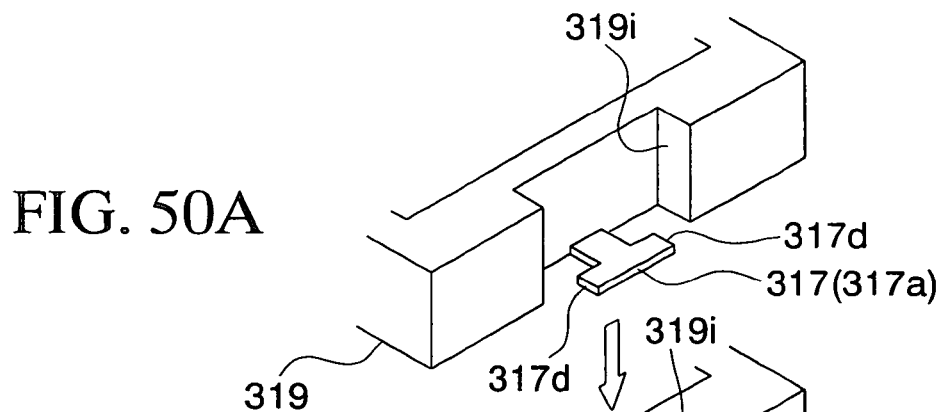
FIG. 50A is a first step for realizing the engagement between an electromagnetic shield terminal of a cover member and a cover connection lead of the substrate.
Figure 50B:
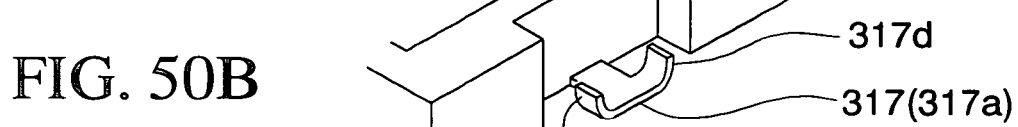
FIG. 50B is a second step for realizing the engagement between the electromagnetic shield terminal and the cover connection lead.
Figure 51:
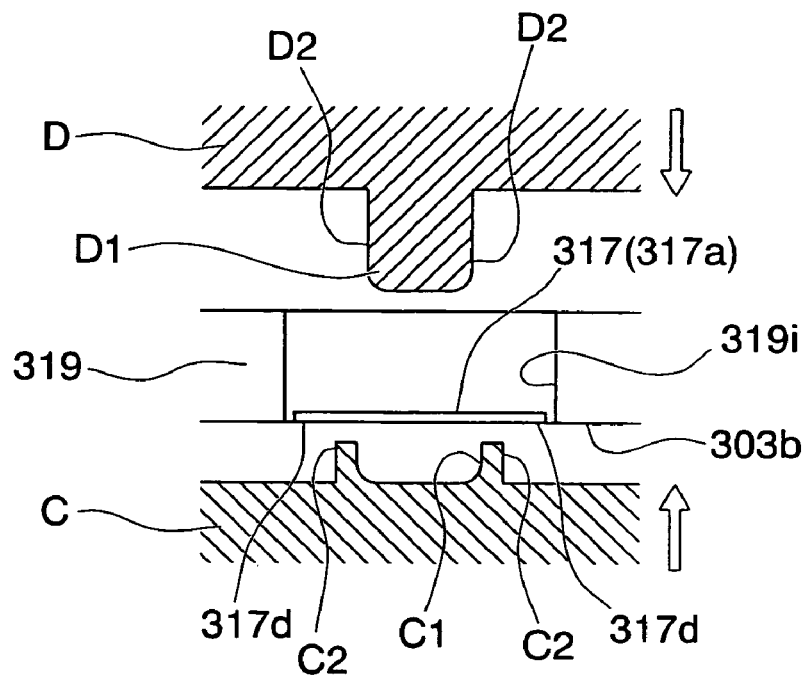
FIG. 51 is a cross-sectional view showing that a first end of the cover connection lead is subjected to bending so as to form an engagement portion by use of a pair of metal molds.

In the above, as shown in FIG. 51, a lower metal mold C having a recess C1 is positioned below the first end 317a of the cover connection lead 317, and an upper metal mold D having a projection D1 (having a rectangular shape viewed in cross section) is positioned above the first end 317a of the cover connection member 317. When the cover connection lead 317 is sandwiched between the lower metal mold C and the upper metal mold D, the first end 317a of the cover connection lead 317 is pressed upwardly by means of a pair of projections C2 projecting at both sides of the recess C1 and is thus bent upwardly so as to form the engagement portion 317d, wherein the engagement portion 317d is simultaneously brought into contact with both sides D2 of the projection D1 of the upper metal mold D, thus preventing the distance between the tip ends of the engagement portion 317d from being excessively reduced. Thus, as shown in FIGS. 50A and 50B, the first end 317a of the cover connection lead 317 is vertically bent so as to form the engagement portion 317d.

Figure 50C:
FIG. 50C is a third step for realizing the engagement between the electromagnetic shield terminal and the cover connection lead.
Figure 50D:
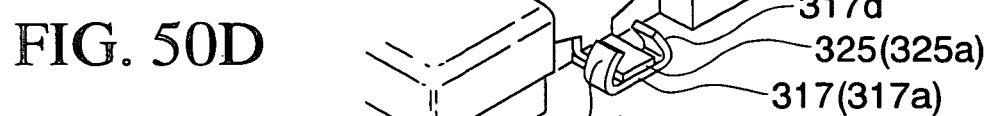
FIG. 50D is a fourth step for realizing the engagement between the electromagnetic shield terminal and the cover connection lead.

Next, the molded resin 319 is covered with the cover member 309 so that the tip end 325a of the electromagnetic shield terminal 325 is positioned so as to vertically overlap with the bent first end 317a of the cover connection lead 317 as shown in FIG. 50C. In this state, the tip end 325a of the electromagnetic shield terminal 325 is guided by the engagement portion 317d; hence, it is possible to easily establish positioning of the tip end 325a of the electromagnetic shield terminal 325 relative to the first end 317a of the cover connection lead 317. In this state, the tip ends of the engagement portion 317d (i.e., the tip ends of the bent first end 317a of the cover connection lead 317) are positioned upwardly in comparison with the tip end 325a of the electromagnetic shield terminal 325. Then, the engagement portion 317d is subjected to further bending so as to tightly hold the tip end 325a of the electromagnetic shield terminal 325 with the tip ends of the engagement portion 317d as shown in FIG. 50D.

Figure 52:
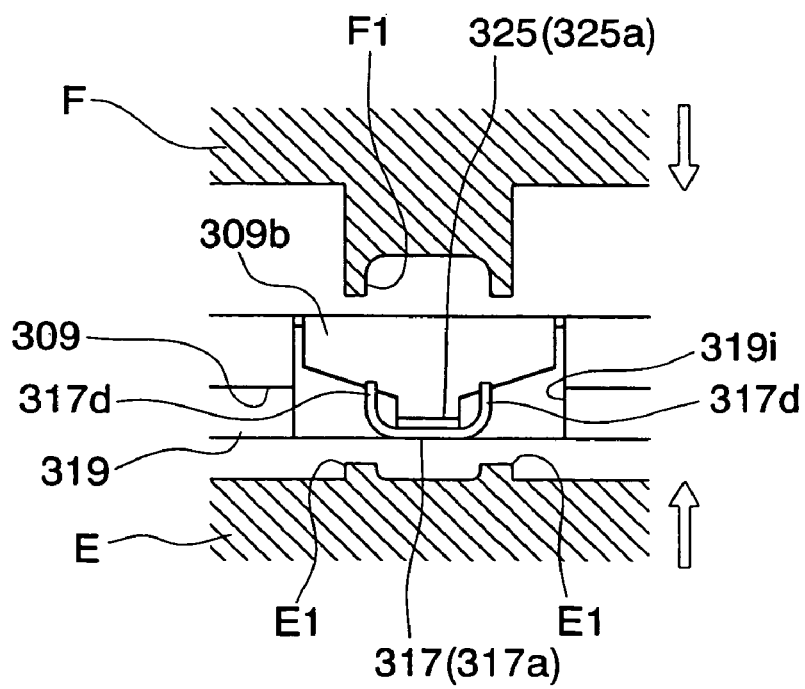
FIG. 52 is a cross-sectional view showing that the engagement portion is subjected to further bending by use of another pair of metal molds, thus tightly holding the electromagnetic shield terminal.

In the above, as shown in FIG. 52, a lower metal mold E having a pair of projections E1 is positioned below the engagement portion 317d of the cover connection lead 317, and an upper metal mold F having a recess F1 is positioned above the engagement portion 317d of the cover connection lead 317.

Figure 50E:
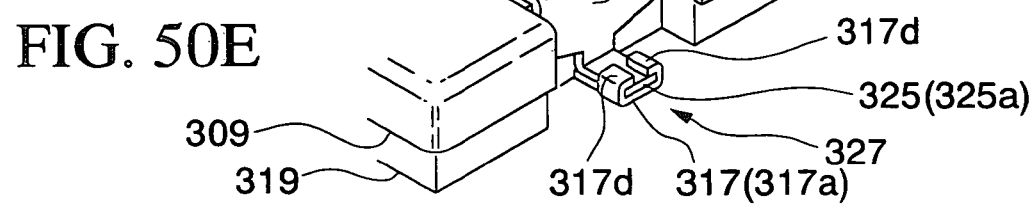
FIG. 50E is a fifth step for realizing the engagement between the electromagnetic shield terminal and the cover connection lead.

When the cover connection lead 317 is sandwiched between the lower metal mold E and the upper metal mold F, the engagement portion 317d is positioned between the projections E1, thus establishing positioning of the cover connection lead 317 relative to the lower metal mold E by means of the projections E1. In addition, the tip ends of the engagement portion 317d are brought into contact with the recess F1 of the upper metal mold F and are bent along the curved surface of the recess F1 as the upper metal mold F moves downwardly and depresses the engagement portion 317d, whereby the tip ends of the engagement portion 317d are brought into contact with the upper surface of the tip end 325a of the electromagnetic shield terminal 325. Thus, as shown in FIG. 50E, the tip end 325a of the electromagnetic shield terminal 325 is tightly held between the flat portion of the engagement portion 317d (corresponding to the first end 317a of the cover connection lead 317) and the tip ends of the engagement portion 317d, whereby the cover member 309 is fixed in position with the substrate 303 and is electrically connected to the stage 311.

When the semiconductor device 301 is mounted on the printed-circuit board (not shown), the first ends 313a of the chip connection leads 313, the first ends 315a of the grounded leads 315, and the first ends 317a of the cover connection leads 317 are respectively soldered to the connection terminals of the printed-circuit board. In this state, the cover member 309 having conductivity is electrically connected to the printed-circuit board; hence, it is possible to reliably form an electromagnetic shield embracing the semiconductor sensor chip 305 and the amplifier 307 by means of the cover member 309 and the stage 311. In other words, it is possible to reliably block electromagnetic noise from being transmitted into the hollow space S2 by means of the cover member 309 and the stage 311.

As described above, with a simple operation in which the electromagnetic shield terminals 325 of the cover member 309 are attached to the cover connection leads 317 of the substrate 307, it is possible to form the electromagnetic shield for protecting the semiconductor sensor chip 305 and to easily fix the cover member 309 to the substrate 303; that is, it is unnecessary to independently provide a special means designed for simply fixing the cover member 309 to the substrate 303. This simplifies the constitution of the semiconductor device 301 so as to reduce the manufacturing cost.

In addition, it is possible to reliably prevent the cover member 309 from being unexpectedly separated from the substrate 303 during the transportation of the semiconductor device 301 or when the semiconductor device 301 is mounted on the printed-circuit board. This makes it easy for the human operator (or worker) to handle the semiconductor device 301. In particular, the caulking tools 327 are used to realize the fixation between the electromagnetic shield terminals 325 and the cover connection leads 317; hence, it is possible to reliably prevent the cover member 309 from being separated from the substrate 303.

In the manufacturing of the semiconductor device 301, the chip connection leads 313, the grounded leads 315, and the cover connection leads 317 are individually separated from each other after completion of the formation of the molded resin 319; however, this is not a restriction. For example, they can be individually separated from each other after completion of the wire bonding. Alternatively, after completion of the wire bonding, only the cover connection leads 317 are individually separated; then, after the electromagnetic shield terminals 325 of the cover member 309 are attached to the cover connection leads 317, the chip connection leads 313 and the grounded leads 317 are individually separated from each other.

In the aforementioned case, it is preferable that a plurality of lead frames be integrally formed using a single thin metal plate, in which a plurality of substrates are mutually interconnected together and are thus simultaneously subjected to the foregoing steps for manufacturing semiconductor devices such as fixation of semiconductor sensor chips and amplifiers and wire bonding. This increases the effectiveness of manufacturing so as to reduce the manufacturing cost of each semiconductor device.

When a plurality of lead frames are integrally formed using a single thin metal plate, it is possible to additionally form hung-down leads, which are interconnected with the stage 311, at the corners of the semiconductor device 301. In this case, even when the chip connection leads 313, the grounded leads 315, and the cover connection leads 317 are individually separated from each other after the formation of the molded resin 319, a plurality of substrates 303 are mutually interconnected with each other by way of hung-down leads; hence, it is possible to improve handling of semiconductor devices 301 during manufacturing.

It is possible to modify the fourth embodiment in a variety of ways, which will be described below.

(1) The cover connection leads 317 are not necessarily separated from each other before the electromagnetic shield terminals 325 are attached to the cover connection members 317. That is, the cover connection leads 317 can be separated from each other after the electromagnetic shield terminals 325 are attached to the cover connection members 317.

Figure 53:
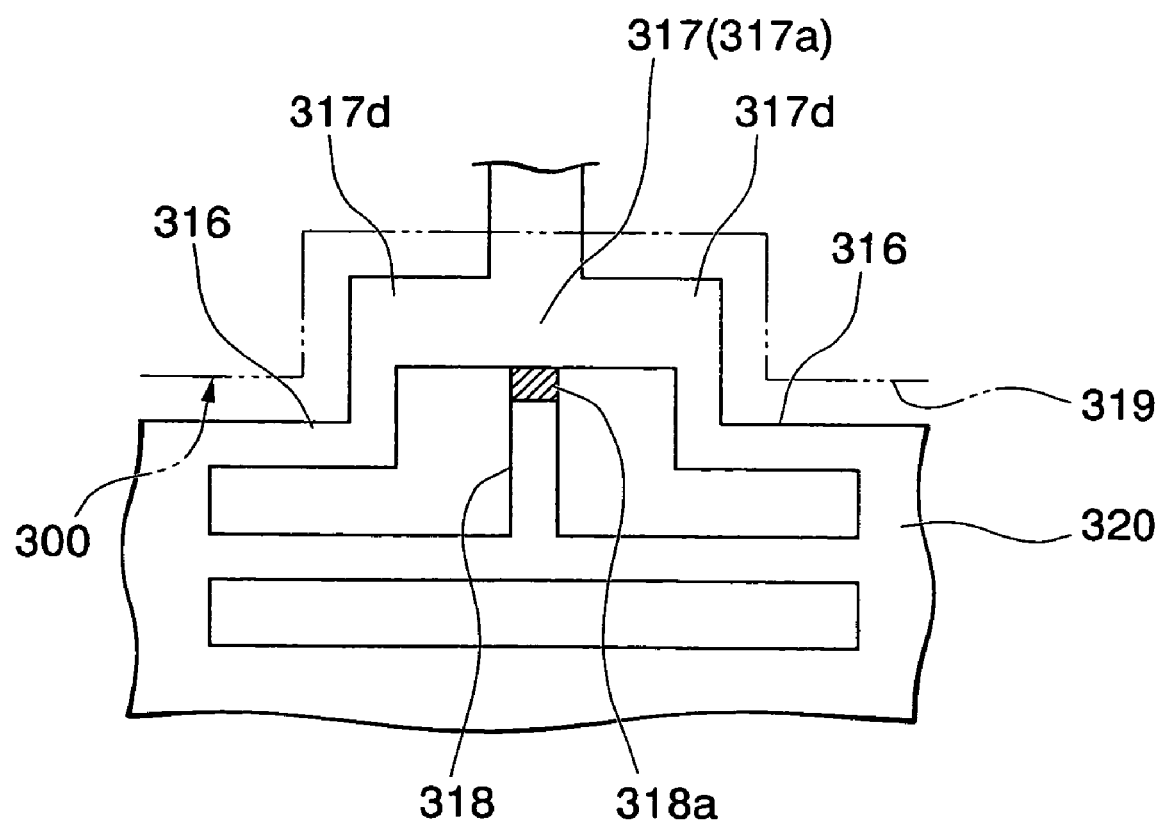
FIG. 53 is a plan view showing a variation of a lead frame, which is used for the manufacturing of the semiconductor device.

(2) In the above, it is necessary to redesign the lead frame as shown in FIG. 53, in which first support leads 316 are connected to both sides of the engagement portion 317d, and a second support lead 318 is connected to the first end 317a of the cover connection lead 317 at the center of the engagement portion 317d. The first support leads 316 and the second support lead 317 are integrally formed with the lead frame, whereby the cover connection leads 317 are connected to the rectangular frame 320 interconnected with the chip connection leads 313 and the grounded leads 315.

(3) In addition, after the formation of the molded resin 319 and before the fixation of the electromagnetic shield terminal 325 fixed to the cover connection lead 317, the first support leads 316 are subjected to cutting so as to separate the engagement portion 317d from the rectangular frame 320; then, after the electromagnetic shield terminal 325 is fixed to the cover connection lead 317, a cut portion 318a of the second support lead 318 is subjected to cutting so as to separate the cover connection lead 317 from the rectangular frame 320. In order to easily cut the second support lead 318, it is preferable that the cut portion 318a of the second support lead 318 be subjected to half etching or press working in advance.

(4) The aforementioned modification improves the handling of the semiconductor device 301 in the manufacturing process including the fixation of the electromagnetic shield terminal 325 to the cover connection lead 317. When the electromagnetic shield terminal 325 is fixed to the cover connection lead 317, the cover connection lead 317 is supported by the second support lead 318; hence, it is possible to reliably prevent the cover connection lead 317 from being unexpectedly deformed.

(5) Before the substrate 303 is covered with the cover member 309, the chip connection leads 313 and the grounded leads 315 are individually separated from each other without being interrupted by the side walls 309b of the cover member 309. In other words, it is possible not to limit the shapes of the side walls 309b of the cover member 309 due to the individual separation of the chip connection leads 313 and the grounded leads 315.

Figure 54:
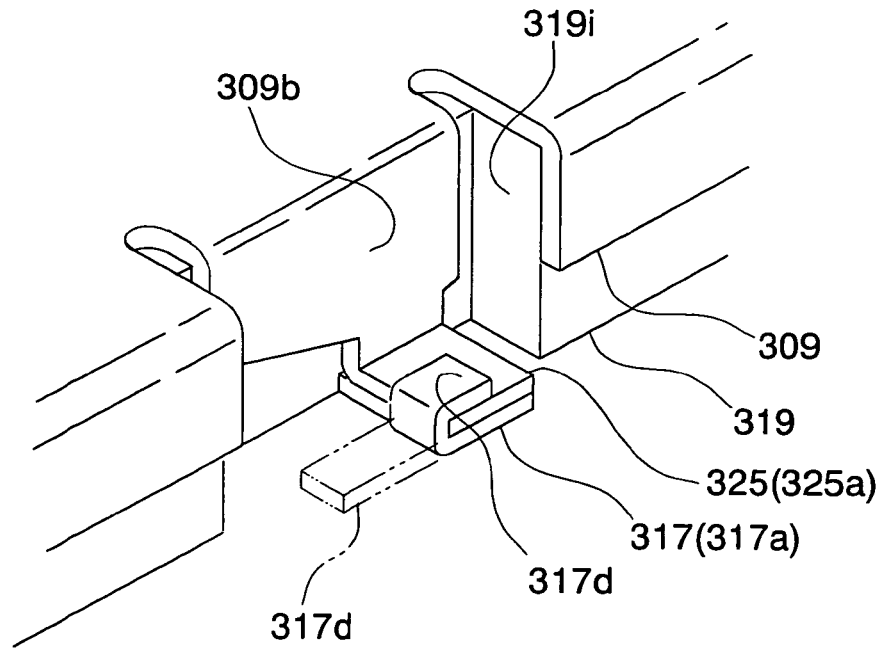
FIG. 54 is a perspective view showing that the engagement portion projects from one side of the cover connection lead and is bent to tightly hold the electromagnetic shield terminal.

(6) The engagement portion 317d projects from both sides of the cover connection lead 317; but this is not a restriction. That is, as shown in FIG. 54, the engagement portion projects from one side of the cover connection lead 317, wherein the tip end 325a of the electromagnetic shield terminal 325 can be tightly held by the first end 317a of the cover connection lead 317 and the tip end of the engagement portion 317d. This reduces the size of the recess 319i of the molded resin 319 for holding the first end 317a of the cover connection lead 317 therein; hence, it is possible to downsize the semiconductor device 301.

Figure 55:
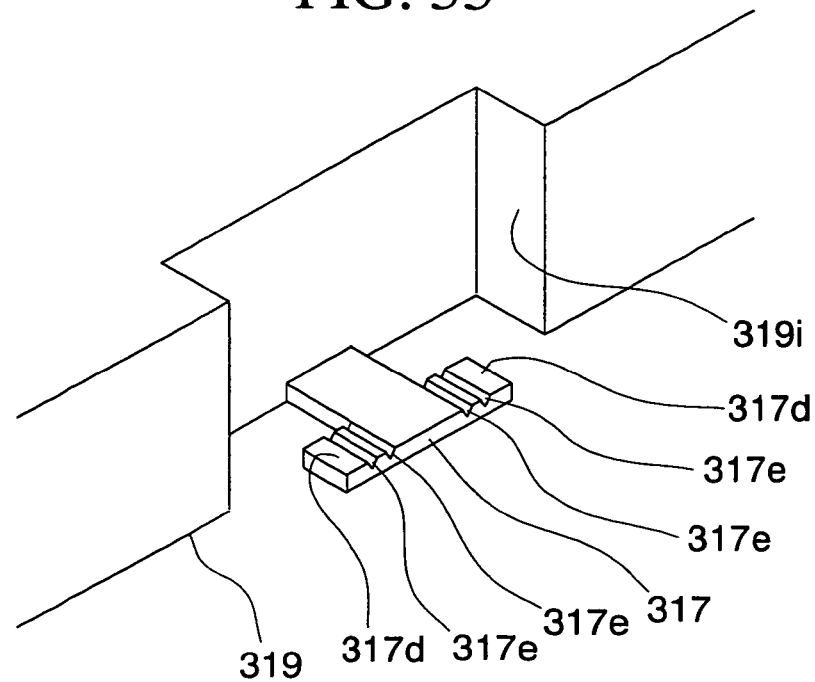
FIG. 55 is a perspective view showing that channels are formed on the interior surface of the engagement portion.
Figure 56:
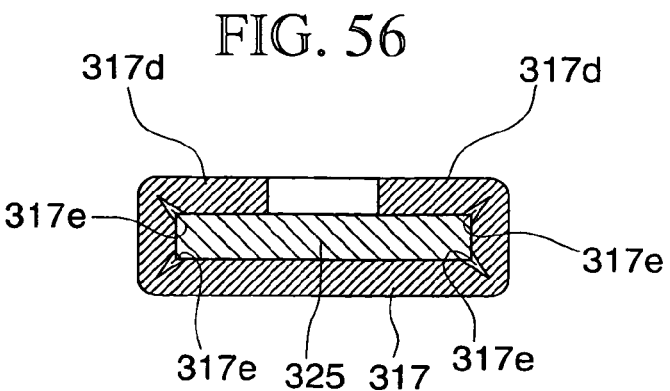
FIG. 56 is a cross-sectional view showing that the engagement portion shown in FIG. 55 is bent so as to hold the electromagnetic shield terminal therein.

(7) As shown in FIG. 55, channels 317e can be formed at bent portions of the engagement portion 317d, at which the engagement portion 317d is bent and is engaged with the tip end 325a of the electromagnetic shield 325. Incidentally, the channels 317e are formed on the interior surface of the bent portion of the engagement portion 317d; alternatively, the channels 317e are formed on the exterior surface of the bent portion of the engagement portion 317d. Due to the formation of the channels 317e, the bent portion is reduced in thickness compared with the other portion of the engagement portion 317d. Hence, as shown in FIG. 56, both sides of the engagement portion 317d can be easily and reliably bent at the channels 317e. Incidentally, the channels 317e are formed by way of press working or etching.

(8) In order to fix the electromagnetic shield terminal 325 to the cover connection lead 317 by means of the caulking tool 327, it is possible to form a recess on the upper surface of the electromagnetic shield terminal 325. In this case, the tip ends of the engagement portion 317d engage with the recess of the electromagnetic shield terminal 325; hence, it is possible to reliably fix the electromagnetic shield terminal 325 to the cover connection lead 317. The recess is formed by way of press working or etching. When the recess is formed by way of press working, it is possible to form a projection, which projects downwardly from the lower surface of the electromagnetic shield terminal 325.

Figure 57:
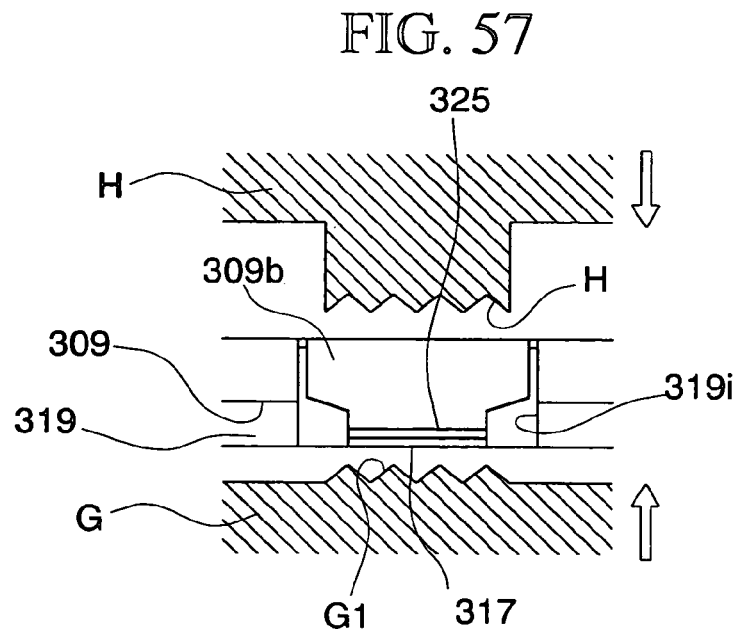
FIG. 57 is a cross-sectional view showing that the electromagnetic shield terminal and the cover connection lead are combined together and are sandwiched between metal molds having saw-toothed portions.
Figure 58:
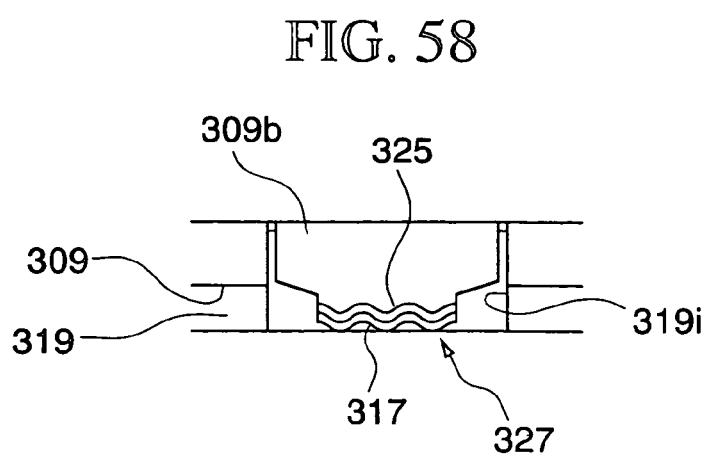
FIG. 58 is a cross-sectional view showing that the electromagnetic shield terminal and the cover connection lead are engaged with each other by way of corrugated portions thereof.

(9) The caulking tool 327 is not necessarily designed such that the electromagnetic shield terminal 325 is tightly held by means of the cover connection lead 317. Alternatively, it is possible to redesign the caulking tool 327 such that the cover connection lead 317 is tightly held by means of the electromagnetic shield terminal 325. Instead, the caulking tool 327 can be formed using a pair of metal molds G and H as shown in FIG. 57. That is, the cover connection lead 317 and the electromagnetic shield terminal 325 are combined together and are then sandwiched between the metal molds G and H having saw-toothed portions G1 and H1; thus, as shown in FIG. 58, the cover connection lead 317 and the electromagnetic shield terminal 325 are mutually engaged with each other by way of corrugated portions thereof.

Next, a first variation of the fourth embodiment will be described with reference to FIGS. 59A to 59C. A semiconductor device of the first variation differs from the semiconductor device 301 in respect of the fixation of the electromagnetic shield terminal 325 and the cover connection lead 317. Hence, the following description refers to only the technical difference adapted to the semiconductor device, wherein parts identical to those of the semiconductor device 301 are designated by the same reference numerals; hence, the description thereof will be omitted as necessary.

Figure 59A:
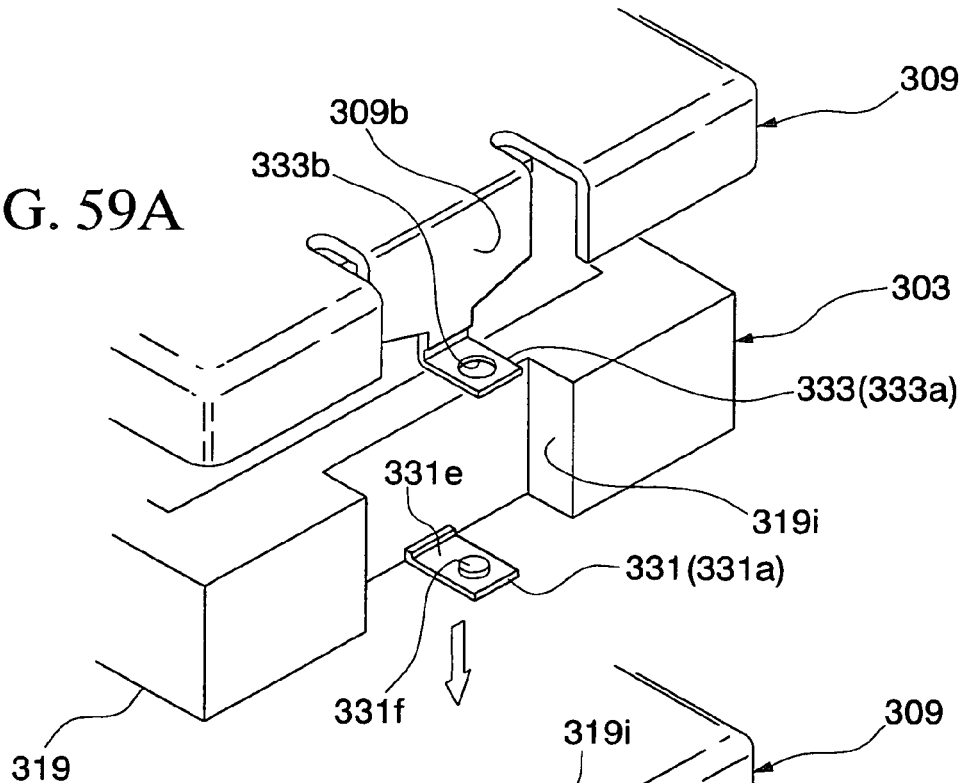
FIG. 59A is an exploded perspective view showing that a cover member is combined together with a substrate so as to form a semiconductor device in accordance with a first variation of the fourth embodiment.

As shown in FIG. 59A, the substrate 303 has a cover connection lead (or external terminal) 331 whose tip end 331a projects externally of the molded resin 319, wherein a rivet 331f projects upwardly from an upper surface 331e of the first end 331a of the cover connection lead 331. The rivet 331f is formed by way of half etching or press working, which is performed on the surrounding area of the rivet 331f. The half etching or press working can be performed before or after the formation of the lead frame.

In addition, the cover member 309 has an electromagnetic shield terminal 333 whose tip end 333a overlaps with the upper surface 331e of the cover connection lead 331, wherein a through hole 33b running through the thickness direction is formed in the tip end 333a of the electromagnetic shield terminal 333. The through hole 333b is shaped so as to be engaged with the rivet 331f; hence, the tip end 333a of the electromagnetic shield terminal 333 is reduced in thickness compared with the side wall 309b of the cover member 309 by way of half etching or press working.

Figure 59B:
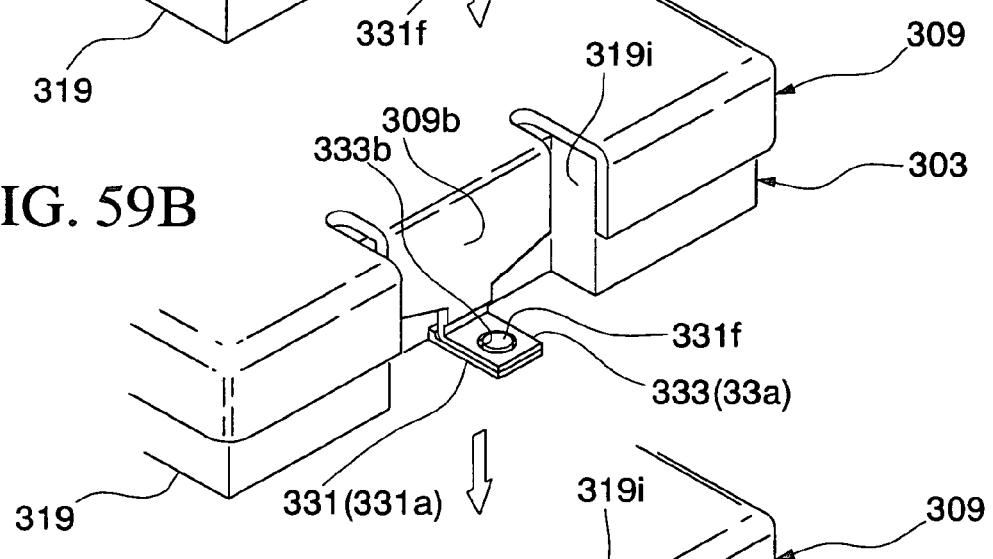
FIG. 59B is a perspective view showing that an electromagnetic shield terminal of the cover member is engaged with a cover connection lead of the substrate by use of a rivet.
Figure 59C:
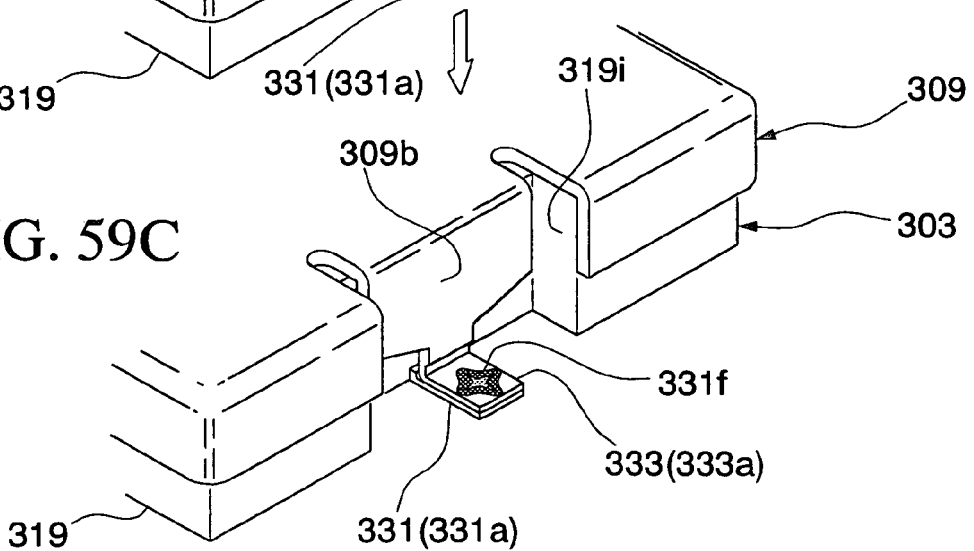
FIG. 59C is a perspective view showing that the electromagnetic shield terminal is fixed to the cover connection lead by way of riveting.

In order to establish engagement and fixation between the cover connection lead 331 and the electromagnetic shield terminal 333, the molded resin 319 is covered with the cover member 309 so as to insert the rivet 331f into the through hole 333b, whereby the tip end 333a of the electromagnetic shield terminal 333 is combined with the tip end 33 1a of the cover connection lead 331 as shown in FIG. 59B. Then, the rivet 331, which is engaged with the through hole 333b and slightly projects upwardly from the upper surface of the electromagnetic shield terminal 333, is depressed and partially destroyed, so that the electromagnetic shield terminal 333 is fixed to the cover connection lead 331.

The semiconductor device of the first variation demonstrates effects similar to those of the semiconductor device 301, wherein the fixation of the electromagnetic shield terminal 333 and the cover connection lead 331 is realized by way of riveting; hence, it is possible to reliably prevent the cover member 309 from being unexpectedly separated from the substrate 303.

In the first variation, the cover connection lead 331 of the substrate 303 has the rivet 33 1f, and the electromagnetic shield terminal 333 of the cover member 309 has the through hole 333b; but this is not a restriction. The first variation simply requires that the electromagnetic shield terminal 333 and the cover connection lead 331 be fixed together by way of riveting. That is, the electromagnetic shield terminal 333 has a rivet projecting downwardly therefrom, and the cover connection lead 331 has a through hole allowing the rivet to be inserted therethrough. Alternatively, both of the electromagnetic shield terminal 333 and the cover connection lead 331 have through holes running therethrough, wherein a rivet, which is independently provided, is inserted into the two through holes and is then subjected to riveting.

Incidentally, the fixation between the electromagnetic shield terminals 325 and 333 and the cover connection leads 317 and 331 is not necessarily realized by the engagement therebetween. That is, the fixation can be realized by way of welding or soldering, which is performed on the electromagnetic shield terminals 325 and 333 and the cover connection leads 317 and 331. In this case, it is possible to demonstrate the foregoing effects; that is, it is possible to reliably fix the electromagnetic shield terminals 325 and 333 together with the cover connection leads 317 and 331; hence, it is possible to reliably prevent the cover member 309 from being unexpectedly separated from the substrate 303.

The welding is realized by laser welding, spot welding, and ultrasonic welding, for example. The laser welding is realized using YAG laser, and the ultrasonic welding is realized by applying variations, whose frequencies are 60 kHz or less, to the cover connection lead and electromagnetic shield terminal.

The soldering is realized in such a way that the cover connection lead and electromagnetic shield terminal, which are positioned opposite each other, are subjected to solder plating (using Sn-2Bi, for example) in advance, thereafter, a solder paste (composed of Su-3Ag-0.5Cu, for example) is sandwiched between the cover connection lead and electromagnetic shield terminal and is then subjected to reflow at a prescribed temperature, which is 260° C. or less.

Figure 60A:
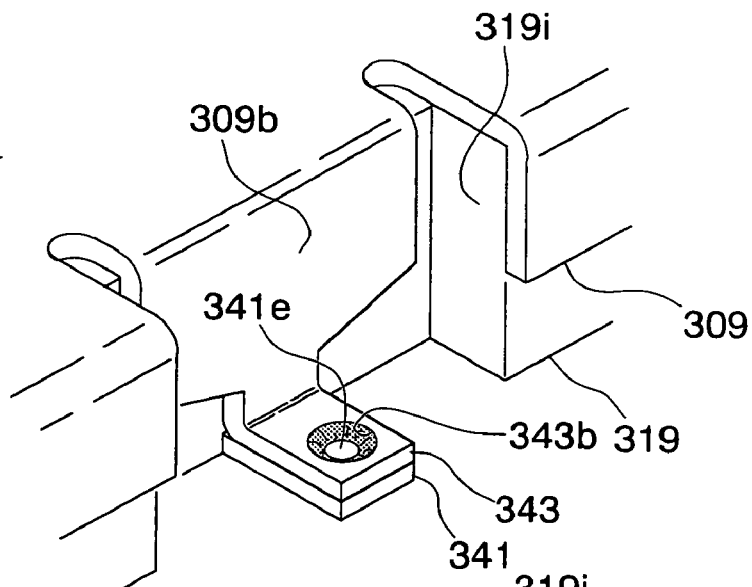
FIG. 60A is a perspective view showing that welding or soldering is performed so as to combine together the electromagnetic shield terminal and cover connection lead by way of a through hole.

Specifically, the welding or soldering is performed on an electromagnetic shield terminal 343 having a through hole 343b and a cover connection lead 341 having an upper surface 341e shown in FIG. 60A, for example. That is, when the electromagnetic shield terminal 343 and the cover connection lead 341 are combined together, the upper surface 341e is partially exposed via the through hole 343b and is then subjected to welding or soldering. In particular, laser welding can be easily performed on the exposed area of the upper surface 341e of the cover connection lead 341 via the through hole 343b of the electromagnetic shield terminal 343. In soldering, the through hole 343b allows an excessive amount of solder paste due to reflow to flow into the through hole 343b, which thus prevents the solder paste from overflowing externally of the cover connection lead 341 and the electromagnetic shield terminal 343.

Figure 60B:
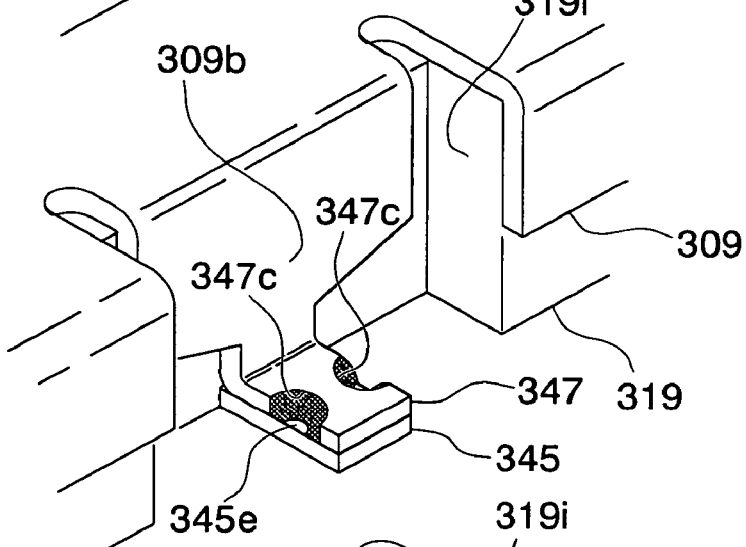
FIG. 60B is a perspective view showing that welding or soldering is performed so as to combine together the electromagnetic shield terminal and cover connection lead by way of cutouts recessed on both sides of the electromagnetic shield terminal.
Figure 60C:
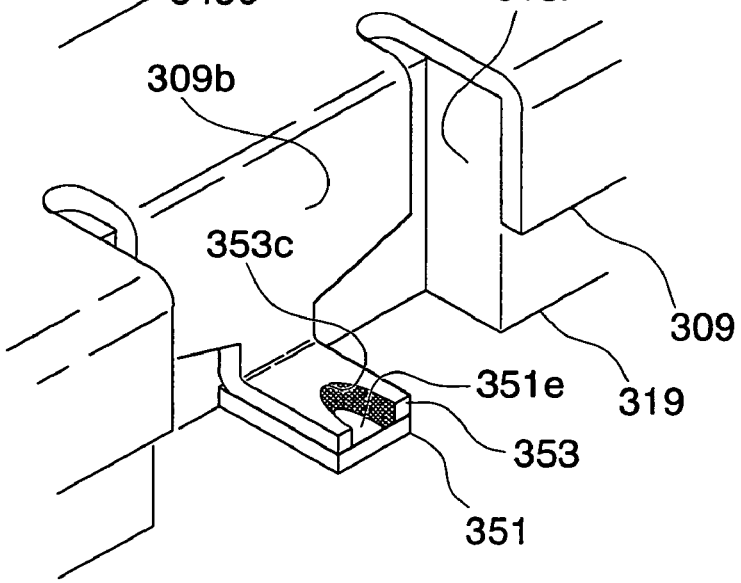
FIG. 60C is a perspective view showing that welding or soldering is performed so as to combine together the electromagnetic shield terminal and cover connection lead by way of a cutout recessed in the tip end of the electromagnetic shield terminal.

Alternatively, the welding or soldering is performed on an electromagnetic shield terminal 347, in which two cutouts 347c are formed on both sides, and a cover connection lead 345 having an upper surface 345a, which is partially exposed via the cutouts 347c as shown in FIG. 60B. Alternatively, the welding or soldering is performed on an electromagnetic shield terminal 353, in which a single cutout 353c is formed on the tip end, and a cover connection lead 351 having an upper surface 351e, which is exposed via the cutout 353c as shown in FIG. 60C.

Figure 61:
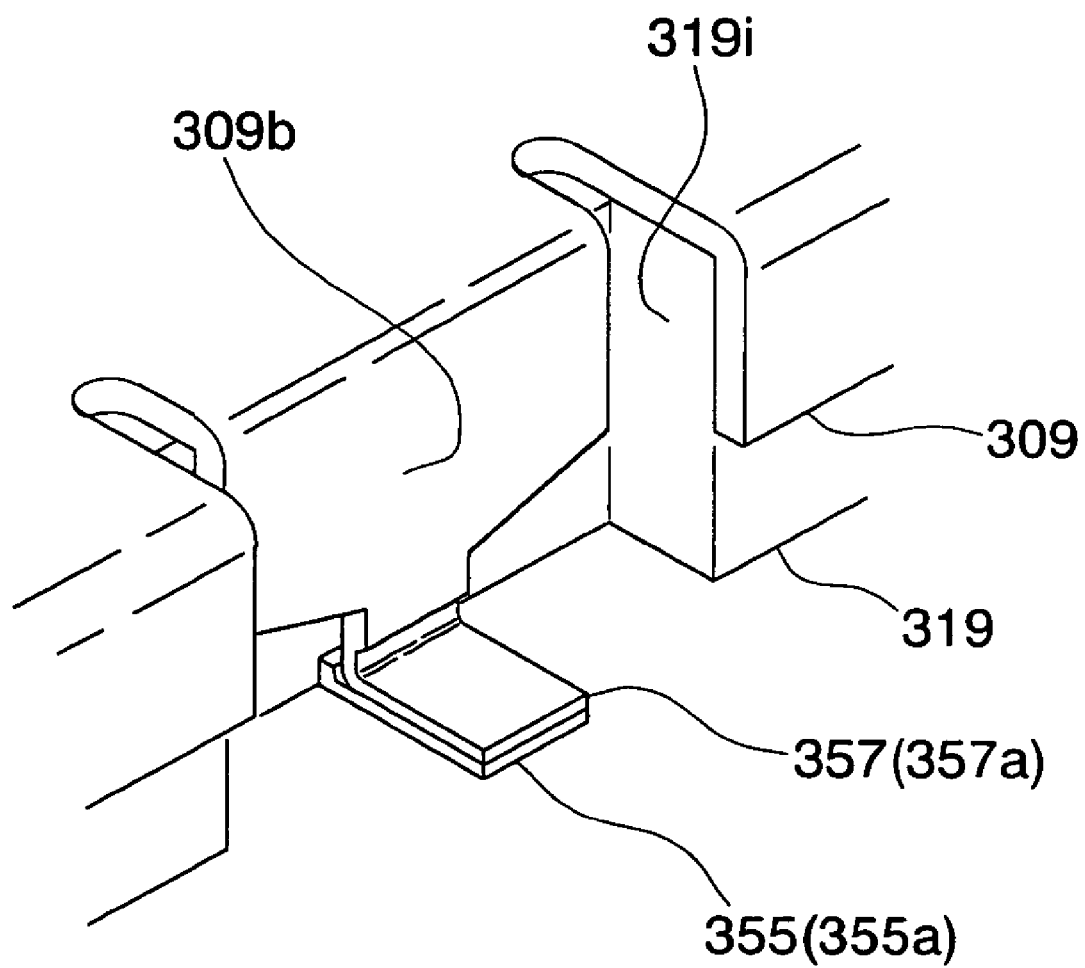
FIG. 61 is a perspective view showing that the electromagnetic shield terminal and cover connection lead are reduced in thickness so as to realize welding or soldering with ease.
Figure 62:
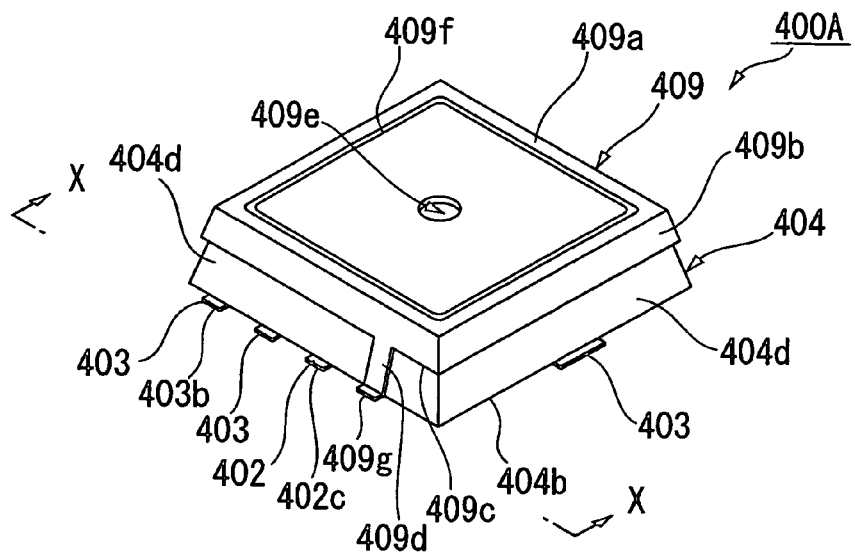
FIG. 62 is a perspective view showing a semiconductor device in accordance with a fifth embodiment of the present invention.
Figure 63:
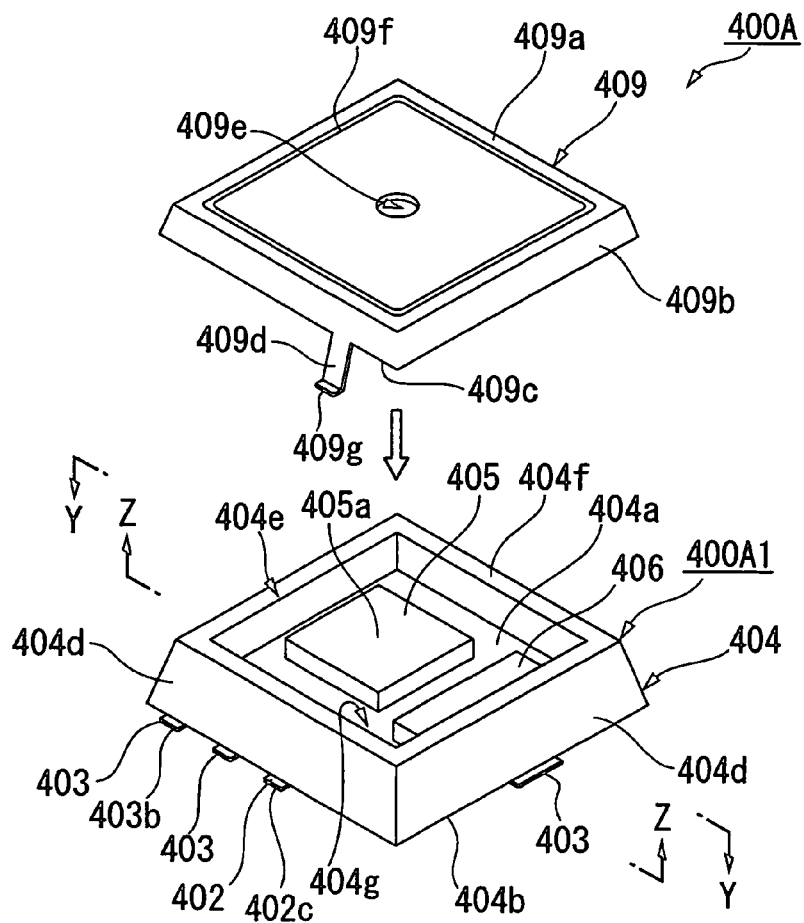
FIG. 63 is an exploded perspective view showing that a substrate is covered with a cover member so as to produce the semiconductor device.
Figure 64:
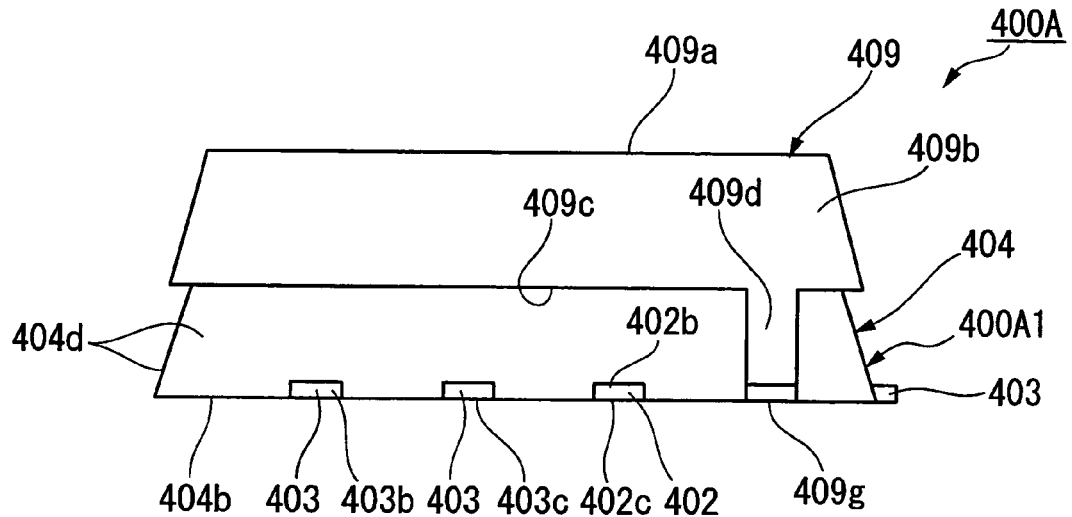
FIG. 64 is a cross-sectional view taken along line X-X in FIG. 62.

Furthermore, the welding or solder is performed in such a way that, as shown in FIG. 61, a tip end 355a of a cover connection lead 355 is combined together with a tip end 357a of an electromagnetic shield terminal 357, wherein the tip ends 355a and 357 are both reduced in thickness by a half compared with the thickness of other portions of the cover connection lead 355 and the electromagnetic shield terminal 357. The tip ends 355a and 357a can be easily reduced in thickness by way of half etching or press working.

The aforementioned modification allows vibration to be transmitted to the cover connection lead 355 and the electromagnetic shield terminal 357, which are joined together; hence, it is possible to perform ultrasonic welding with ease. In addition, the aforementioned modification allows the cover connection lead 355 and the electromagnetic shield terminal 357 to be electrified; hence, it is possible to perform spot welding with ease.

In the fourth embodiment and its variation and modification, the cover connection leads 317, 331, 341, 345, and 355 are connected to the stages 311; but this is not a restriction. The present embodiment simply requires that the cover connection leads 317, 331,341,345, and 355 be fixedly attached to the electromagnetic shield terminals 325, 333, 343, 347, 353, and 355 of the cover members 309, thus reliably joining the semiconductor device 301 and the printed-circuit board.

The stage 311 is not necessarily exposed externally of the molded resin 319 so as to form the planar lower surface 303b of the substrate 303 together with the lower surface of the molded resin 319. The present embodiment simply requires that the stage 311 be positioned below the semiconductor sensor chip 305 and the amplifier 307. That is, the stage 311 can be completely embedded inside of the molded resin 319. The semiconductor device 301 is not necessarily designed such that the semiconductor sensor chip 305 and the amplifier 307 are attached onto the upper surface 303a of the substrate 303. That is, the semiconductor sensor chip 305 is only attached onto the upper surface 303a of the substrate 303.

5. Fifth Embodiment

Next, a fifth embodiment of the present invention will be described in detail with reference to FIGS. 62 to 68, FIGS. 69A and 69B, and FIG. 70. The fifth embodiment is directed to a semiconductor device of a QFN (Quad Flat Non-leaded package) type, which detects sound pressure.

As shown in FIGS. 62 to 67, a semiconductor device 400A is constituted by a stage 401 having a rectangular shape, a plurality of external terminals 402 whose first ends 402a are connected to the stage 401 and whose second terminals 402b extend outwardly, a plurality of leads 403 whose first ends 403a are positioned close to the stage 401 and whose second ends 403b extend outwardly, a resin layer 404, which seals the stage 401, the external terminals 402, and the leads 403 and which has a recess 404 recessed downwardly from an upper surface 404a to a lower surface 404b, a semiconductor sensor chip (or a sound pressure sensor chip) 405 attached onto the upper surface 404a of the resin layer 404, an amplifier 406, which is attached onto the upper surface 404a of the resin layer 404 so as to amplify electric signals output from the semiconductor sensor chip 405, a plurality of wires 407 for electrically connecting together the semiconductor sensor chip 405, the amplifier 406, and the leads 403, and a cover 409 having a dish-like shape, which is attached to the resin layer 404 so as to form a first space 408 for embracing the semiconductor sensor chip 405 and the amplifier 406. In the fifth embodiment, the leads 403 also serve as external terminals; however, for the sake of convenience, the terminals, which are electrically connected to electromagnetic shield terminals 409d of the cover member 409 so as to form an electromagnetic shield, are referred to as the external terminals 402, which are distinct from the leads 403. Incidentally, a substrate 400A1 is constituted by the stage 401, the external terminals 402, and the leads 403, all of which are sealed with the resin layer 404.

Figure 65:
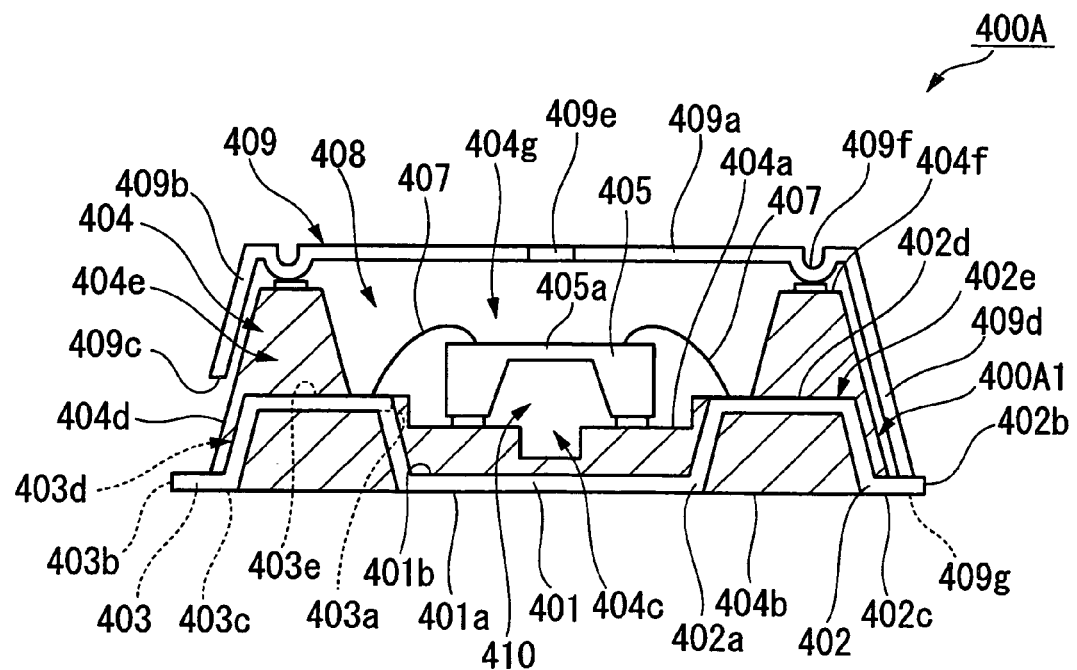
FIG. 65 is a cross-sectional view showing the internal configuration of the semiconductor device shown in FIG. 62.
Figure 66:
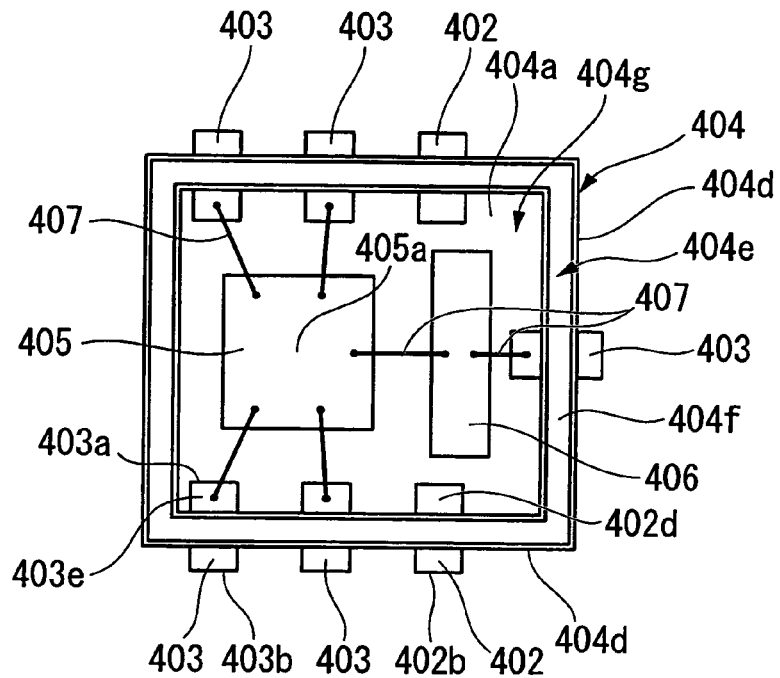
FIG. 66 is a cross-sectional view taken along line Y-Y in FIG. 63.
Figure 67:
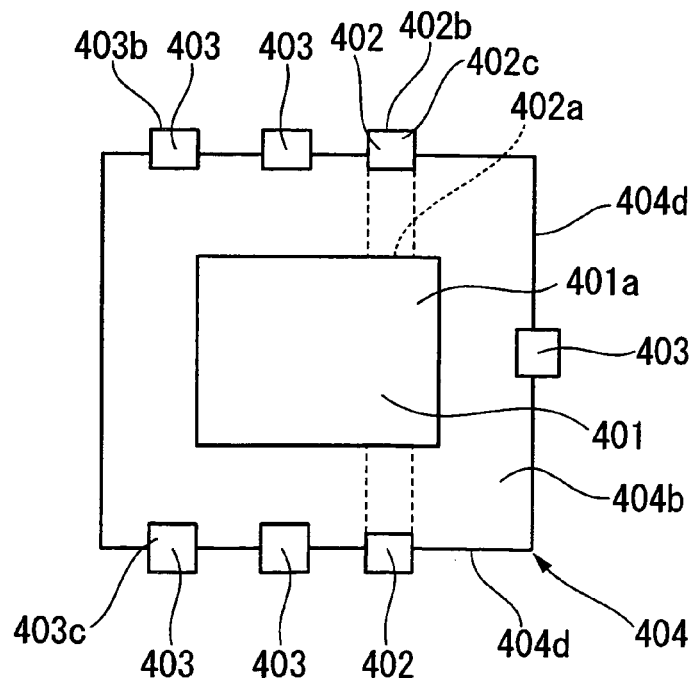
FIG. 67 is a cross-sectional view taken along line Z-Z in FIG. 63.

As shown in FIGS. 65 to 67, the stage 401 is positioned just below the recess 404c of the resin layer 404, wherein a lower surface 401a thereof is partially exposed so as to match a lower surface 404b of the resin layer 404. In addition, the stage 401 is formed in prescribed dimensions and shape in such a way that the semiconductor sensor chip 405 and the amplifier 406, both of which are attached onto the upper surface 404a of the resin layer 404, are positioned above the stage 401 in plan view of the upper surface 404a.

As shown in FIGS. 62 to 67, the external terminals 402 are each shaped in a band-like shape, wherein the first ends 402a are connected to the side ends of the stage 401 and extend outwardly in plan view of the upper surface 401b in directions perpendicular to the side ends of the stage 401. The second ends 402b of the external terminals 402 slightly project externally of sides 404d of the resin layer 404, wherein lower surfaces 402c thereof are positioned substantially in the same plane as the lower surface 404b of the resin layer 404. As shown in FIG. 65, a bent portion 402e having a trapezoidal shape in cross section, which is positioned above and in parallel with the upper surface 401b of the stage 401, is formed between the first end 402a and the second end 402b of the external terminal 402. The bent portion 402e is embedded inside of a ring-shaped projection 404e of the resin layer 404 in such a way that a prescribed part of an upper surface 402d lying in proximity to the first end 402a is exposed and positioned substantially in the same plane as the upper surface 404a of the resin layer 404 (on which the semiconductor sensor chip 405 and the amplifier 406 are arranged), while the other part of the upper surface 402d is sealed inside of the resin layer 404.

Similar to the external terminals 402, the leads 403 are each formed in a band-like shape. Specifically, two leads 403 are arranged for each of the opposite sides 404d of the resin layer 404 and are elongated in parallel with the corresponding external terminal 402 with equal spacing therebetween. In addition, a single lead 403 is arranged on a prescribed side 404d, which is positioned perpendicular to the opposite sides 404d of the resin layer 404 (see FIGS. 66 and 67). All of the aforementioned leads 403 (i.e., five leads 403) slightly project externally of the resin layer 404, wherein the lower surfaces 403c of the second ends 403b are positioned substantially in the same plane as the lower surfaces 402c of the second ends 420b of the external terminals 402. As shown in FIG. 65, a bent portion 403d is formed between the first end 403a and the second end 403b of the lead 403 having an upper surface 403e, whereby the upper surface of the first end 403a is positioned higher than the upper surface of the second end 403b and is substantially positioned in the same plane as the upper surface 404a of the resin layer 404 inside of the ring-shaped projection 404e.

The ring-shaped projection 404e is formed along the four sides 404d of the resin layer 404 so as to vertically project from the upper surface 404a, wherein it has a trapezoidal shape in cross section so that the width thereof is gradually reduced toward a top portion 404f thereof. Thus, an internal recess 404g is formed above the upper surface 404a and inside of the ring-shaped projection 404g. As described above, the recess 440c, which is recessed downwardly from the upper surface 404a to the lower surface 404b, is formed in connection with the internal recess 404g, wherein the opening of the recess 404c is positioned on the upper surface 404a.

The semiconductor sensor chip 405 having a rectangular shape in plan view includes a recess, which has a trapezoidal shape in cross section and opens downwardly approximately at the center thereof. A diaphragm (or a moving electrode) 405 is formed by a thinned portion of the semiconductor sensor chip 405 due to the recess. The diaphragm 405a is subjected to deformation or vibration in response to sound pressure applied thereto. A bridge-resistance circuit (not shown) is formed on the upper surface of the diaphragm 405a, whereby the deformation (or displacement) of the diaphragm 405a is translated into variations of electric resistance, based on which the semiconductor sensor chip 405 produces electric signals. The semiconductor sensor chip 405 is attached onto the upper surface 404a of the resin layer 404 via the adhesive. The recess 404c of the resin layer 404 is formed just below the diaphragm 405a of the semiconductor sensor chip 405, thus forming a second space 410 in an airtight manner by means of the recess of the semiconductor sensor chip 405 and the recess 404c of the resin layer 404.

The amplifier 406 (or an IC such as an operational amplifier) is attached onto the upper surface 404a of the resin layer 404 via the adhesive; hence, the amplifier 406 is arranged in parallel with the semiconductor sensor chip 405.

A plurality of bonding pads are arranged for the semiconductor sensor chip 405 and the amplifier 406. By use of the bonding pads, an electrical connection is established between the semiconductor sensor chip 405 and the amplifier 406, between the semiconductor sensor chip 405, the amplifier 406, and the prescribed portion of the upper surface 403e o the lead 403, which is exposed on the upper surface 404a of the resin layer 404 inside of the first space 408 by way of the wires 407. This ensures an electrical connection established between the semiconductor sensor chip 405, the amplifier 406, and the leads 403.

As shown in FIGS. 62 to 65, the cover member 409 composed of a conductive material such as copper is formed in a dish-like shape whose opening is directed downwardly, wherein the cover member 409 is constituted by a top portion 409a having a rectangular shape, side walls 409b, which hang down from the side ends of the top portion 409a, and electromagnetic shield terminals 409d, which are elongated downwardly from the side ends of the top portion 409a. A through hole 409e is formed approximately at the center of the top portion 409a. A coining portion 409f, which is recessed downwardly, is formed in a rectangular manner along the side ends of the top portion 409a. The lower surface of the coining 409f slightly project downwardly in comparison with the lower surface of the top portion 409a. The cover member 409 is assembled with the substrate 400A1 in such a way that the lower surface of the coining 409f is attached to the top portion 404f of the ring-shaped projection 409e of the resin layer 404, whereby the internal recess 404g of the resin layer 404 is completely covered with the top portion 409a. At this time, the side walls 409b are directed downwardly toward the lower surface 404d along the sides 404d of the resin layer 404. The lower end of the electromagnetic shield terminal 409d has a lower surface 409g, which is formed in parallel with but is positioned below the lower surface of the top portion 409a. The lower end of the electromagnetic shield terminal 409d is arranged adjacent to the external terminal 402 whose second end 402d is exposed externally of the resin layer 404 in such a way that the lower surface 409g is also positioned substantially in the same plane as the lower surface 402c of the external terminal 402.

Next, a manufacturing method of the semiconductor device 400A will be described below.

Figure 68:
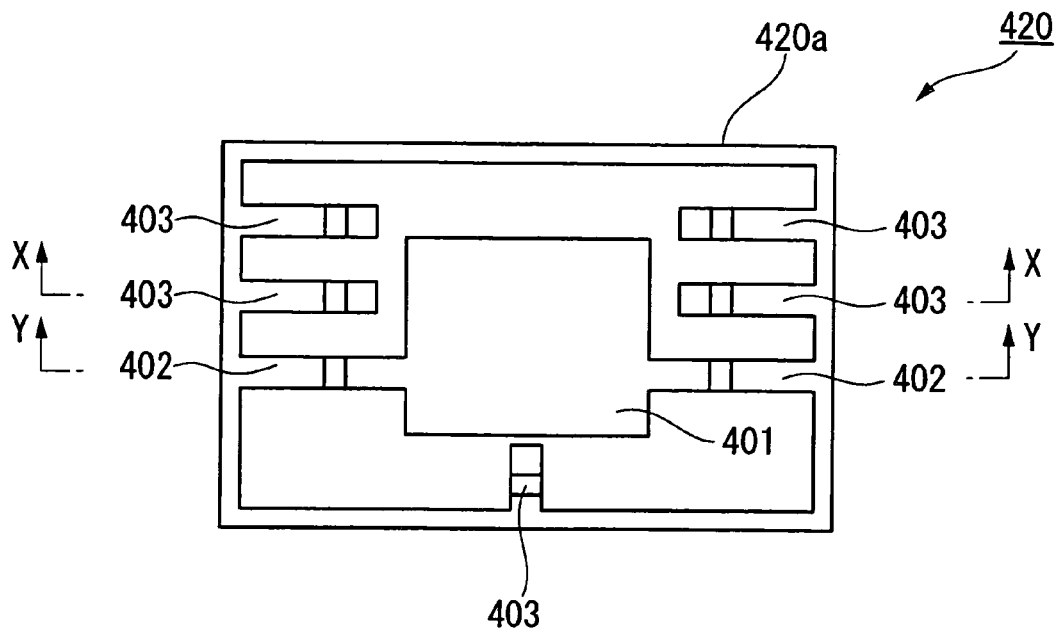
FIG. 68 is a plan view showing a lead frame that is used for producing the semiconductor device.
Figure 69A:
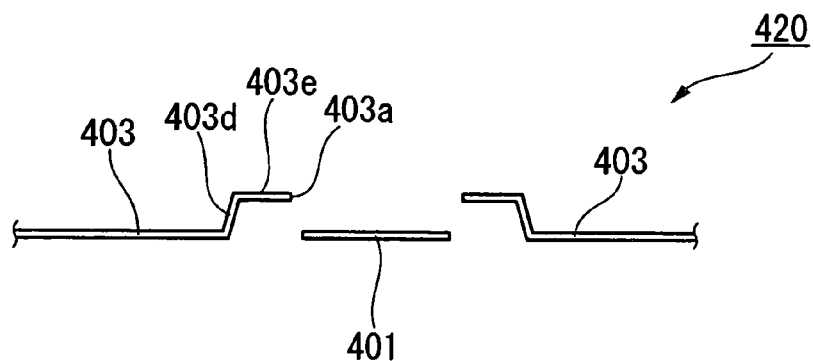
FIG. 69A is a cross-sectional view taken along line X-X in FIG. 68.
Figure 69B:
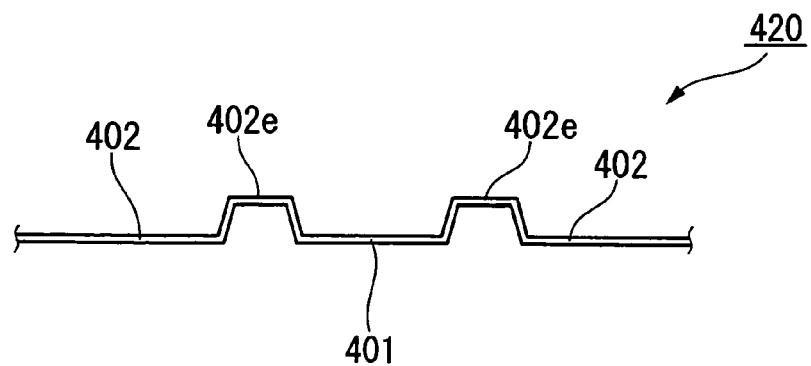
FIG. 69B is a cross-sectional view taken along line Y-Y in FIG. 68.

The semiconductor device 400A is manufactured using a lead frame 420. As shown in FIG. 68 and FIGS. 69A and 69B, the lead frame 420 includes a rectangular frame 420a, a plurality of leads 403, which are inwardly elongated from the opposite sides of the rectangular frame 420a, a plurality of external terminals 402, which are inwardly elongated from the opposite sides of the rectangular frame 420a, and a stage 401, which is connected with and supported by the external terminals 402. The lead frame 420 is produced by performing either press working or etching or both on a thin metal plate. In the present embodiment, the bent portion 403d of the lead 403 and the bent portion 402e of the external terminal 402 are formed simultaneously with the formation of the lead frame 420.

Figure 70:
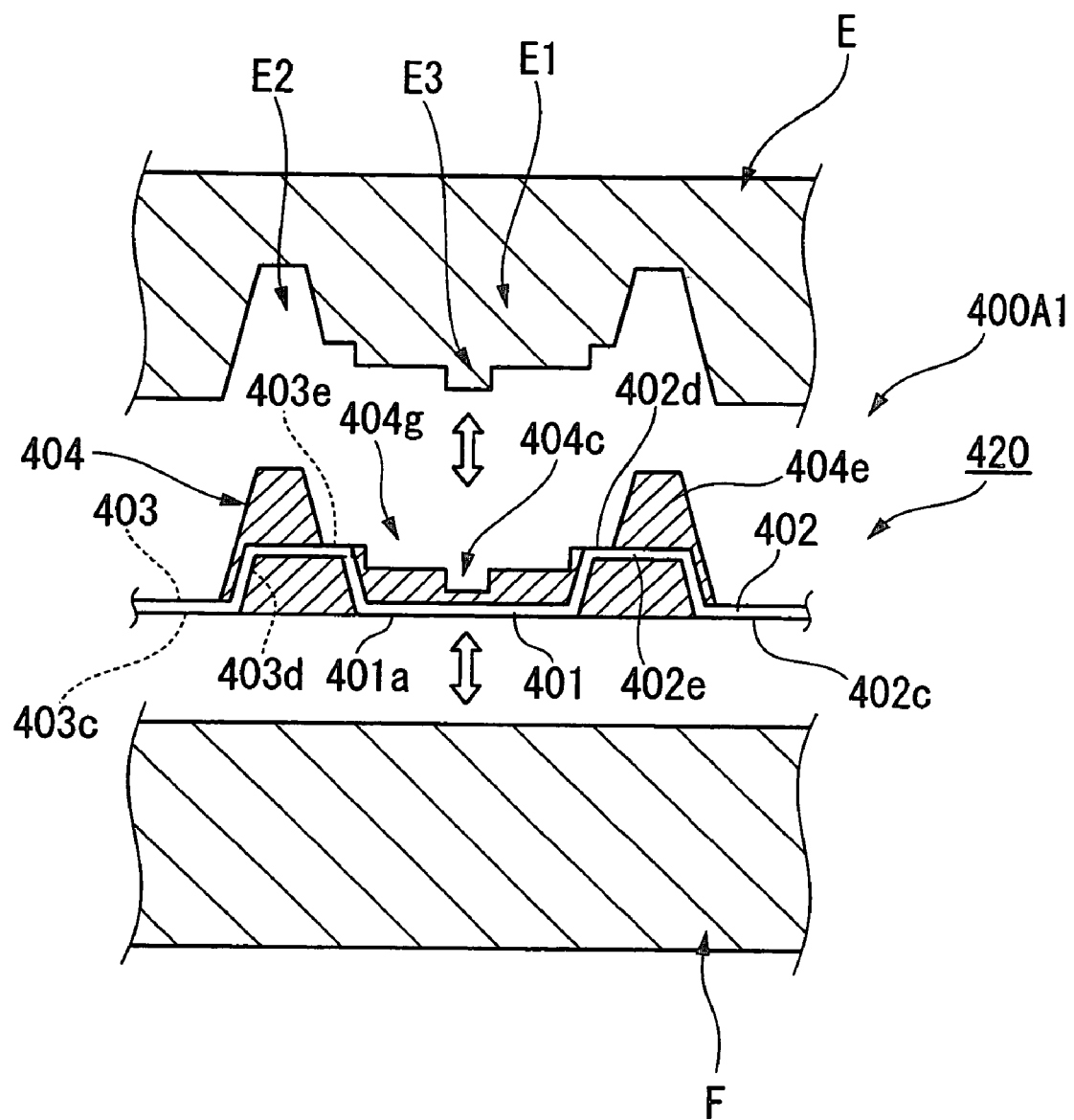
FIG. 70 is a cross-sectional view showing that a lead frame is held between a pair of metal molds so as to form a resin layer.

Next, as shown in FIG. 70, the main portion of the lead frame 420 (which includes the rectangular frame 420a but excludes the prescribed portions of the leads 403 and the external terminals 402) is tightly held and clamped between a pair of metal molds E and F. Specifically, the upper metal mold E has a projection E1 used for the formation of the internal recess 404g of the resin layer 404, a recess E2 used for the formation of the projection 404e and the sides 404d of the resin layer 404, and a projection E3 used for the formation of the recess 404c of the resin layer 404. The lower metal mold F has a planar surface. When the lead frame 420 is clamped between the metal molds E and F, the planar surface of the lower metal mold F is brought into contact with the lower surface 401a of the stage 401, a prescribed portion of the lower surface 403c, which lies outwardly of the bent portion 403d of the lead 403, and a prescribed portion of the lower surface 402c, which lies outwardly of the bent portion 402e of the external terminal 402. In addition, the projection E1 of the upper metal mold E is brought into contact with the prescribed portion of the upper surface 403e, which lies in proximity to the first end 403a slightly away from the bent portion 403d of the lead 403, and the prescribed portion of the upper surface 402d, which lies in proximity to the first end 402a slightly away from the bent portion 402e of the external terminal 402. Furthermore, the tip end of the projection E3 is positioned slightly above the upper surface 401b of the stage 401.

When the lead frame 420 is clamped between the metal molds E and F so as to form a cavity therebetween, a melted resin such as an epoxy resin is injected into the cavity so as to encapsulate the stage 401, the external terminals 402, and the leads 403 therein. After completion of the hardening of the resin, the metal molds E and F are removed from the lead frame 420. Thus, it is possible to form the resin layer 404 in which the internal recess 404g and the recess 404c are formed above the state 401.

In the present embodiment, the lead frame 420 sealed with the resin layer 404 is submersed in a plating solution composed of silver, gold, or palladium, whereby plated layers are formed on the prescribed portion of the upper surface 403e lying close to the first end 403a of the lead 403 and the prescribed portion of the lower surface 403c close to the second end 403b of the lead 403; then, the leads 403 and the external terminals 402, which project externally of the resin layer 404, are subjected to cutting. Incidentally, the plated layers improves the wettability of solder with respect to electrical connection between the leads 403 and the pattern (i.e., connection terminals) of the printed-circuit board (not shown) when the semiconductor device 400A is mounted on the printed-circuit board of a portable telephone and the like and with respect to electrical connection between the semiconductor sensor chip 405, the amplifier 406, and the leads 403 via the wires 407. Incidentally, plated layers are also formed on the lower surfaces 402c of the external terminals 402.

Next, as shown in FIGS. 65 and 66, the semiconductor sensor chip 405 and the amplifier 406 are respectively attached onto the upper surface 404a of the internal recess 404g of the resin layer 404 via the adhesive in such a way that they are positioned adjacent to each other. At this time, the semiconductor sensor chip 405 is positioned relative to the upper surface 404a of the internal recess 404g of the resin layer 404 such that the diaphragm 405a is positioned just above the recess 404c. Then, the wires 407 join the bonding pads of the semiconductor sensor chip 405 and the amplifier 406 as well as the leads 403, thus establishing electrical connection between the semiconductor sensor chip 405, the amplifier 406, and the leads 403.

There is prepared in advance the cover member 409 having a dish-like shape, which includes the top portion 409a, the side walls 409b, and the electromagnetic shield terminals 409d whose lower ends have the lower surfaces 409g. Then, the lower surface of the coining portion 409f of the top portion 409a is attached to the top portion 404f of the ring-shaped projection 404e of the resin layer 404. Herein, the present embodiment does not necessarily require high precision of positioning with respect to the adhesion between the coining portion 409f of the top portion 409a of the cover member 409 and the top portion 404f of the ring-shaped projection 404e of the resin layer 404. That is, they are arranged relative to each other as the side walls 409b of the cover member 409 are positioned along the sides 404d of the resin layer 404. Even when the cover member 409 is arranged relative to the substrate 400A1 without high precision of positioning, the lower surfaces 409g of the lower ends of the electromagnetic shield terminals 409d are positioned substantially in the same plane as the lower surfaces 402c of the external terminals 402 that extend externally of the resin layer 404 by simply adhering the top portion 409a of the cover member 409 onto the top portion 404f of the ring-shaped projection 404e of the resin layer 404, wherein the lower surfaces 402c and 409g are positioned adjacent to each other. That is, the manufacturing of the semiconductor device 400A is completed at completion of the installation of the cover member 409 combined with the substrate 400A1.

Next, the operation and effect of the semiconductor device 400A will be described below.

As described above, the semiconductor device 400A is mounted on the printed-circuit board of a portable telephone, for example. At this time, the lower surfaces 403c of the leads 403 are partially exposed and are positioned substantially in the same plane as the lower surface 404b of the resin layer 404. Hence, when the semiconductor device 400A is mounted on the printed-circuit board, the lower surfaces 403c of the leads 403 are brought into contact with the connection terminals of the printed-circuit board.

In addition, the present embodiment is characterized in that the lower surfaces 402c of the external leads 402, which are exposed externally of the resin layer 404, are positioned adjacent to and substantially in the same plane as the lower surfaces 409g of the lower ends of the electromagnetic shield terminals 409d, wherein similar to the lower surfaces 403c of the leads 403, both of the lower surfaces 402c and 409g are brought into contact with the connection terminals of the printed-circuit board when the semiconductor device 400A is mounted on the printed-circuit board. That is, when the leads 403 are soldered to the printed-circuit board, it is possible to simultaneously solder the lower surfaces 402c and 409g to the connection terminals of the printed-circuit board with ease. With such a simple operation, it is possible to place the cover member 409, the external terminals 402, and the stage 401 substantially at the same potential.

In the semiconductor device 400A mounted on the printed-circuit board, the sound pressure of the externally generated sound is transmitted into the first space 408 via the through hole 409e of the cover member 409 so as to reach the diaphragm 405a of the semiconductor sensor chip 405, which thus vibrates so as to cause deformation (or displacement) in response to the sound pressure applied thereto. The bridge-resistance circuit converts the deformation of the diaphragm 405a into variations of electric resistance, based on which the semiconductor sensor chip 405 produces electric signals. The amplifier 406 amplifies electric signals output from the semiconductor sensor chip 405. This makes it possible to accurately detect the sound pressure. The operation of the semiconductor device 400A is also affected by electromagnetic noise, which may be externally generated in addition to the sound pressure. The electromagnetic noise is transmitted through the resin layer 404 toward the semiconductor sensor chip 405, thus causing unexpected vibration of the diaphragm 405a.

To cope with the aforementioned drawback, the semiconductor device 400A is designed such that, when it is mounted on the printed-circuit board, the cover member 409 comes in contact with the external terminals 402 of the substrate 400A1, thus placing the cover member 409, the external terminals 402, and the stage 401 substantially at the same potential. Hence, the semiconductor sensor chip 405 and the amplifier 406 arranged inside of the first space 408 are embraced within an electromagnetic shield, which is formed by the top portion 409a and the side walls 409b of the cover member 409 and the stage 401. The electromagnetic shield reliably blocks electromagnetic noise, which is transmitted through the resin layer 404, from reaching the semiconductor sensor chip 405. As a result, the semiconductor device 400A offers high reliability with respect to the detection of the sound pressure without being affected by electromagnetic noise.

In the semiconductor device 400A (which is mounted on the printed-circuit board of a portable telephone, for example), both of the lower surfaces 402c of the external terminal 402 and the lower terminals 409g of the electromagnetic shield terminals 409d, which are positioned adjacent to and substantially in the same plane as the lower surfaces 402c, are electrically connected together by way of soldering. Thus, it is possible to form the electromagnetic shield embracing the semiconductor sensor chip 405 and the amplifier 406. The semiconductor device 400A does not require that the electromagnetic shield be formed by establishing electrical connection with the cover member 409 when it is manufactured; hence, compared with the conventionally-known semiconductor device, it is possible to reduce the work time required for the installation of the cover member 409, which does not need a high precision of positioning relative to the substrate 400A1. Thus, it is possible to reduce the manufacturing cost.

The cover member 409 is constituted by the top portion 409a, the side walls 409b, and the electromagnetic shield terminals 409d, wherein the lower surface of the top portion 409a is simply brought into contact with the top portion 404f of the ring-shaped projection 404e of the resin layer 404, so that the lower surface 402c of the external terminal 402 is positioned adjacent to and is placed substantially in the same plane as the lower surface 409g of the electromagnetic shield terminal 409d. Thus, it is possible to connect together the lower surfaces 402c and 409g with ease when the semiconductor device 400A is mounted on the printed-circuit board; hence, it is possible to reliably and easily form the electromagnetic shield. In addition, the four sides 404d of the resin layer 404 are covered with the four side walls 409b of the cover member 409 so as to reinforce the electromagnetic shield; hence, it is possible to reliably protect the semiconductor sensor chip 405 by way of the electromagnetic shield.

The semiconductor device 400A is characterized in that the stage 401 is increased in size in comparison with the semiconductor sensor chip 405 in plan view of the upper surface 404a of the resin layer 404; hence, it is possible to reliably embrace the semiconductor sensor chip 401 by way of the electromagnetic shield, which is formed by means of the cover member 409 and the stage 401. This reliably protects the semiconductor sensor chip 405 from electromagnetic noise. As a result, the semiconductor device 400A has high reliability in that the semiconductor sensor chip 405 can accurately detect the sound pressure applied thereto.

It is possible to modify the fifth embodiment in a variety of ways, which will be described below.

(1) The external terminals 402, which are connected to the stage 401, are arranged separately from the leads 403; but this is not a restriction. That is, it is possible to redesign the semiconductor device 400A such that without using the stage 401 and the external terminals 402, only the leads 403 are used as external terminals. Alternatively, only the electromagnetic shield terminals 409d of the cover member 409 are connected to the connection terminals of the printed-circuit board, on which the semiconductor device 400A is mounted, so as to form the electromagnetic shield.

Figure 71:
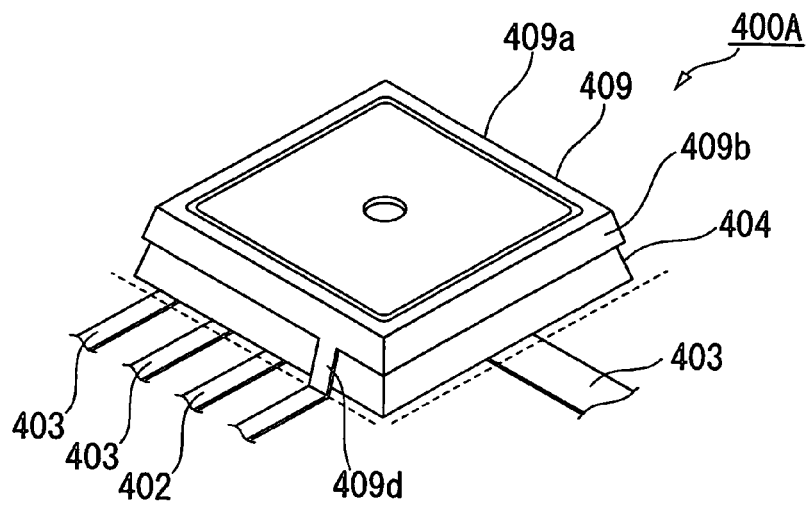
FIG. 71 is a perspective view showing a modification of the semiconductor device, which is partially modified in connection with cutting of external terminals, leads, and electromagnetic shield terminals.
Figure 72:
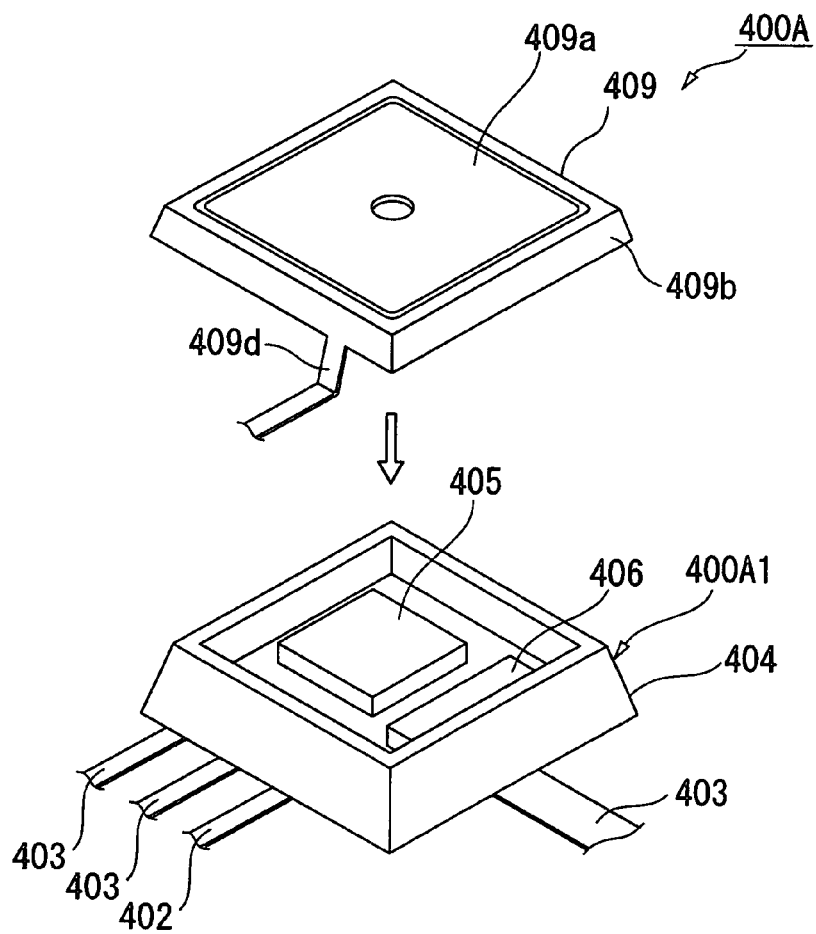
FIG. 72 is an exploded perspective view showing that the substrate is covered with the cover member, which is partially modified in respect of the electromagnetic shield terminals.
Figure 73:
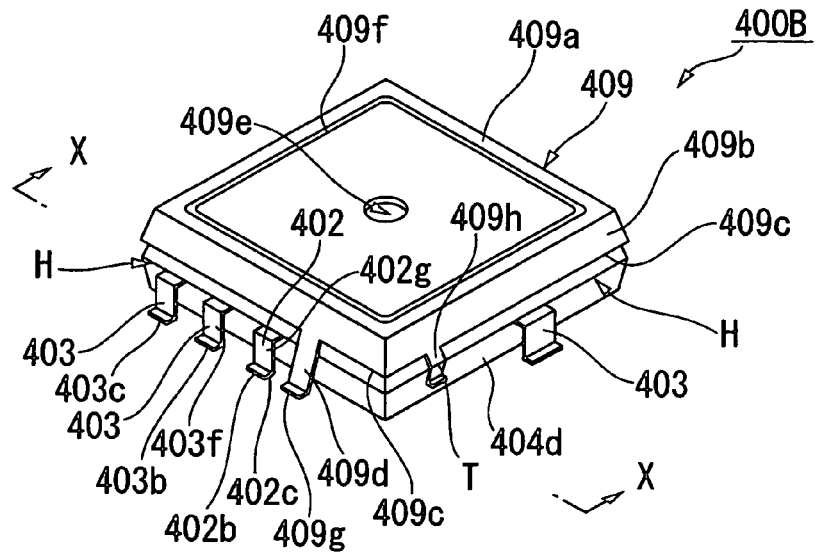
FIG. 73 is a perspective view showing a semiconductor device in accordance with a first variation of the fifth embodiment.
Figure 74:
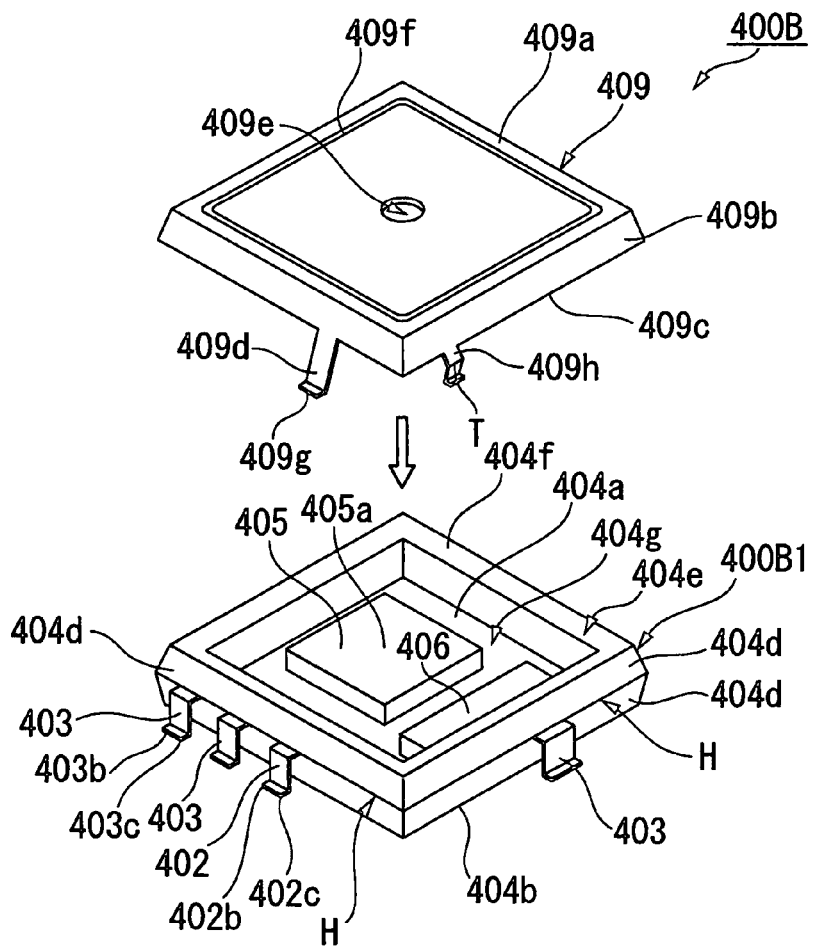
FIG. 74 is an exploded perspective view showing that a substrate is covered with a cover member so as to form the semiconductor device of FIG. 73.
Figure 75:
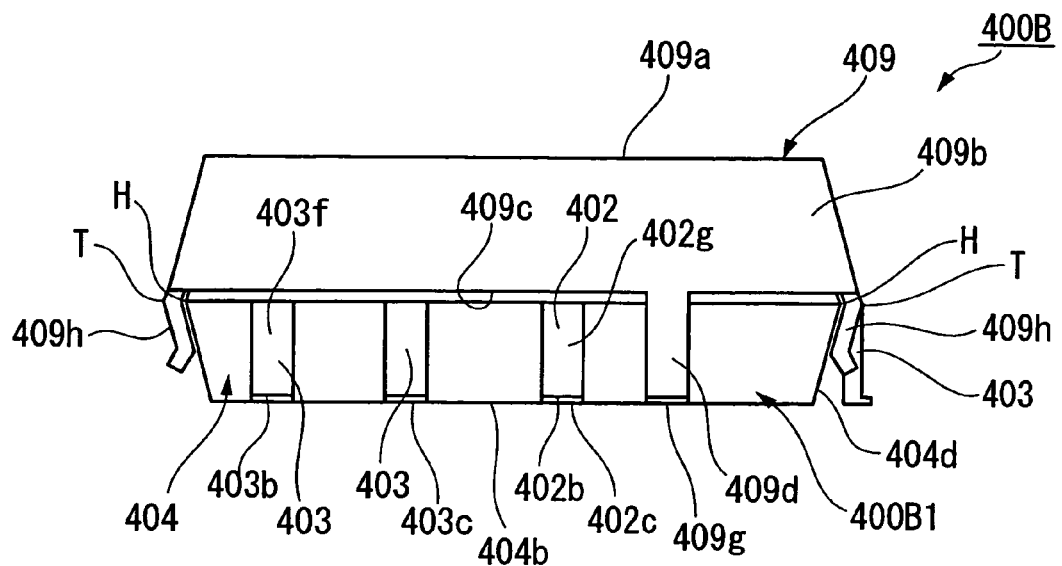
FIG. 75 is a cross-sectional view taken along line X-X in FIG. 73.
Figure 76:
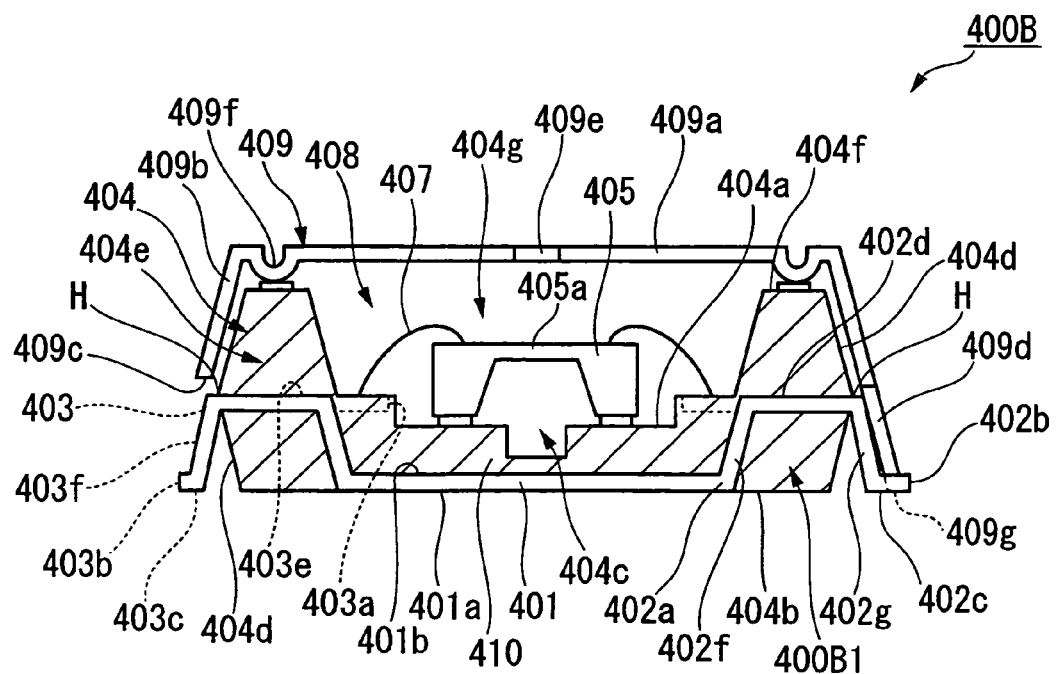
FIG. 76 is a cross-sectional view of the semiconductor device of FIG. 73.

(2) The external terminals 402 and the leads 403 are not necessarily subjected to cutting after completion of the formation of the resin layer 404 by use of the metal molds E and F. That is, it is possible to change the manufacturing method in such a way that, as shown in FIGS. 71 and 72, before the cutting of the external terminals 402 and the leads 403, the substrate 400A1 is covered with the cover member 409 having the electromagnetic shield terminals 409d whose lower ends are not limited in dimensions and are still elongated, wherein simultaneously with the cutting of the external terminals 402 and the leads 403, the lower ends of the electromagnetic shield terminals 409d are subjected to cutting, thus completing the manufacturing of the semiconductor device 400A.

(3) The cover member 409 is not necessarily constituted by the top portion 409a, the side walls 409b, and the electromagnetic shield terminals 409d. That is, the cover member 409 is modified not to form the side walls 409b so that the electromagnetic shield terminals 409d are directly connected to the side ends of the top portion 409a. This modification may slightly reduce the electromagnetic shield effect in the semiconductor device 400A because the cover member 409 does not include the side walls 409b; however, this modification can demonstrate effects substantially similar to the foregoing effects of the semiconductor device 400A.

(4) The lower surface of the coining portion 409f of the cover member 409 is attached to the top portion 404f of the ring-shaped projection 404e of the resin layer 404 via the adhesive; but this is not a restriction. That is, the coining portion 409f is not necessarily formed in the cover member 409; hence, the planar lower surface of the top portion 409a is adhered onto the top portion 404f of the ring-shaped projection 404e of the resin layer 404.

(5) The sound pressure of the externally generated sound is transmitted into the first space 408 via the through hole 409e of the top portion 409a of the cover member 409; but this is not a restriction. Instead of the through hole 409e, another hole is formed in the stage 401 so as to communicate with the external space via the recess 404c of the resin layer 404, wherein the sound pressure is transmitted to the diaphragm 405a via the hole and the recess 404c. That is, the first space 408 is closed in an airtight manner, while the second space 410 is partially opened so as to communicate with the exterior of the semiconductor device 400A, whereby the semiconductor sensor chip 405 detects the sound pressure transmitted thereto via the second space 410.

(6) The lower surface 401a of the stage 401 covering the lower side of the semiconductor sensor chip 405 is exposed and is placed substantially in the same plane as the lower surface 404b of the resin layer 404; but this is not a restriction. That is, the stage 401 can be positioned in proximity to the upper surface 404a of the resin layer 404 so that the lower surface 401a thereof is embedded inside of the resin layer 404. In addition, the bottom of the recess 404c of the resin layer 404 is not necessarily positioned slightly above the upper surface 401b of the stage 401; that is, the bottom of the recess 404c can be positioned substantially at the same level as the upper surface 401b of the stage 401.

(7) The semiconductor device 400A is not necessarily equipped with both of the semiconductor sensor chip 405 and the amplifier 406. That is, the semiconductor device 400A can be equipped with only the semiconductor sensor chip 405. In this case, an amplifier is independently arranged on the printed-circuit board of a portable telephone so as to amplify electric signals output from the semiconductor sensor chip 405, which is incorporated into the semiconductor device 400A.

(8) The semiconductor sensor chip 405 is not necessarily attached onto the upper surface 404a of the resin layer 404 in such a way that the lower surface thereof is positioned opposite to the upper surface 404a. That is, the upper surface of the semiconductor sensor chip 405 can be positioned opposite to the upper surface 404a of the resin layer 404, wherein the diaphragm 405a can be positioned in proximity to the recess 404c of the resin layer 404.

(9) The cover member 409 has the through hole 409e, which is positioned just above the diaphragm 405a of the semiconductor sensor chip 405; but this is not a restriction. The present embodiment simply requires that the through hole 409e be formed so as to establish communication between the first space 408 and the external space. For example, the through hole 409e can be horizontally shifted in position slightly away from the diaphragm 405a, wherein without causing a reduction in the detection accuracy regarding the sound pressure, it is possible to prevent the water content from being directly transmitted to the diaphragm 405a.

Next, a first variation of the fifth embodiment will be described in detail with reference to FIGS. 73 to 77. The first variation is directed to a semiconductor device of a QFP (Quad Flat Package) type, which is manufactured using a lead frame so as to detect sound pressure of the externally generated sound. Herein, parts identical to those used in the foregoing drawings are designated by the same reference numerals; hence, the description thereof will be omitted as necessary.

That is, a semiconductor device 400B of the first variation differs from the semiconductor device 400A in constitution with respect to the external terminals 402, the leads 403, the resin layer 404, and the cover member 409. As shown in FIGS. 73 to 76, the prescribed portion of the lead 403 embedded in the resin layer 404 is horizontally elongated, and the extended portion of the lead 403, which extends externally of the side 404d of the resin layer 404, is bent downwardly toward the lower surface 404b of the resin layer 404 so as to form the hung-down portion 403f. The lower end of the hung-down portion 403f is horizontally bent so as to form the lower surface 403c, which is positioned substantially in the same plane as the lower surface 404b of the resin layer 404. A substrate 400B1 is constituted by the stage 401, the external terminals 402, and the leads 403, all of which are sealed with the resin layer 404.

The external terminal 402 has the bent portion 402f, which lies between the first end 402a connected to the stage 401 and the second end 402b and which is sealed with the resin layer 404. The upper surface 402d of the bent portion 402f is positioned substantially in the same plane as the upper surface 403e of the first end 403a of the lead 403. Similar to the lead 403, the extended portion of the external terminal 402, which is extended externally of the resin layer 404, is bent downwardly toward the lower surface 404b of the resin layer 404 so as to form a hung-down portion, namely, a hung-down terminal 402g. The lower surface 402c of the hung-down terminal 402g is positioned substantially in the same plane as the lower surface 404b of the resin layer 404.

A bent point H is marked at a prescribed position of the side 404d of the resin layer 404, which is positioned substantially in the same plane as the upper surface 402d of the bent portion 402f and the upper surface 403e of the first end 403a of the lead 403. That is, the lower portion of the side 404d below the bent point H is inwardly inclined with a slope. The lower surface 403c of the hung-down portion 403f of the lead 403, the lower surface 402c of the hung-down terminal 402g (included in the external terminal 402), and the lower surface 401a of the stage 401 are all positioned substantially in the same plane as the lower surface 404b of the resin layer 404.

The cover member 409 adapted to the semiconductor device 400B is constituted by the top portion 409a whose lower surface is adhered onto the top portion 404f of the ring-shaped projection 404e of the resin layer 404, the side walls 409b, which extend downwardly from the side ends of the top portion 409a so as to cover the sides 404d of the resin layer 404, and the electromagnetic shield terminals 409d, which are formed in such a way that the prescribed parts of the lower ends 409c of the opposite side walls 409b are elongated downwardly. Since both of the second ends 402b of the external terminals 402 and the second ends 403b of the leads 403 hang down toward the lower surface 404b of the resin layer 404, the lower ends of the electromagnetic shield terminals 409d can be further elongated downwardly in such a way that the lower surfaces 409g thereof are positioned adjacent to and substantially in the same plane as the lower surfaces 402c of the hung-down terminals 402g (included in the external terminal 402).

In addition, the cover member 409 has a pair of engagement portions 409h, which are formed in such a way that the prescribed parts of the opposite side walls 409b are elongated downwardly. When the cover member 409 is combined together with the substrate 400B1 sealed with the resin layer 404, the lower ends of the engagement portions 409h are positioned above the lower surface 404b of the resin layer 404, and the engagement portions 409h as a whole are positioned along and engaged with the corresponding sides 404d of the resin layer 404. Specifically, each of the engagement portions 404h is bent at a bent point T, which matches the bent point H of the resin layer 404.

Next, a manufacturing method of the semiconductor device 400B will be described below.

Figure 77:
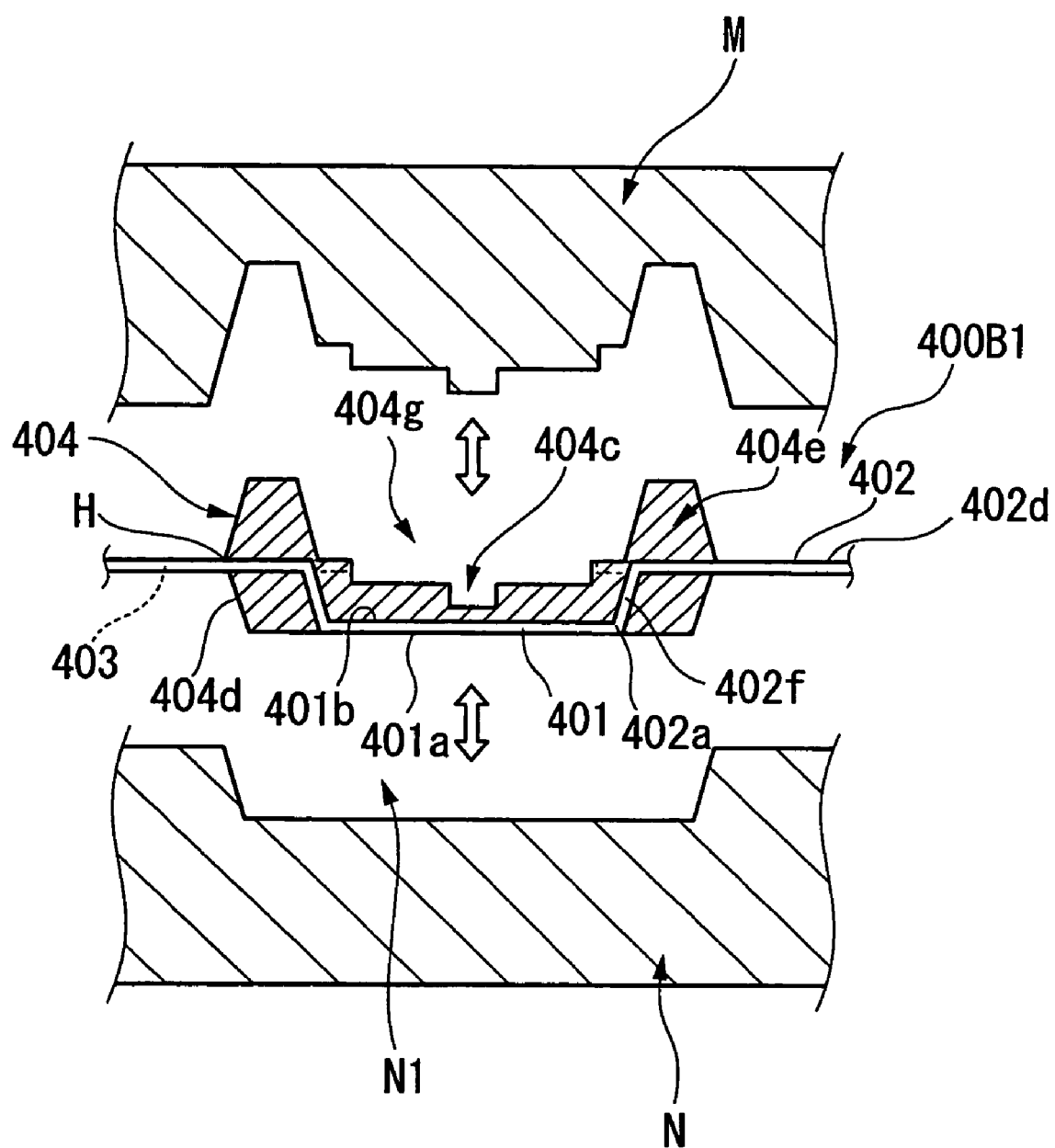
FIG. 77 is a cross-sectional view showing that a lead frame is sandwiched between metal molds so as to form a resin layer.

The semiconductor device 400B is manufactured using the lead frame 420 shown in FIG. 68. In the lead frame 120, as shown in FIG. 77, the external terminal 402 includes the bent portion 402f, and the upper surface 402d of the second end 402b is positioned above the upper surface 401b of the stage 401. In this state, however, the hung-down portion 403f of the lead 403 and the hung-down terminal 402g of the external terminal 402, both of which extend externally of the resin layer 404 and are bent downwardly, are not formed in the lead frame 420; hence, the second ends 403b and 402b are horizontally elongated.

The lead frame 420 is subjected to clamping such that the rectangular frame 420a and the prescribed portions of the external terminal 402 and the lead 403 are tightly held between a pair of metal molds M and N. Specifically, the lower metal mold M has a recess N1 whose interior walls are inclined so as to form slopes on the lower portion of the sides 404d of the resin layer 404 below the bent point H. The upper metal mold M is shaped substantially identical to the aforementioned upper metal mold E (see FIG. 70).

After completion of the clamping of the lead frame 420 by use of the metal molds M and N, a melted resin is injected into a cavity formed between the metal molds M and N. Then, after completion of the hardening of the resin, the metal molds M and N are removed so that the resin layer 404 is formed.

In this state, the extended portions of the second ends 403b and 402b of the lead 403 and the external terminal 402 are subjected to cutting so as to leave prescribed lengths therefor; then, the second ends 403b and 402b are bent downwardly so as to form the hung-down portion 403f and the hung-down terminal 402g, wherein the lower surface 403c of the hung-down portion 403f and the lower surface 402c of the hung-down terminal 402 are positioned substantially in the same plane as the lower surface 404b of the resin layer 404. Then, the semiconductor sensor chip 405 and the amplifier 406 are adhered onto the upper surface 404a of the resin layer 404 and are subjected to wire bonding using the wires 407.

The cover member 409, which includes the top portion 409a, the side walls 409b, the electromagnetic shield terminals 409d, and the engagement portions 409h, is combined with the substrate 400B1 sealed with the resin layer 404 in such a way that the lower surface of the top portion 409a is brought into contact with and is adhered onto the top portion 404f of the ring-shaped projection 404e of the resin layer 404. Herein, the cover member 409 is assembled together with the resin layer 404 in such a way that the lower ends of the engagement portions 409h are firstly brought into contact with and are pressed by the sides 404d of the resin layer 404, whereby the engagement portions 409h are elastically deformed outwardly. This places the lower ends of the engagement portions 409h below the bent point H of the resin layer 404; then, when the lower surface of the top portion 409a is brought into contact with the top portion 404f of the ring-shaped projection 404e of the resin layer 404, the bent point T of the engagement portions 409h matches the bent point H of the resin layer 404. In this state, the interior surface of the engagement portion 409h comes in two-dimensional contact with the side 404d of the resin layer 404, wherein they are pressed together due to the elasticity of the engagement portion 409h, so that the cover member 409 is attached to the resin layer 404. In addition, the lower surface 409g of the electromagnetic shield terminal 409d is positioned adjacent to and substantially in the same plane as the lower surface 402c of the hung-down terminal 402g of the external terminal 402. As described above, the manufacturing of the semiconductor device 400B is completed when the cover member 409 is completely combined with the substrate 400B1 sealed with the resin layer 404.

Next, the operation and effect of the semiconductor device 400B will be described below.

The semiconductor device 400B can be reliably mounted on the printed-circuit board in such a way that the lower surface 402c of the hung-down terminal 402g of the external terminal 402 and the lower surface 409g of the electromagnetic shield terminal 409d of the cover member 409, both of which are positioned substantially in the same plane, are connected together via soldering, whereby the cover member 409 having conductivity and the stage 401 are placed substantially at the same potential. Thus, it is possible to form the electromagnetic shield embracing the semiconductor sensor chip 405 by means of the cover member 409 and the state 401.

That is, with a simple operation in which the semiconductor device 400B is mounted on the printed-circuit board such that the lower surface 402c of the hung-down terminal 402g of the external terminal 402 and the lower surface 409g of the electromagnetic shield terminal 409d of the cover member 409 are electrically connected to the connection terminals of the printed-circuit board, it is possible to form the electromagnetic shield embracing the semiconductor sensor chip 405. Since the cover member 409 is simply combined together with the substrate 400B1 sealed with the resin layer 404 so as to reliably form the electromagnetic shield, it is possible to reduce the manufacturing cost with respect to the semiconductor device 400B.

The cover member 409 is simply and reliably combined together with the resin layer 404 by means of the engagement portions 409h, wherein the lower surface 409g of the electromagnetic shield terminal 409d is positioned substantially in the same plane as the lower surface 402c of the hung-down terminal 402g. Hence, it is possible to prevent the cover member 409 from being unexpectedly separated from the resin layer 404.

The first variation of the fifth embodiment can be further modified in a variety of ways, which will be described below.

(1) All of the lower surface 403c of the hung-down portion 403f of the lead 403, the lower surface 402c of the hung-down terminal 402g of the external terminal 402, and the lower surface 409g of the electromagnetic shield 409d of the cover member 409 are not necessarily positioned in the same plane as the lower surface 404b of the resin layer 404. That is, they can be positioned in the same plane but below the lower surface 404b of the resin layer 404.

Figure 78:
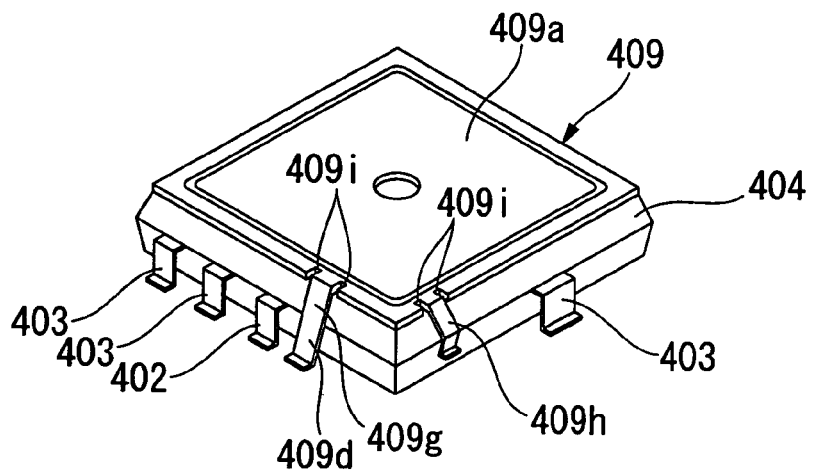
FIG. 78 is a perspective view showing a semiconductor device according to a further modification of the first variation of the fifth embodiment.
Figure 79:
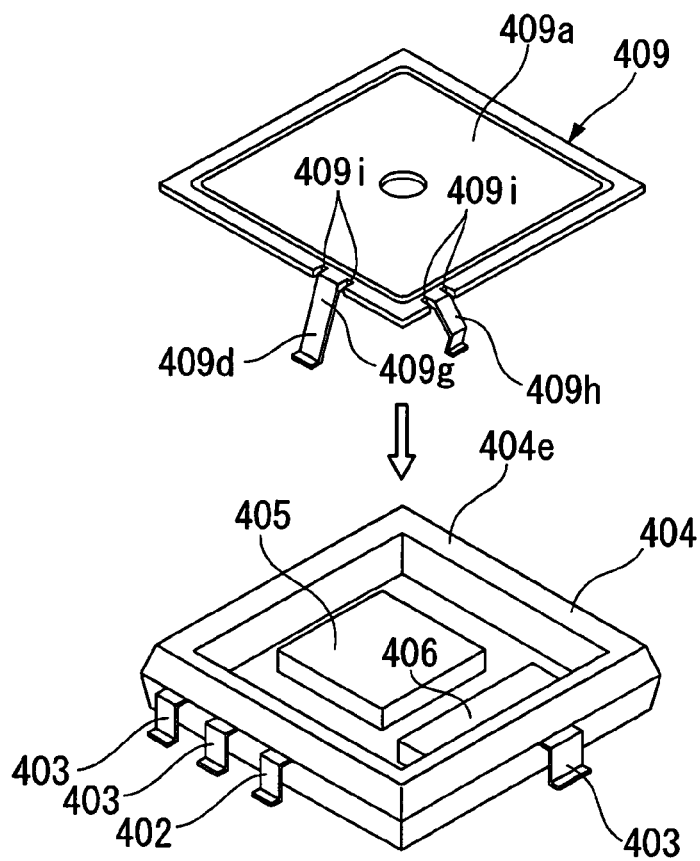
FIG. 79 is an exploded perspective view showing that a cover member is assembled with a substrate sealed with a resin layer so as to produce the semiconductor device of FIG. 78.
Figure 80:
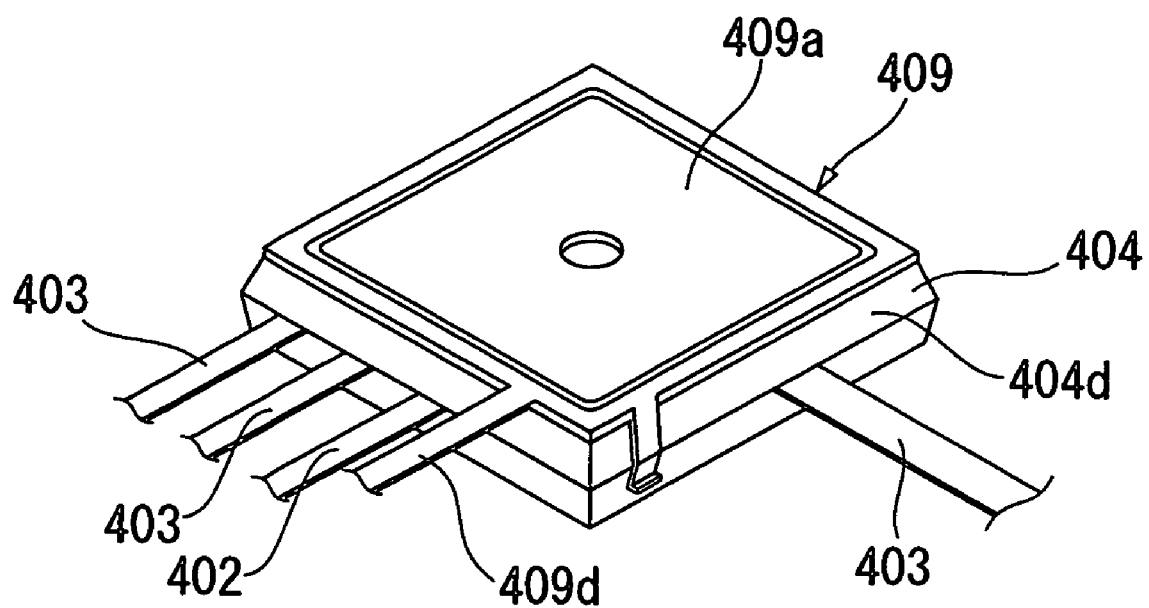
FIG. 80 is a perspective view showing that the semiconductor device is partially modified in terms of a manufacturing method therefor.

(2) In the manufacturing method, after the resin layer 404 is formed using the metal molds M and N, the lead 403 and the external terminal 402 are subjected to cutting; the hung-down portion 403f of the lead 403 and the hung-down terminal 402g of the external terminal 402 are formed; furthermore, the cover member 409 is completely formed in advance so as to include the top portion 409a, the side walls 409b, the electromagnetic shield terminals 409d, and the engagement portions 409h. Instead, as shown in FIGS. 78 and 79, the cover member 409 can be redesigned so as not to have the side walls 409b, wherein the electromagnetic shield terminals 409d and the engagement portions 409h are elongated from the side ends of the top portion 409a. Alternatively, as shown in FIG. 80, before the cutting of the leads 403 and the external terminals 402, the cover member 409, in which the electromagnetic shield terminals 409d are horizontally elongated without limiting the lengths thereof, is assembled together with the substrate 400B1 sealed with the resin layer 404; then, the electromagnetic shield terminals 409d are subjected to cutting simultaneously with the cutting of the leads 403 and the external terminals 402, wherein the hung-down portions 403f and the hung-down terminals 402g are formed in prescribed shapes. As shown in FIGS. 78 and 79, cutout portions 409i can be formed at the connected portions of the electromagnetic shield terminals 409d and the engagement portions 409h, which are connected to the top portion 409a of the cover member 409. Due to the formation of the cutouts 409a, even when the electromagnetic shield terminals 409d and the engagement portions 409h are subjected to elastic deformation, it is possible to prevent the top portion 409a from being unexpectedly deformed, and it is possible to prevent the top portion 409a from being unexpectedly separated from the top portion 404f of the ring-shaped projection 404e of the resin layer 404 irrespective of the adhesion therebetween.

Next, a second variation of the fifth embodiment will be described with reference to FIGS. 81 and 82. The second variation is directed to a semiconductor device 400C of a QFP type, which is produced using a lead frame, wherein parts identical to those of the semiconductor device 400B are designated by the same reference numerals; hence, the description thereof will be omitted as necessary.

Figure 82:
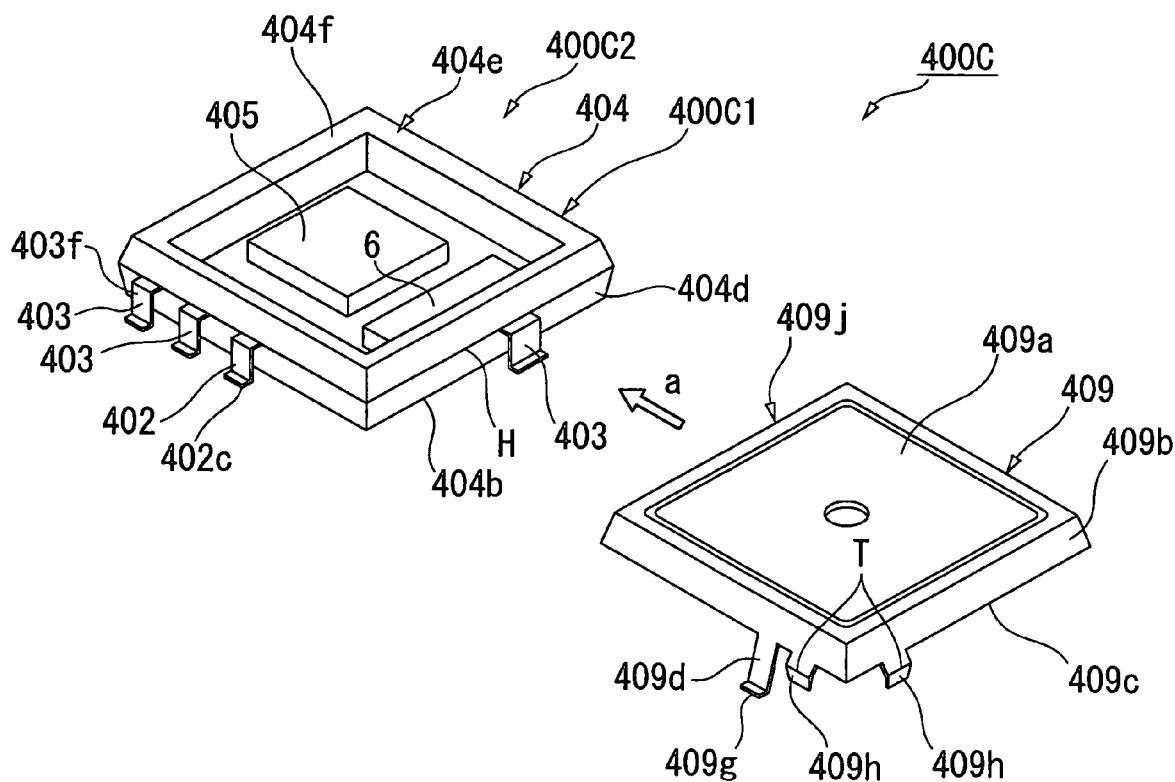
FIG. 82 is a perspective view showing that a cover member is assembled with a substrate sealed with a resin layer so as to produce the semiconductor device of FIG. 81.

In contrast to the semiconductor device 400B in which the substrate 400B1 sealed with the resin layer 404 is covered with the cover member 409 so that the electromagnetic shield terminals 409d are positioned adjacent to the external terminals 402, the semiconductor device 400C is designed such that, as shown in FIG. 82, the cover member 409 is moved horizontally in a direction "a" and is then combined with a substrate 400C1 sealed with the resin layer 404 so that the electromagnetic shield terminals 409d are positioned adjacent to the external terminals 402. That is, the semiconductor device 400C differs from the semiconductor device 400B in terms of the constitution of the cover member 409. The substrate 400C1 is constituted by the stage 401, the external terminals 402, and the leads 403, all of which are sealed with the resin layer 404. Incidentally, reference numeral 400C2 designates a main body, in which the semiconductor sensor chip 405 and the amplifier 406 are fixed to and electrically connected together in the substrate 400C1, but the cover member 409 is not included.

The cover member 409 is constituted by the top portion 409a, the side walls 409b, and the electromagnetic shield terminals 409d, wherein three side walls 409b are arranged for three side ends out of four side ends of the top portion 409a having a rectangular shape, so that no side wall is arranged on the remaining side end of the top portion 409a, which thus serves as an opening 409j.

Three engagement portions 409h extend downwardly from the lower ends 409c of the three side walls 409b respectively.

Figure 81:
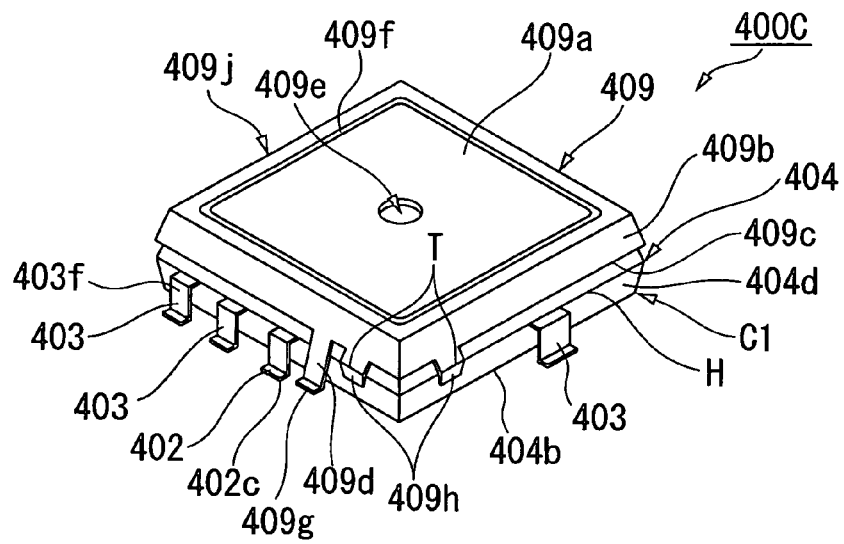
FIG. 81 is a perspective view showing a semiconductor device in accordance with a second variation of the fifth embodiment.

As shown in FIG. 81, when the cover member 409 is combined together with the substrate 400C1 sealed with the resin layer 404, the lower ends of the engagement portions 409h are positioned above the lower surface 404b of the resin layer 404, wherein the engagement potions 409h are shaped to suit the bent shapes of the sides 404d, which are bent at the bent point H, and are thus engaged with the sides 404d of the resin layer 404. That is, each of the engagement portions 409h is bent at the bent point T, which matches the bent point H, whereby the upper portion of the engagement portion 409h is inclined outwardly, while the lower portion is inclined inwardly.

Next, a method for establishing electrical connection between the cover member 409 and the external terminals 402 (or the stage 401) will be described below.

The semiconductor device 400C is assembled in such a way that the main body 400C2 is introduced into the hollow space formed by the three side walls 409b and the top portion 409a via the opening 409j of the cover member 409. Herein, the main body 400C2 is directed toward the opening 409j of the cover member such that the lower surface of the top portion 409a horizontally matches the top portion 404f of the ring-shaped projection 404e of the resin layer 404 in position, and the extending direction of the opposite side walls 409b having the electromagnetic shield terminals 409d substantially matches the extending direction of the opposite sides 404d of the resin layer 404 having the external terminals 402. Then, the cover member 409 is horizontally moved so that the main body 400C2 is introduced into the hollow space of the cover member 409 via the opening 409j. At this time, as the lower surface of the top portion 409a moves horizontally while sliding along the top portion 404f of the ring-shaped projection 404e of the resin layer 404, the main body 400C2 is gradually covered with the cover member 409. In addition, the engagement portions 409h having bent shapes, which are formed in the opposite side walls 409b of the cover member 409, are engaged with the corresponding sides 404b of the resin layer 404 while the bent point T matches the bent point H, wherein the interior surfaces of the engagement portions 409h are brought into two-dimensional contact with and slide along the corresponding sides 404d of the resin layer 404. Due to the engagement and sliding motion of the engagement portions 409h, the cover member 409 as a whole moves horizontally and slides along the sides 404d of the resin layer 404 while being guided at the bent point T. When the engagement portion 409h formed in the rear side wall 409b of the cover member 409 comes in contact with and is engaged with the corresponding side 404d of the resin layer 404, the cover member 409 is set up with the prescribed positioning with the main body 400C2, wherein the lower surfaces 402c of the external terminals 402 are positioned adjacent to and substantially in the same plane as the lower surfaces 409g of the electromagnetic shield terminals 409d.

Therefore, with a simple operation in which the lower surfaces 402c of the external terminals 402 and the lower surfaces 409g of the electromagnetic shield terminals 409d join the printed-circuit board, on which the semiconductor device 400C is mounted, it is possible to easily form the electromagnetic shield embracing the semiconductor sensor chip 405. This contributes to a reduction of the manufacturing cost of the semiconductor device 400C.

The semiconductor device 400C does not require that the cover member 409 be attached to the substrate 400C1 sealed with the resin layer 404 via the adhesive because the engagement portions 409h reliably secure fixation between the cover member 409 and the resin layer 404 so that the lower surface of the top portion 409a is tightly attached to the ring-shaped projection 404e. This reduces the work hours for the installation of the cover member 409 combined with the main body 400C2; hence, it is possible to reduce the manufacturing cost of the semiconductor device 400C.

Lastly, the present invention is not necessarily limited to the aforementioned embodiments, variations, and modifications; hence, the present embodiment can be further modified or changed in design within the scope of the invention defined by the appended claims.

What is claimed is:

1. A semiconductor device in which a semiconductor sensor chip having a diaphragm for detecting pressure variations based on displacement thereof is fixed onto an upper surface of a substrate having a rectangular shape and which is covered with a cover member so as to form a hollow space embracing the semiconductor sensor chip between the substrate and the cover member,
    wherein a plurality of internal terminals are exposed in the hollow space and are adjacently disposed in line with the semiconductor sensor chip,
    wherein a plurality of external terminals are exposed on a backside of the substrate and are disposed along both sides the substrate, and
    wherein a conductive wiring is formed inside of the substrate so as to establish electrical connection between the internal terminals and at least one of the external terminals.

2. The semiconductor device according to claim 1, wherein a lower shield layer having conductivity is formed below the semiconductor sensor chip and is electrically connected to the at least one of the external terminals.

3. A semiconductor device in which a semiconductor sensor chip is attached onto an upper surface of a substrate sealed with a resin layer and is covered with a cover member having a conductivity, wherein the semiconductor sensor chip is connected with and is placed substantially at a same potential with a plurality of external terminals whose first ends are embedded inside of the resin layer and whose second ends are extended so as to project externally of the resin layer, wherein the first end of the external terminals are shaped so as to be partially exposed above the upper surface of the substrate and is fixed to a lower surface of the cover member via a conductive adhesive.

4. A semiconductor device in which a semiconductor sensor chip is attached onto an upper surface of a substrate sealed with a resin layer and is covered with a cover member having a conductivity, wherein the semiconductor sensor chip is connected with and is placed substantially at a same potential with a plurality of external terminals whose first ends are embedded inside of the resin layer and whose second ends are extended so as to project externally of the resin layer, wherein the cover member has a top portion, which is supported by the substrate so as to form a space embracing the semiconductor sensor chip, and at least one electromagnetic shield terminal which is connected with a side end of the top portion and is elongated downwardly and externally along a prescribed side of the resin layer sealing the substrate and which is connected to the second end of the external terminal which extends externally of the resin layer.

5. A semiconductor device in which a semiconductor sensor chip is attached onto an upper surface of a substrate sealed with a resin layer and is covered with a cover member having a conductivity, wherein the semiconductor sensor chip is connected with and is placed substantially at a same potential with a plurality of external terminals whose first ends are embedded inside of the resin layer and whose second ends are extended so as to project externally of the resin layer, wherein the cover member has a top portion, which is supported by the substrate so as to form a space embracing the semiconductor sensor chip, a side wall, which extends downwardly from a side end of the top portion so as to cover the resin layer sealing the substrate, and at least one electromagnetic shield terminal which is connected with the side end of the top portion and is elongated downwardly and externally along a prescribed side of the resin layer and which is connected to the second end of the external terminal that extends externally of the resin layer.

6. A semiconductor device having a semiconductor sensor chip in which a diaphragm is formed so as to detect pressure applied thereto due to displacement thereof said semiconductor device comprising:
a resin layer having an internal recess for arranging the semiconductor sensor chip having the diaphragm disposed thereon;
a stage having a rectangular shape, which is positioned below the semiconductor sensor chip and is sealed with the resin layer;
a plurality of external terminals whose first ends are connected to the stage and whose second ends are exposed and extend externally of the resin layer; and
a cover member, having conductivity, for covering the resin layer so as to form a space embracing the semiconductor sensor chip,
wherein the cover member is electrically connected to the plurality of external terminals and is placed substantially at a same potential as the stage.

7. The semiconductor device according to claim 6, wherein the resin layer has a projection, which is elongated so as to form an internal recess arranging the semiconductor sensor chip thereon, and wherein the first end of the external terminal is shaped and is partially exposed above a top portion of the projection, onto which a lower surface of the cover member is attached via a conductive adhesive and is connected to the external terminal.

8. The semiconductor device according to claim 6, wherein the resin layer has a projection, which is elongated so as to form an internal recess arranging the semiconductor sensor chip thereon, and wherein the cover member has a top portion, which is supported by a top portion of the projection so as to form the space arranging the semiconductor sensor chip, and at least one electromagnetic shield terminal which is connected with a side end of the top portion of the cover member and is elongated downwardly and externally along a prescribed side of the resin layer and which is connected to the second end of the external terminal that extends externally of the resin layer.

9. The semiconductor device according to claim 8, wherein the electromagnetic shield terminal is divided into two pieces via a cutout portion, which is vertically elongated and in which the second end of the external terminal is tightly held, thus establishing an electrical connection between the electromagnetic shield terminal and the external terminal.

10. The semiconductor device according to claim 8, wherein the electromagnetic shield terminal has an engagement recess, which is engaged with an engagement recess formed in the second end of the external terminal so as to establish electrical connection between the electromagnetic shield terminal and the external terminal when the resin layer is covered with the cover member, and wherein the electromagnetic shield terminal crosses and overlaps with the external terminal in view of an exterior of the electromagnetic shield terminal.

11. The semiconductor device according to claim 6, wherein the resin layer has a projection, which is elongated so as to form an internal recess arranging the semiconductor sensor chip thereon, and wherein the cover member has a top portion, which is supported by a top portion of the projection so as to form the space arranging the semiconductor sensor chip, a side wall, which extends downwardly from a side end of the top portion so as to cover the resin layer, and at least one electromagnetic shield terminal which is connected with a side end of the top portion of the cover member and is elongated downwardly and externally along a prescribed side of the resin layer and which is connected to the second end of the external terminal that extends externally of the resin layer.

12. The semiconductor device according to claim 6, wherein the cover member has at least one engagement portion which extends downwardly from a side end of the top portion and is engaged with a prescribed side of the resin layer so as to establish connection between the cover member and the resin layer.

13. The semiconductor device according to claim 6, wherein the stage is enlarged in size compared with the semiconductor sensor chip.

14. A semiconductor device including a semiconductor sensor chip having a diaphragm for detecting sound pressure applied thereto in response to deformation thereof, said semiconductor device comprising:
a substrate for fixing the semiconductor sensor chip on an upper surface thereof;
a cover member having conductivity for covering the substrate so as to form a hollow space embracing the semiconductor sensor chip; and
a lower shield member having conductivity, which is positioned below the semiconductor sensor chip,
wherein at least one of the cover member and the lower shield member is connected to a shield terminal that is exposed externally of the substrate.

15. The semiconductor device according to claim 14, wherein the cover member is constituted by a top portion that is positioned opposite to the upper surface of the substrate and a plurality of side walls that are elongated downwardly from a periphery of the top portion in a thickness direction of the substrate and that are positioned adjacent to a plurality of sides of the substrate.

16. The semiconductor device according to claim 15, wherein the plurality of side walls of the cover member are brought into contact with upper ends of the lower shield member along the plurality of sides of the substrate.

17. The semiconductor device according to claim 14, wherein the plurality of side walls of the cover member are adhered to the plurality of sides of the substrate by use of an adhesive.

18. The semiconductor device according to claim 14, wherein the lower shield member forms a lower surface of the substrate.

19. The semiconductor device according to claim 14, wherein the lower shield member includes a stage having a rectangular shape, which is incorporated into the substrate sealed with a resin layer and which has a plurality of extended portions that extend outwardly of the plurality of sides of the substrate, and wherein the plurality of extended portions are brought into contact with the plurality of side walls of the cover member.

20. The semiconductor device according to claim 14, wherein the lower shield member includes a stage having a rectangular shape, which is incorporated into the substrate sealed with a resin layer and which has a plurality of extended portions that extend outwardly of the plurality of sides of the substrate, wherein the plurality of extended portions are brought into contact with the plurality of side walls of the cover member, and wherein a prescribed part of the stage forms the upper surface of the substrate.

21. The semiconductor device according to claim 14, wherein the shield terminal is integrally formed together with either the cover member or the lower shield member.

22. The semiconductor device according to claim 14, wherein a plurality of chip connection leads, which are electrically connected to the semiconductor sensor chip, are linearly disposed on both sides of the semiconductor sensor chip and are partially exposed externally of the plurality of sides of the substrate.

23. The semiconductor device according to claim 14, wherein the lower shield member is formed so as to entirely cover the substrate.

24. A semiconductor device comprising:
    a substrate, from which a plurality of external terminals project outwardly and which is sealed with a resin layer;
    a semiconductor sensor chip, which is fixed onto an upper surface of the substrate;
    a cover member, which has a plurality of electromagnetic shield terminals and which covers the substrate so as to form a hollow space embracing the semiconductor sensor chip; and
    a fixing means for fixing the substrate and the cover member together such that the electromagnetic shield terminals are brought into contact with the external terminals,
    wherein the substrate includes a stage, which is sealed with the resin layer and is positioned below the semiconductor sensor chip, and wherein the external terminals are electrically connected to the stage.

25. The semiconductor device according to claim 24, wherein the fixing means is a caulking tool for tightly combining the plurality of external terminals and the plurality of electromagnetic shield terminals together.

26. The semiconductor device according to claim 24, wherein the fixing means is realized by riveting the plurality of external terminals and the plurality of electromagnetic shield terminals together.

27. The semiconductor device according to claim 24, wherein the fixing means is realized by welding the plurality of external terminals and the plurality of electromagnetic shield terminals together.

28. The semiconductor device according to claim 24, wherein the fixing means is realized by soldering the external terminals and the electromagnetic shield terminals together.

29. A semiconductor device comprising:
    a substrate, which is sealed with a resin and which includes a plurality of external terminals projecting externally thereof, wherein a semiconductor sensor chip is attached onto an upper surface of the substrate; and
    a cover member having conductivity, which covers the substrate so as to form an electromagnetic shield embracing the semiconductor sensor chip and which includes a plurality of electromagnetic shield terminals slightly projecting externally of the substrate so that lower surfaces of the electromagnetic shield terminals are positioned substantially in a same plane as lower surfaces of the external terminals.

30. The semiconductor device according to claim 29, wherein the stage is increased in size in plan view of an upper surface of the resin layer in comparison with the semiconductor sensor chip.

31. A semiconductor device including a semiconductor sensor chip having a diaphragm for detecting sound pressure applied thereto, said semiconductor device comprising:
    a resin layer having a recess which is opened at an upper surface thereof, wherein the diaphragm of the semiconductor sensor chip is positioned above an opening of the recess;
    a stage having a rectangular shape, which is sealed with the resin layer and which is positioned below the semiconductor sensor chip;
    a plurality of external terminals whose first ends are connected to the stage and whose second ends are extended externally of the resin layer; and
    a cover member having a conductivity, which is combined with the resin layer so as to form a space embracing the semiconductor sensor chip,
    wherein the cover member includes a plurality of electromagnetic shield terminals, which are elongated downwardly so that lower surfaces thereof are positioned adjacent to and substantially in a same plane as lower surfaces of the second ends of the external terminals.

32. The semiconductor device according to claim 31, wherein a ring-shaped projection is formed in the resin layer so as to form an internal recess for embracing the semiconductor sensor chip, wherein the cover member includes a top portion whose lower surface is attached onto a top portion of the ring-shaped projection of the resin layer so as to form the space embracing the semiconductor sensor chip, and wherein the plurality of electromagnetic shield terminals are elongated downwardly from side ends of the top portion along a plurality of sides of the resin layer, so that the lower surfaces, which are formed in lower ends of the electromagnetic shield terminals, are positioned adjacent to and substantially in the same plane as the lower surfaces of the second ends of the external terminals.

33. The semiconductor device according to claim 32, wherein the cover member includes a plurality of engagement portions, which are elongated downwardly from the side ends of the top portion and are engaged with the plurality of sides of the resin layer, so that the cover member is attached to the resin layer.

34. The semiconductor device according to claim 31, wherein a ring-shaped projection is formed in the resin layer so as to form an internal recess for embracing the semiconductor sensor chip, wherein the cover member includes a top portion whose lower surface is attached onto a top portion of the ring-shaped projection of the resin layer so as to form the space embracing the semiconductor sensor chip and a plurality of side walls, which are elongated downwardly from side ends of the top portion so as to cover a plurality of sides of the resin layer, and wherein the plurality of electromagnetic shield terminals are elongated downwardly from lower ends of the side walls along the plurality of sides of the resin layer, so that the lower surfaces of the lower ends of the electromagnetic shield terminals are positioned adjacent to and substantially in the same plane as the lower surfaces of the second ends of the external terminals.

35. The semiconductor device according to claim 34, wherein the cover member includes a plurality of engagement portions, which are elongated downwardly from the lower ends of the side walls and are engaged with the plurality of sides of the resin layer, so that the cover member is attached to the resin layer.

\* \* \* \* \*